United States Patent
Ozalevli

(10) Patent No.: US 11,588,455 B2
(45) Date of Patent: Feb. 21, 2023

(54) AMPLIFIER CIRCUIT WITH DYNAMIC OFFSET CALIBRATION

(71) Applicant: Apple Inc., Cupertino, CA (US)

(72) Inventor: Erhan Ozalevli, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 82 days.

(21) Appl. No.: 17/204,873

(22) Filed: Mar. 17, 2021

(65) Prior Publication Data

US 2021/0305955 A1    Sep. 30, 2021

Related U.S. Application Data

(60) Provisional application No. 63/002,076, filed on Mar. 30, 2020.

(51) Int. Cl.
*H03F 3/45*   (2006.01)
*H03F 3/387*   (2006.01)
*H03K 5/24*   (2006.01)

(52) U.S. Cl.
CPC ......... *H03F 3/45076* (2013.01); *H03F 3/387* (2013.01); *H03K 5/24* (2013.01); *H03F 2200/375* (2013.01)

(58) Field of Classification Search
CPC ............. H03F 3/45475; H03F 3/45076; H03F 3/387; H03F 2200/375; H03K 5/24
USPC .......................................................... 330/9
See application file for complete search history.

(56) References Cited

U.S. PATENT DOCUMENTS

| | | |
|---|---|---|
| 5,661,376 A | 8/1997 | George |
| 6,262,625 B1 | 7/2001 | Perner et al. |
| 6,621,334 B2 | 9/2003 | Ausserlechner et al. |
| 6,734,723 B2 * | 5/2004 | Huijsing ............... H03F 3/347 330/9 |
| 7,336,123 B2 | 2/2008 | Yoshida et al. |
| 7,834,685 B1 | 11/2010 | Pertijs |

(Continued)

FOREIGN PATENT DOCUMENTS

WO    WO 2016/009924 A1    1/2016

OTHER PUBLICATIONS

Said, A.H., "Design of a Chopper Amplifier for Use in Biomedical Signal Acquisition," Department of Electrical and Computer Engineering in the Graduate School Southern Illinois University Edwardsville, Dec. 2010, pp. 1-92.

(Continued)

*Primary Examiner* — Quan Tra
(74) *Attorney, Agent, or Firm* — Fenwick & West LLP

(57) ABSTRACT

An amplifier circuit includes multiple transistors, a set of input routing circuits, and a set of output routing circuits. Each output routing circuit corresponds to an input routing circuit. Each input routing circuit and its corresponding output routing circuit are controlled by one or more control signals. Each input routing circuit is configured to selectively connect each transistor of a transistor pair to a first input terminal of the amplifier circuit, a second input terminal of the amplifier circuit, or a third input terminal of the amplifier based on a value of the one or more control signals. Each output routing circuit is configured to selectively connect each transistor of the transistor pair to a first output terminal of the amplifier circuit, a second output terminal of the amplifier circuit, or a calibration circuit based on the value of the one or more control signals.

21 Claims, 32 Drawing Sheets

(56) References Cited

U.S. PATENT DOCUMENTS

| | | | |
|---|---|---|---|
| 8,810,317 B2 | 8/2014 | Kadoi et al. | |
| 9,197,173 B2 | 11/2015 | Denison et al. | |
| 10,116,268 B2* | 10/2018 | Vijaykumar | H03F 1/26 |
| 2004/0140847 A1* | 7/2004 | Thompson | H03F 3/217 |
| | | | 330/9 |
| 2006/0098271 A1* | 5/2006 | Koller | H03G 1/0088 |
| | | | 359/337 |
| 2009/0027116 A1* | 1/2009 | Bach | H03G 3/3036 |
| | | | 330/9 |
| 2012/0032722 A1* | 2/2012 | Mulder | H03F 3/45928 |
| | | | 327/307 |
| 2015/0054576 A1 | 2/2015 | Zhou et al. | |
| 2018/0091105 A1* | 3/2018 | Abughazaleh | H03F 3/45183 |
| 2021/0006218 A1 | 1/2021 | Tokunaga | |

OTHER PUBLICATIONS

United States Office Action, U.S. Appl. No. 17/154,939, filed Aug. 22, 2022, 12 pages.
United States Office Action, U.S. Appl. No. 17/154,939, filed Oct. 7, 2022, 13 pages.

* cited by examiner

US 11,588,455 B2

AMPLIFIER CIRCUIT WITH DYNAMIC OFFSET CALIBRATION

CROSS REFERENCE TO RELATED APPLICATIONS

This application claims the benefit of U.S. Provisional Application No. 63/002,076, filed Mar. 30, 2020, which is incorporated by reference in its entirety.

BACKGROUND

1. Field of the Disclosure

The present disclosure relates an amplifier circuit and more specifically to a differential amplifier architecture for reducing an amplifier offset due to mismatches in the amplifier circuit.

2. Description of the Related Arts

Differential amplifier circuits use pairs of transistors to amplify the difference between two input voltages. However, due to transistor mismatches in the pairs of transistors, the differential amplifier may add a DC offset to the output. In particular, the differential amplifier introduces an offset that is dependent on the difference in the threshold voltages of the pair of transistors. The DC offset introduced by a differential amplifier together with 1/f noise and drift are some of the major sources of error in operational amplifiers.

SUMMARY

Embodiments relate to an amplifier circuit that includes multiple transistors, a set of input routing circuits, and a set of output routing circuits. Each output routing circuit corresponds to an input routing circuit. Each input routing circuit and its corresponding output routing circuit are controlled by one or more control signals. Each input routing circuit is configured to selectively connect each transistor of a transistor pair to a first input terminal of the amplifier circuit, a second input terminal of the amplifier circuit, or a third input terminal of the amplifier based on a value of the one or more control signals. Each output routing circuit is configured to selectively connect each transistor of the transistor pair to a first output terminal of the amplifier circuit, a second output terminal of the amplifier circuit, or a calibration circuit based on the value of the one or more control signals.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to amplifier circuits with dynamic offset calibration capabilities. The amplifier circuit includes multiple transistors, a set of input routing circuits, and a set of output routing circuits. Each output routing circuit corresponds to an input routing circuit. Each input routing circuit and its corresponding output routing circuit are controlled by one or more control signals. Each input routing circuit is configured to selectively connect each transistor of a transistor pair to a first input terminal of the amplifier circuit, a second input terminal of the amplifier circuit, or a third input terminal of the amplifier based on a value of the one or more control signals. Each output routing circuit is configured to selectively connect each transistor of the transistor pair to a first output terminal of the amplifier circuit, a second output terminal of the amplifier circuit, or a calibration circuit based on the value of the one or more control signals.

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure 1:
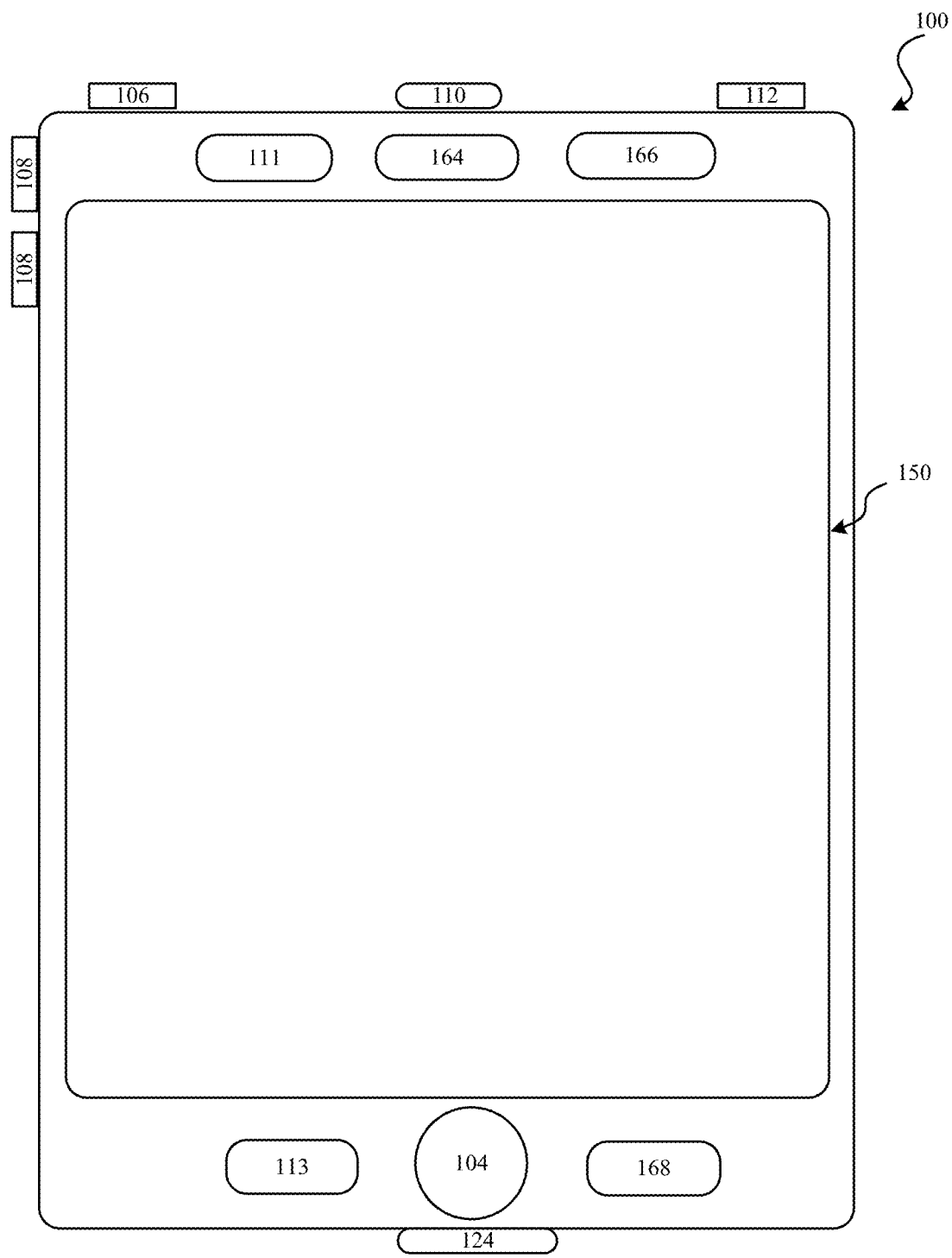
FIG. 1 is a high-level diagram of an electronic device, according to one or more embodiments.

FIG. 1 is a high-level diagram of an electronic device 100, according to one or more embodiments. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Example Amplifier Having Input and Output Chopper Circuits

Figure 2A:
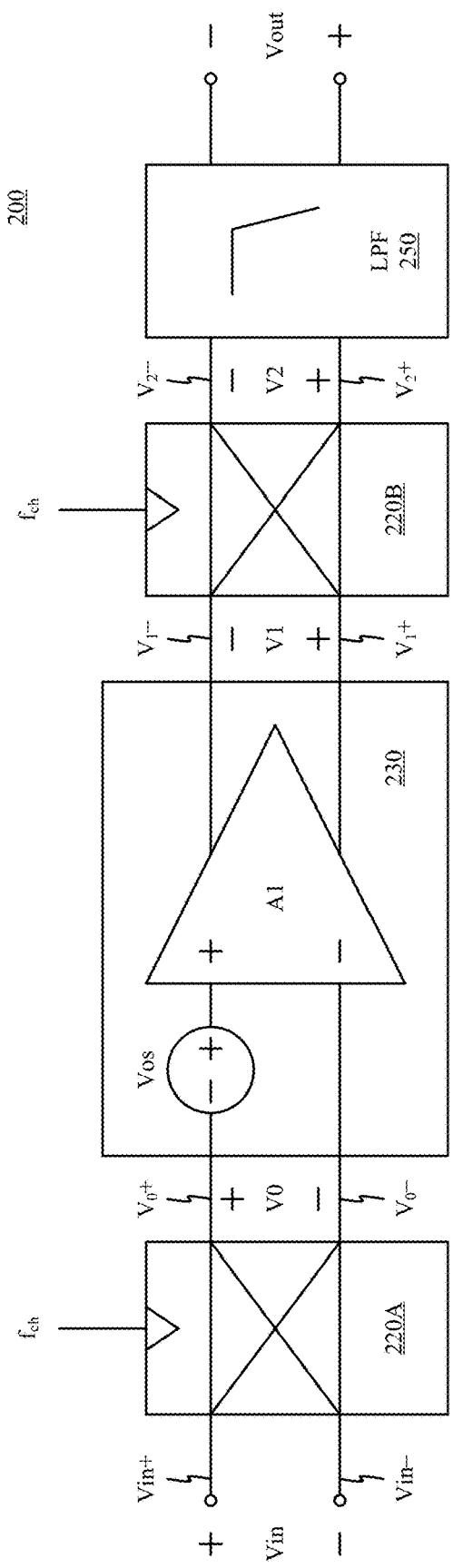
FIG. 2A is a circuit diagram of an amplifier circuit, according to one or more embodiments.

FIG. 2A is a circuit diagram of an amplifier circuit 200, according to one or more embodiments. The amplifier circuit 200 may include, among other components, a differential amplifier 230 having a gain A1, an input chopper circuit 220A and an output chopper circuit 2B. In some embodiments, the amplifier circuit 200 further includes a low pass filter 250. Moreover, due to imbalances and parasitic in the differential amplifier 230, the differential amplifier includes an offset Vos.

The input chopper circuit 220A receives an input voltage Vin and generates an alternating voltage $V_O$. The chopper circuit is controlled based on the control signal $f_{ch}$. The control signal $f_{ch}$ periodically alternates between a first value and a second value. When the control signal $f_{ch}$ has a first value, the input chopper circuit 220A connects a first input terminal Vin+ to a first output terminal $V_0$+ and connects a second input terminal Vin− to a second output terminal $V_0$−. As such, when the control signal $f_{ch}$ has the first value, the input chopper circuit 220A transfers a voltage at the first input to the first output and transfers a voltage at the second input to the second output. Moreover, when the control signal $f_{ch}$ has a second value, the input chopper circuit 220A connects the first input terminal Vin+ to the second output terminal $V_0$− and connects the second input terminal Vin− to the first output terminal $V_0$+. As such, when the control signal $f_{ch}$ has the second value, the input chopper circuit 220A transfers a voltage at the first input to the second output and transfers a voltage at the second input to the first output. That is, when the control signal $f_{ch}$ has the second value, the input chopper circuit 220A inverts the polarity of the input voltage Vin.

The differential amplifier 230 has a gain A1 and an input offset Vos. The differential amplifier 230 receives the alternating voltage $V_0$ from the input chopper circuit 220A and generates an amplified voltage $V_1$. The differential amplifier 230 amplifies the alternating voltage $V_0$ based on the gain A1. Moreover, because of the imbalances and parasitics of the differential amplifier, the differential amplifier 230 adds an offset voltage Vos to the generated amplified alternating voltage $V_1$.

The output chopper circuit 220B receives the amplified alternating voltage $V_1$ generated by the differential amplifier 230 and generates a second voltage $V_2$. The output chopper 220B is also controlled based on the control signal $f_{ch}$. When the control signal $f_{ch}$ has the first value, the output chopper circuit 220B connects a first input terminal $V_1$− to a first output terminal $V_2$− and connects a second input terminal $V_1$+ to a second output terminal $V_2$+. As such, when the control signal $f_{ch}$ has the first value, the output chopper circuit 220B transfers a voltage at the first input to the first output and transfers a voltage at the second input to the second output. Moreover, when the control signal $f_{ch}$ has the second value, the output chopper circuit 220B connects the first input terminal $V_1$− to the second output terminal $V_2$+ and connects the second input terminal $V_1$+ to the first output terminal $V_2$−. As such, when the control signal $f_{ch}$ has the second value, the output chopper circuit 220B transfers a voltage at the first input to the second output and transfers a voltage at the second input to the first output. That is, when the control signal $f_{ch}$ has the second value, the output chopper circuit 220B inverts the polarity of the amplified alternating voltage $V_1$.

The low pass filter (LPF) 250 filters out high frequency components from the second voltage $V_2$ to generate the output voltage Vout. In some embodiments, the LPF 250 attenuates signal components that have a frequency larger than the frequency of the control signal $f_{ch}$.

Figure 2B:
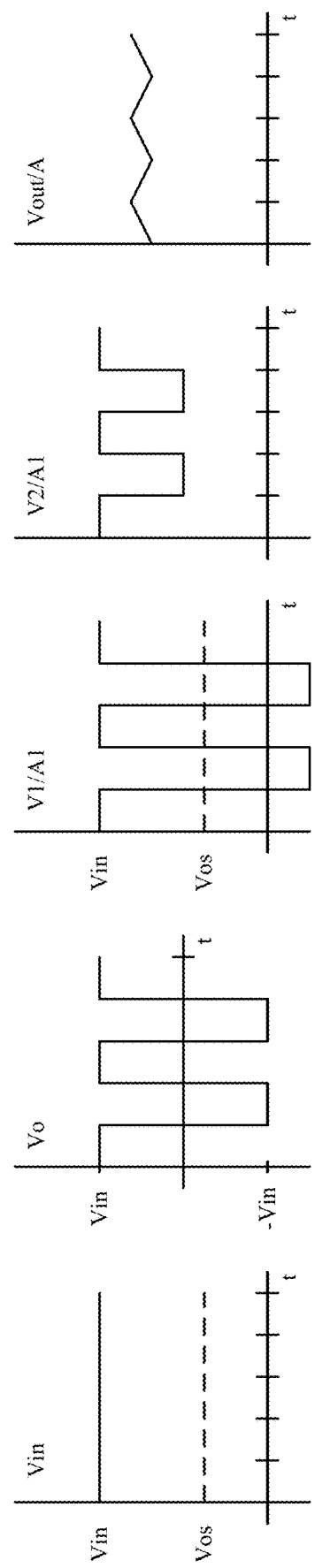
FIG. 2B illustrates time diagrams of signals in the amplifier circuit of FIG. 2A, according to one or more embodiments.

FIG. 2B illustrates time diagrams of signals in the amplifier circuit of FIG. 2A, according to one or more embodiments. FIG. 2B illustrates a first time diagram showing the input voltage Vin with respect to time, a second time diagram showing the alternating voltage $V_0$ with respect to time, a third time diagram showing the amplified alternating voltage $V_1$ with respect to time, a fourth time diagram showing the second voltage $V_2$ with respect to time, and a fifth time diagram showing the output voltage Vout with respect to time.

As shown in the first time diagram of FIG. 2B, the input voltage Vin is a constant voltage. Moreover, the alternating voltage $V_0$ at the output of the input chopper circuit 220 alternates between Vin and −Vin. The amplified alternating voltage $V_1$ is offset by the offset voltage Vos. Similarly, because of the offset voltage Vos, the second voltage $V_2$ has a periodic behavior. That is, because of the offset voltage, when the output chopper circuit 220B inverts the amplified alternating voltage, the amplitude of the inverted signal does not have the same amplitude as the portions when the first signal that are not inverted by the output chopper circuit 220B. Finally, the output voltage Vout retains the DC level of the second voltage $V_2$ but removes certain high frequency components.

Figure 2C:
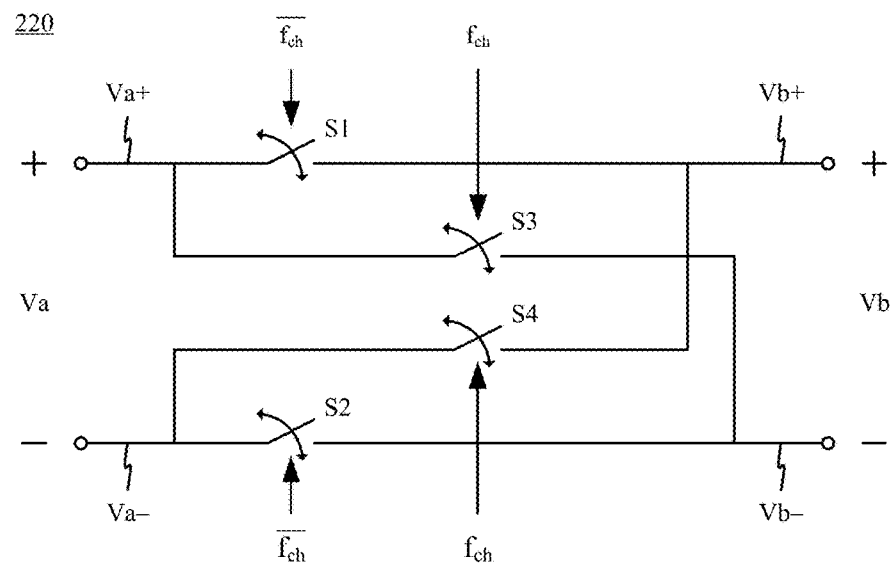
FIG. 2C is a circuit diagram illustrating a chopper circuit, according to one or more embodiments.

FIG. 2C is a circuit diagram illustrating a chopper circuit, according to one or more embodiments. The chopper circuit 220 includes four switches S1, S2, S3, and S4. The first switch S1 is coupled between the first input terminal Va+ and the first output terminal Vb+. The second switch S2 is coupled between the second input terminal Va− and the second output terminal Vb−. The third switch S3 is coupled between the first input terminal Va+ and the second output terminal Vb−. The fourth switch S4 is coupled between the second input terminal Va− and the first output terminal V+.

The third switch S3 and the fourth switch S4 are controlled by a control signal $f_{ch}$. The first switch S1 and the second switch S2 are controlled by an inverse of the control signal $\overline{f_{ch}}$. As such, when the control signal $f_{ch}$ is inactive, the first switch S1 and the second switch S2 are closed and the third switch S3 and the fourth switch S4 are opened, connecting the first input terminal Va+ to the first output terminal Vb+ and the second input terminal Va− to the second output terminal Vb−. Conversely, when the control signal is active, the third switch S3 and the fourth switch S4 are closed and the first switch S1 and the second switch S2 are opened, connecting the first input terminal Va+ to the second output terminal Vb− and the second input terminal Va− to the first output terminal Vb+.

The chopper circuit 220 may be split into to half chopper circuits. For example, the chopper circuit 220 may be split into two half input chopper circuits. A first half input chopper circuit includes the first switch S1 and the fourth switch S4, and a second half input chopper circuit includes the third switch S3 and the second switch S2. Each half input chopper circuit is configured to couple one of two input terminals to one output terminal based on the value of the control signal.

In another example, the chopper circuit 220 may be split into two half output chopper circuits. A first half output chopper circuit includes the first switch S1 and the third switch S3, and a second half input chopper circuit includes the fourth switch S4 and the second switch S2. Each half output chopper circuit is configured to couple one input terminals to one of two output terminals based on the value of the control signal.

Figure 2D:
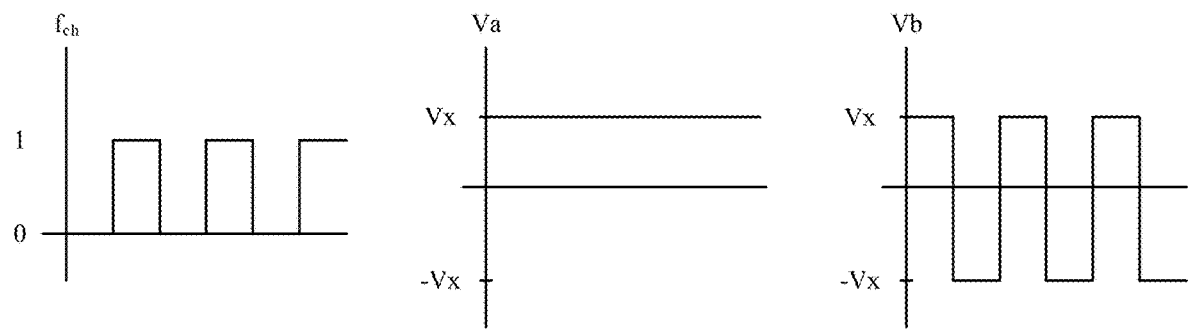
FIG. 2D illustrates time diagrams of signals in the chopper circuit of FIG. 2C when the input signal is constant, according to one or more embodiments.

FIG. 2D illustrates time diagrams of signals in the chopper circuit of FIG. 2C when the input signal Va is constant, according to one or more embodiments. When the input signal Va has a constant value Vx, the output signal Vb toggles between +Vx and −Vx each time the control signal toggles.

Figure 2E:
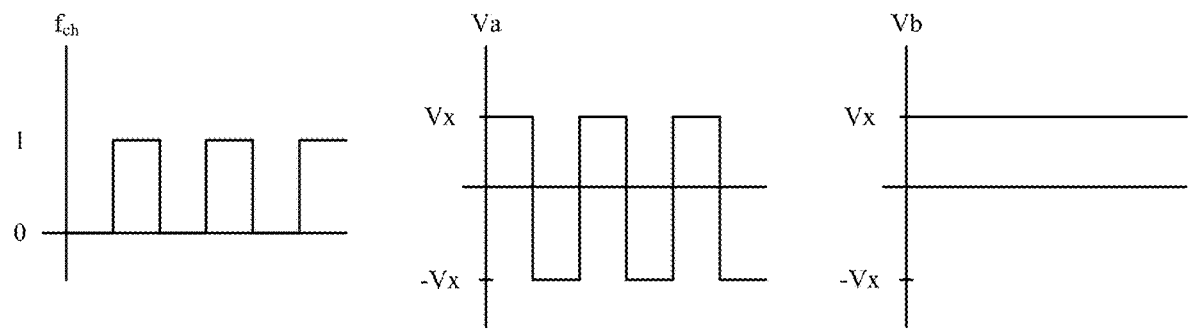
FIG. 2E illustrates time diagrams of signals in the chopper circuit of FIG. 2C when the input signal toggles between a first level and a second level, according to one or more embodiments.

FIG. 2E illustrates time diagrams of signals in the chopper circuit of FIG. 2C when the input signal Va toggles between a first level +Vx and a second level −Vx, according to one or more embodiments. In particular, the input signal toggles at the same time as the control signal $f_{ch}$. That is, when the control signal $f_{ch}$ has an inactive value, the input signal Va has a first level (e.g., +Vx), and when the control signal $f_{ch}$ has an active value, the input signal Va has a second level (e.g., −Vx), opposite to the first level. As such, when the control signal $f_{ch}$ has an active value, the input signal Va is inverted. Thus, the resulting output signal Vb has a constant level.

Chopper circuits can have large ripple at their output and may suffer from large spikes due to the periodic switching. As shown in FIG. 2B, an artifact that chopper circuits may introduce to the output of an amplifier circuit is the presence of a triangle waveform produced by a current output and the low pass filter (LPF) 250. The peak-to-peak amplitude of the ripple is proportional to the initial offset Vos of the differential amplifier 230. As a result, the chopping ripple can vary substantially from amplifier to amplifier and with time and temperature.

Example Amplifier Having Distributed Input and Output Chopper Circuits

Figure 3A:
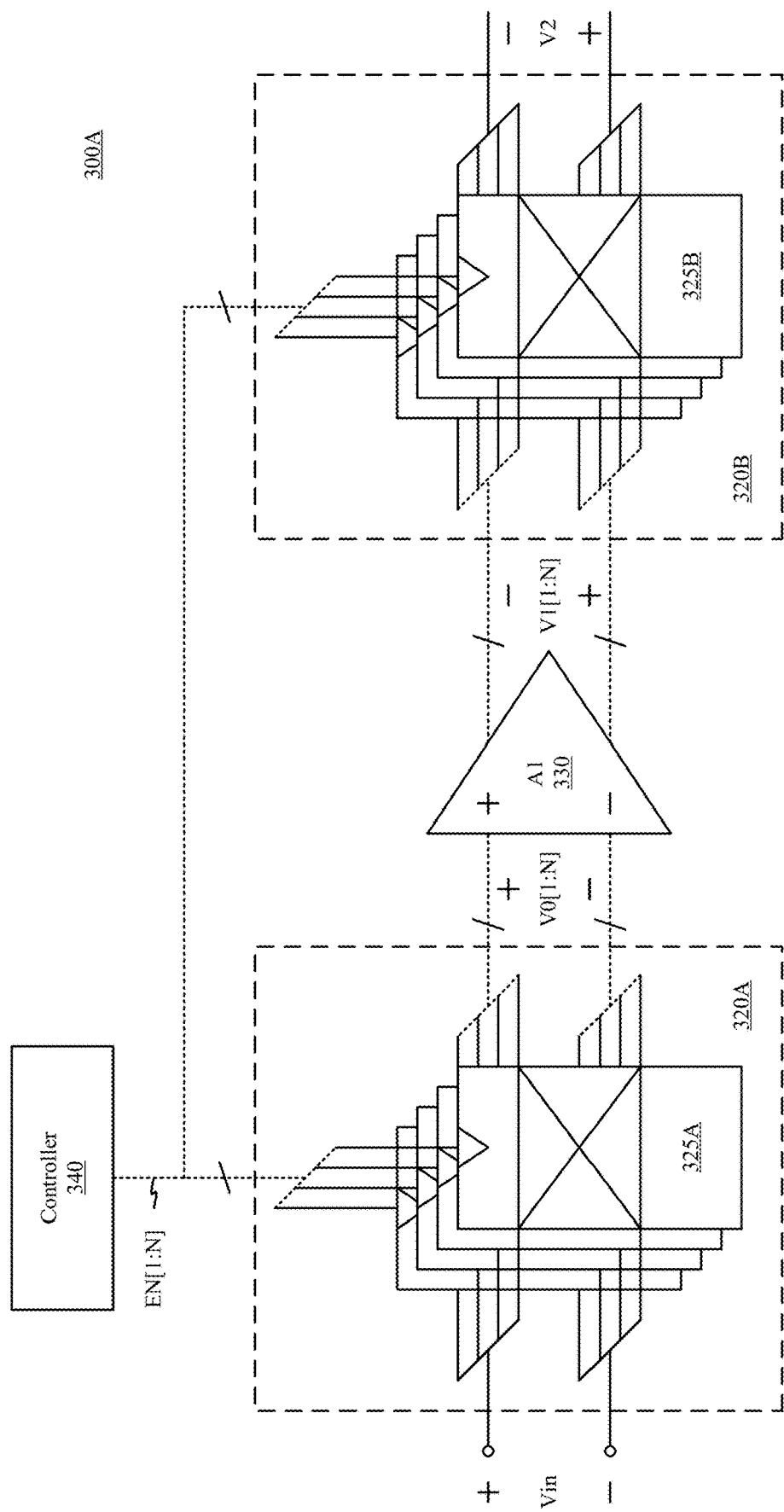
FIG. 3A is a block diagram of an amplifier circuit having distributed chopper circuits, according to one or more embodiments.

FIG. 3A is a block diagram of an amplifier circuit 300 having distributed chopper circuits, according to one or more embodiments. The amplifier circuit 300 includes a differential amplifier 330, a set of input chopper circuits 320A having multiple input chopper circuits 325A, and a set of output chopper circuits 320B having multiple output chopper circuits 325B. In the diagram of FIG. 3A, the dotted connections denote a parallel connection including multiple signals being routed in parallel.

The set of input chopper circuits 320A receives an input voltage Vin as an input and generates a set of alternating voltage $V_0[1:N]$ as an output. In the example of FIG. 3A, N alternating voltages $V_0[1]$ through $V_0[N]$ are generated. Moreover, the set of input chopper circuits 320A is controlled by a set of control signals EN[1:N].

The set of input chopper circuits 320A includes N input chopper circuits 325A. Each input chopper circuit 325A includes a first input and a second input. The first inputs of each input chopper circuit 325A are connected to each other, and the second inputs of each input chopper circuit 325A are connected to each other. Additionally, each input chopper circuit 325A in the set of input chopper circuits 320A is controlled by a corresponding control signal from the set of control signals EN[1:N] and generates a corresponding alternating voltage of the set of alternating voltages $V_0[1:N]$ based on the corresponding control signal.

The differential amplifier 330 receives the set of alternating voltage $V_0[1:N]$ and amplifies the set of alternating voltages $V_0[1:N]$ to generate a set of amplified alternating voltages $V_1[1:N]$. In the example of FIG. 3A, N alternating voltages $V_0[1]$ through $V_0[N]$ are received as an input and N amplified alternating voltages $V_1[1]$ through $V_1[N]$ are generated as an output.

The set of output chopper circuits 320B receives a set of amplified alternating voltages $V_1[1:N]$ as an input and generates a second voltage $V_2$ as an output. In the example of FIG. 3A, N amplified alternating voltages $V_1[1]$ through $V_1[N]$ are received as an input. Moreover, the set of output chopper circuits 320B is controlled by the set of control signals EN[1:N].

The set of output chopper circuits 320B includes N output chopper circuits 325B. Each output chopper circuit 325B includes a first input, a second input, a first output, and a second output. The first outputs of each output chopper circuit 325B are connected to each other, and the second outputs of each output chopper circuit 325B are connected to each other. Additionally, each output chopper circuit 325B in the set of output chopper circuits 320B is controlled by a corresponding control signal from the set of control signals EN[1:N].

The controller 340 generates the control signals EN[1:N] for controlling the input chopper circuits 325A and the output chopper circuits 325B. In some embodiments, the controller 340 further tests and analyzes the amplifier circuit 330 and generates the control signals EN[1:N] based on the analysis of the amplifier circuit 330. For instance, the controller 340 analyzes the threshold voltage of transistors used in the amplifier circuit 330 and generates the control signals EN[1:N] based on the threshold voltages of those transistors.

Figure 3B:
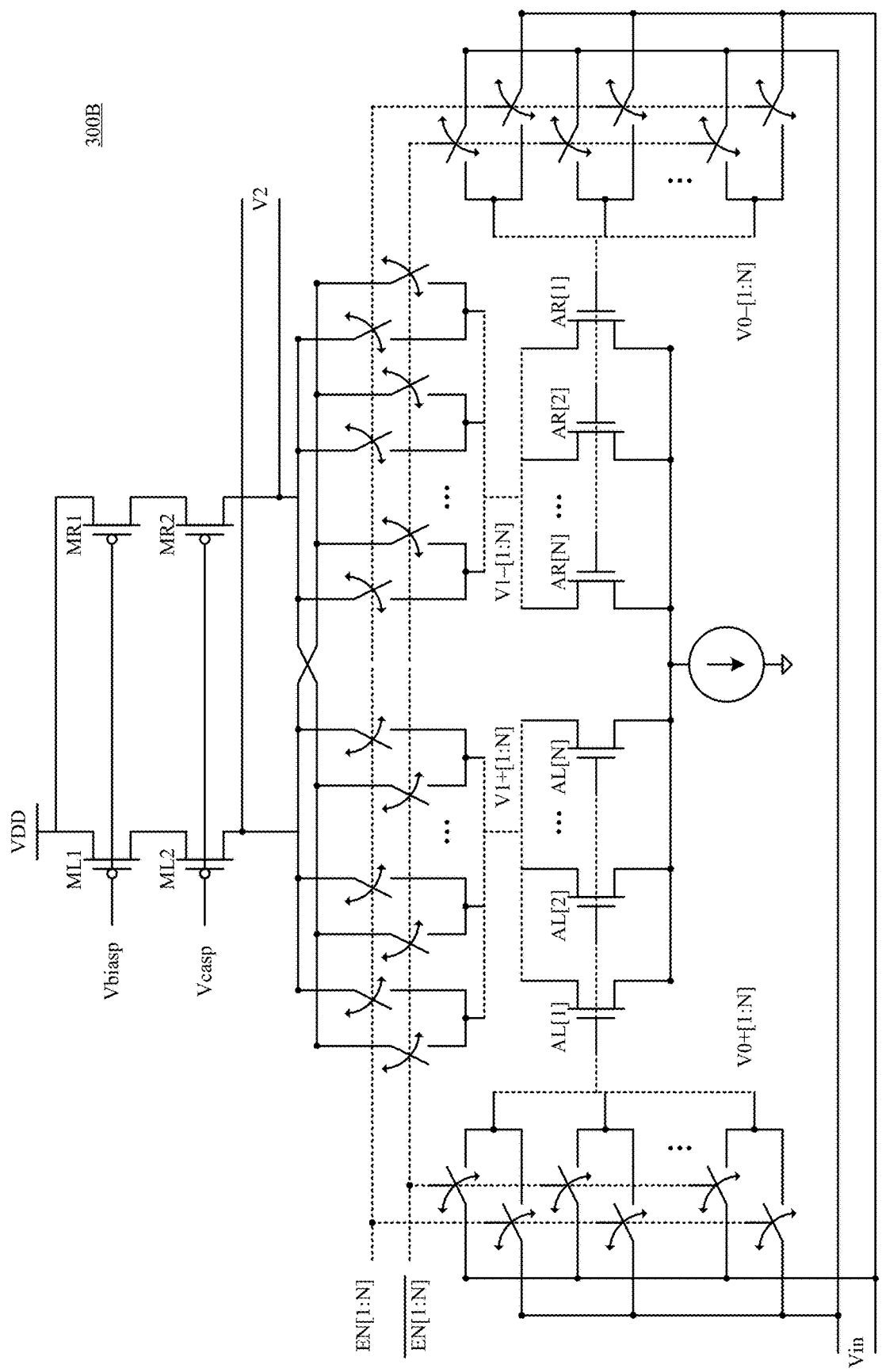
FIG. 3B is a circuit diagram of the amplifier circuit of FIG. 3A, according to one or more embodiments.

FIG. 3B is a circuit diagram of the amplifier circuit of FIG. 3A, according to one or more embodiments. The amplifier circuit 300B includes a set of left transistors AL[1:N] and a set of right transistors AR[1:N]. Each transistor in the set of left transistors AL[1:N] and set of right transistor AR[1:N] has a gate terminal that is connected to half of an input chopper circuit, and a drain terminal that is connected to half of an output chopper circuit. Each half input chopper circuit couples one of two input terminals to an output terminal. Each half output chopper circuit couples an input terminal to one of two output terminals.

The amplifier circuit 300B additionally includes transistors ML1, ML2, MR1, and MR2. Transistors ML1 and MR1 receive a first bias voltage Vbiasp. The first bias voltage Vbiasp sets a current level through transistors ML1 and MR1. Transistors ML2 and MR2 receive a second bias voltage Vcasp, and act as cascading transistors to increase the output impedance of transistors ML1 and MR1, increases the gain of amplifier circuit 300B.

Figure 3C:
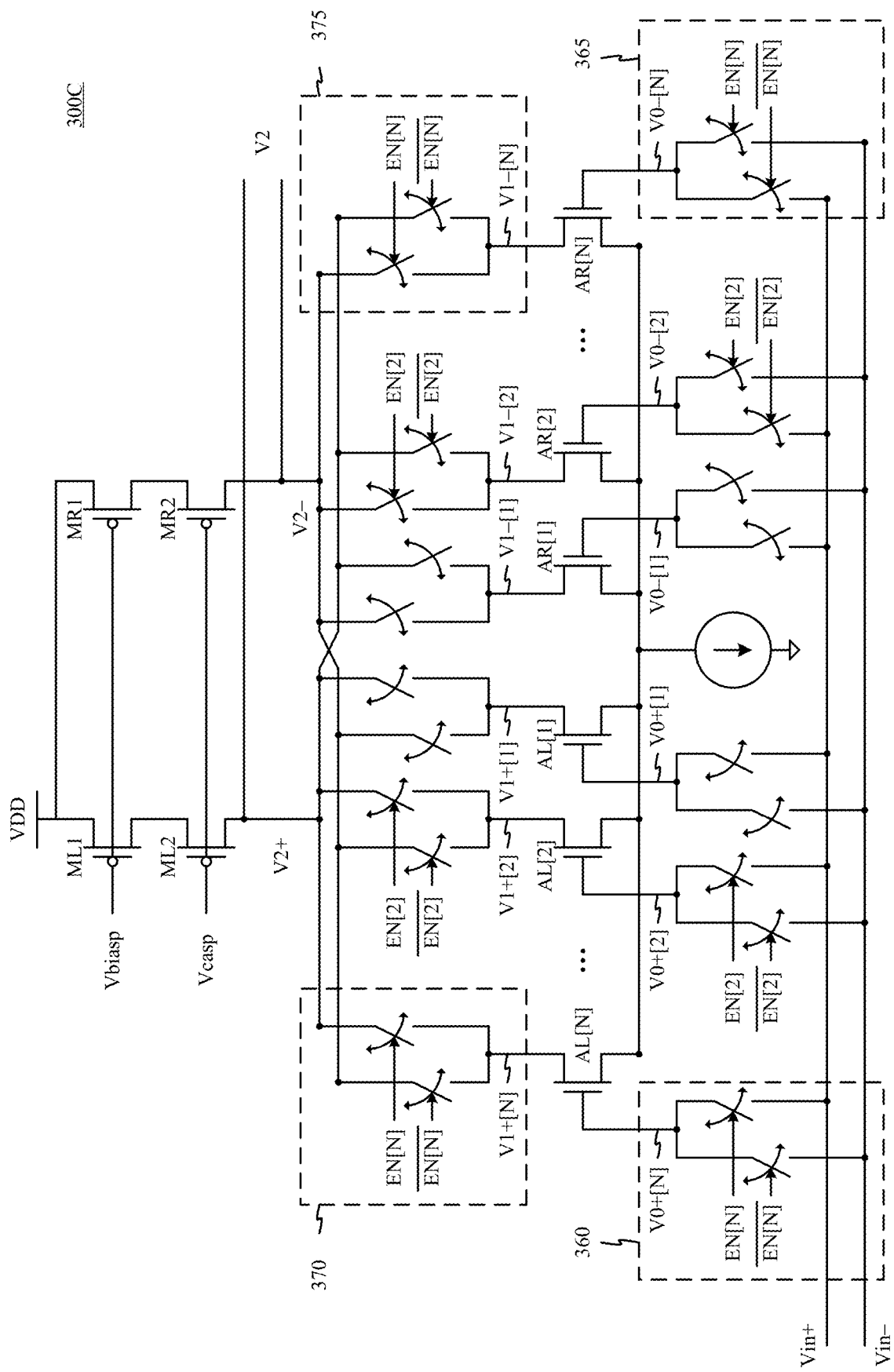
FIG. 3C is a detailed circuit diagram of the amplifier circuit of FIG. 3B, according to one or more embodiments.

FIG. 3C is a detailed circuit diagram of the amplifier circuit of FIG. 3B, according to one or more embodiments. As shown in FIG. 2C, each left transistor AL has a gate coupled to a half input chopper circuit 360, and a drain coupled to a half output chopper circuit 370. Each half input chopper circuit 360 has a first input switch receiving a corresponding control signal EN and a second input switch receiving an inverse of the control signal $\overline{EN}$. For example, the first input switch corresponding to the first left transistor AL[1] receives the first control signal EN[1] and the second input switch corresponding to the first left transistor AL[1] receives the inverse of the first control signal $\overline{EN[1]}$. Similarly, the first input switch corresponding to the N-th left transistor AL[N] receives the N-th control signal EN[N] and the second input switch corresponding to the N-th left transistor AL[N] receives the inverse of the N-th control signal $\overline{EN[N]}$.

The first input switch has a first terminal coupled to a positive terminal of an input voltage Vin+, and a second terminal coupled to the gate of the corresponding left transistor AL. Similarly, the second input switch has a first terminal coupled to a negative terminal of the input voltage Vin−, and a second terminal coupled to the gate of the left transistor AL. Since the second input switch receives an inverse of the signal received by the first input switch, only one input switch is active (i.e., closed) at a time. As such, depending on the value of the corresponding control signal EN, one of either the positive input voltage Vin+ or the negative voltage Vin− is transferred to the gate terminal of the left transistor AL.

Each half output chopper circuit 370 has a first output switch receiving a corresponding control signal EN and a second output switch receiving an inverse of the control signal $\overline{EN}$. For example, the first output switch corresponding to the first left transistor AL[1] receives the first control signal EN[1] and the second output switch corresponding to the first left transistor AL[1] receives the inverse of the first control signal $\overline{EN[1]}$. Similarly, the first output switch corresponding to the N-th left transistor AL[N] receives the N-th control signal EN[N] and the second output switch corresponding to the N-th left transistor AL[N] receives the inverse of the N-th control signal $\overline{EN[N]}$.

The first output switch has a first terminal coupled to the drain of the corresponding left transistor AL, and a second terminal coupled to a positive output terminal V2+. Similarly, the second output switch has a first terminal coupled to the drain of the corresponding left transistor AL, and a second terminal coupled to a negative output terminal V2−. Since the second output switch receives an inverse of the signal received by the first output switch, only one output switch is active (i.e., closed) at a time. As such, depending on the value of the corresponding control signal EN, the drain terminal of the left transistor AL is coupled to either the positive output terminal V2+ or the negative output terminal V2−.

Moreover, each right transistor AR has a gate coupled to half input chopper circuit 365, and a drain coupled to a half output chopper circuit 375. Each half input chopper circuit 365 has a first input switch receiving a corresponding control signal EN and a second input switch receiving an inverse of the control signal $\overline{EN}$. For example, the first input switch corresponding to the first right transistor AR[1] receives the first control signal EN[1] and the second input switch corresponding to the right left transistor AR[1] receives the inverse of the first control signal $\overline{EN[1]}$. Similarly, the first input switch corresponding to the N-th right transistor AR[N] receives the N-th control signal EN[N] and the second input switch corresponding to the N-th right transistor AR[N] receives the inverse of the N-th control signal $\overline{EN[N]}$.

The first input switch has a first terminal coupled to the negative terminal of the input voltage Vin−, and a second terminal coupled to the gate of the corresponding right transistor AR. Similarly, the second input switch has a first terminal coupled to the positive terminal of the input voltage Vin+, and a second terminal coupled to the gate of the right transistor AR. Since the second input switch receives an inverse of the signal received by the first input switch, only one input switch is active (i.e., closed) at a time. As such, depending on the value of the corresponding control signal EN, one of either the positive input voltage Vin+ or the negative voltage Vin− is transferred to the gate terminal of the left transistor AL.

Each half output chopper circuit 375 has a first output switch receiving a corresponding control signal EN and a second output switch receiving an inverse of the control signal $\overline{EN}$. For example, the first output switch corresponding to the first right transistor AR[1] receives the first control signal EN[1] and the second output switch corresponding to the first right transistor AR[1] receives the inverse of the first control signal $\overline{EN[1]}$. Similarly, the first output switch corresponding to the N-th right transistor AR[N] receives the N-th control signal EN[N] and the second output switch corresponding to the N-th right transistor AR[N] receives the inverse of the N-th control signal $\overline{EN[N]}$.

The first output switch has a first terminal coupled to the drain of the corresponding left transistor AL, and a second terminal coupled to the negative output terminal V2−. Similarly, the second output switch has a first terminal coupled to the drain of the corresponding left transistor AL, and a second terminal coupled to the positive output terminal V2+. Since the second output switch receives an inverse of the signal received by the first output switch, only one output switch is active (i.e., closed) at a time. As such, depending on the value of the corresponding control signal EN, the drain terminal of the left transistor AL is coupled to either the positive output terminal V2+ or the negative output terminal V2−.

The combination of a half input chopper circuit 360 corresponding to a left transistor AL and a half input chopper circuit 365 corresponding to a right transistor AR form a full input chopper circuit 220A. For example, the combination of the half input chopper circuit 360 of a k-th left transistor AL[k] and the half input chopper circuit 365 of the k-th right transistor AR[k] form a full input chopper circuit 220A. As such, the first switch of the half input chopper circuit 360 of a k-th left transistor AL[k] and the first switch of the half input chopper circuit 365 of the k-th right transistor AR[k] receive the same control signal EN[k]. Similarly, the second switch of the half input chopper circuit 360 of a k-th left transistor AL[k] and the second switch of the half input chopper circuit 365 of the k-th right transistor AR[k] receive the same inverse control signal $\overline{EN[k]}$.

Additionally, the combination of a half output chopper circuit 370 corresponding to a left transistor AL and a half output chopper circuit 375 corresponding to a right transistor AR form a full output chopper circuit 220B. For example, the combination of the half output chopper circuit 370 of the k-th left transistor AL[k] and the half output chopper circuit 375 of the k-th right transistor AR[k] form a full output chopper circuit 220B. As such, the first switch of the half output chopper circuit 370 of a k-th left transistor AL[k] and the first switch of the half output chopper circuit 375 of the k-th right transistor AR[k] receive the same control signal EN[k]. Similarly, the second switch of the half output chopper circuit 370 of a k-th left transistor AL[k] and the second switch of the half output chopper circuit 375 of the k-th right transistor AR[k] receive the same inverse control signal $\overline{EN[k]}$.

Figure 3D:
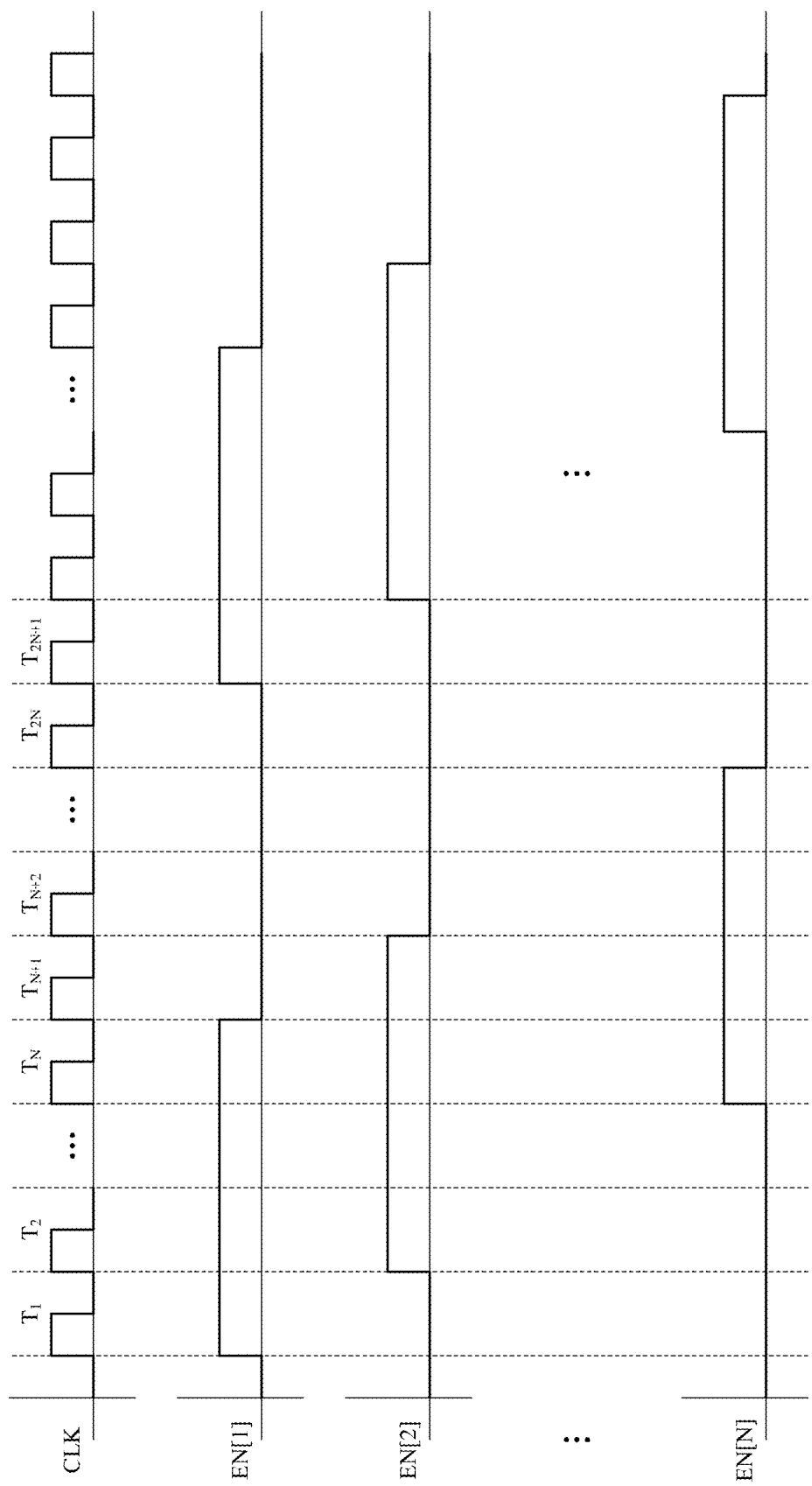
FIG. 3D is a timing diagram for the control signals for controlling the half input chopper circuits and the half output chopper circuits of the amplifier circuit of FIG. 3C, according to one or more embodiments.

FIG. 3D is a timing diagram for the control signals EN[1:N] for controlling the half input chopper circuits and the half output chopper circuits of the amplifier circuit of FIG. 3C, according to one or more embodiments. The timing diagram includes a clock signal CLK periodically transitioning between a first level and a second level. Moreover, the timing diagram includes control signals that toggle between an inactive level and an active level every N clock cycles.

The first control signal EN[1] is asserted or switched to an active level during the first cycle $T_1$ and stays asserted for N clock cycles (i.e., between cycle $T_1$ and cycle $T_N$). The first control signal EN[1] is then switched to an inactive level at cycle $T_{N+1}$ and stays at the inactive level until cycle $T_{2N}$ (N clock cycles). As such, between cycle $T_1$ and cycle $T_N$, the half input chopper circuit 360 of the first left transistor AL[1] couples the gate of the first left transistor AL[1] to the positive terminal of the input voltage Vin+, the half output chopper circuit 370 of the first left transistor AL[1] couples the drain of the first left transistor AL[1] to the positive output terminal V2+, the half input chopper circuit 365 of the first right transistor AR[1] couples the gate of the first right transistor AR[1] to the negative terminal of the input voltage Vin−, and the half output chopper circuit 375 of the first right transistor AR[1] couples the drain of the first right transistor AR[1] to the negative output terminal V2−. Moreover, between cycle $T_{N+1}$ and cycle $T_{2N}$, the half input chopper circuit 360 of the first left transistor AL[1] couples the gate of the first left transistor AL[1] to the negative terminal of the input voltage Vin−, the half output chopper circuit 370 of the first left transistor AL[1] couples the drain of the first left transistor AL[1] to the negative output terminal V2−, the half input chopper circuit 365 of the first right transistor AR[1] couples the gate of the first right transistor AR[1] to the positive terminal of the input voltage Vin+, and the half output chopper circuit 375 of the first right transistor AR[1] couples the drain of the first right transistor AR[1] to the positive output terminal V2+.

The second control signal EN[2] is asserted or switched to the active level during the second cycle $T_2$ and stays asserted for N clock cycles (i.e., between cycle $T_2$ and cycle $T_{N+1}$). The second control signal EN[1] is then switched to an inactive level at cycle $T_{N+2}$ and stays at the inactive level until cycle $T_{2N+1}$ (N clock cycles). As such, between cycle $T_2$ and cycle $T_{N+1}$, the half input chopper circuit 360 of the second left transistor AL[2] couples the gate of the second left transistor AL[2] to the positive terminal of the input voltage Vin+, the half output chopper circuit 370 of the second left transistor AL[2] couples the drain of the second left transistor AL[2] to the positive output terminal V2+, the half input chopper circuit 365 of the second right transistor AR[2] couples the gate of the second right transistor AR[2] to the negative terminal of the input voltage Vin−, and the half output chopper circuit 375 of the second right transistor AR[2] couples the drain of the second right transistor AR[2] to the negative output terminal V2−. Moreover, during cycle T1 and between cycle $T_{N+2}$ and cycle $T_{2N+1}$, the half input chopper circuit 360 of the second left transistor AL[2] couples the gate of the second left transistor AL[2] to the negative terminal of the input voltage Vin−, the half output chopper circuit 370 of the second left transistor AL[2] couples the drain of the second left transistor AL[2] to the negative output terminal V2−, the half input chopper circuit 365 of the second right transistor AR[2] couples the gate of the second right transistor AR[2] to the positive terminal of the input voltage Vin+, and the half output chopper circuit 375 of the second right transistor AR[2] couples the drain of the second right transistor AR[2] to the positive output terminal V2+.

Figure 3E:
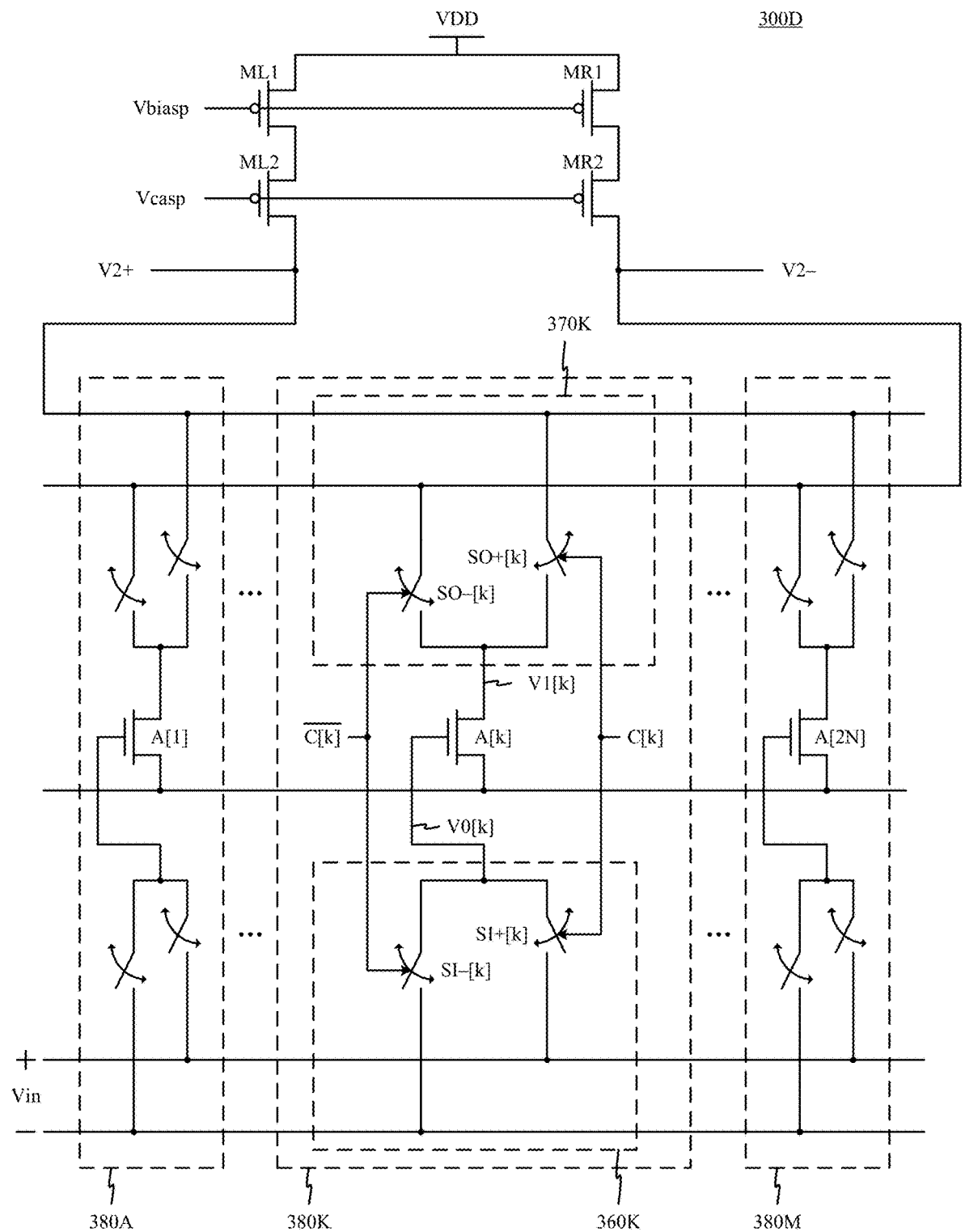
FIG. 3E is a circuit diagram of the amplifier circuit of FIG. 3A with configurable transistors, according to one or more embodiments.

FIG. 3E is a circuit diagram of the amplifier circuit of FIG. 3A with configurable transistors, according to one or more embodiments. Since each left transistor AL and each right transistor AR are connected to both positive and negative input terminals, as well as both positive and negative output terminals through various switches, the amplifier circuit 300 can be implemented using a set of fingers 380 that can be configured as a left transistor AL or a right transistor AR depending on the control signal EN provided to the finger 380.

As such, the amplifier circuit 300D includes 2N fingers 380 that can be configured to behave as a left transistor AL or a right transistor AR based on the control signal C provided to the finger. In particular, the controller 340 generates control signals C[1:2N] to configure N fingers to behave as left transistors AL[1:N] and N fingers to behave as right transistors AR[1:N].

Each finger 380 includes a transistor A, a half input chopper circuit 360, and a half output chopper circuit 370. For example, FIG. 3E illustrates a finger 380K having a transistor A[k], a half input chopper circuit 360K, and a half output chopper circuit 370K. Moreover, each finger receives a control signal C and a corresponding inverse control signal $\overline{C}$ for controlling the half input chopper circuit 360 and the half output chopper circuit 370.

The half input chopper circuit 360 includes a first input switch SI+ receiving the control signal C, and a second input switch SI− receiving the inverse control signal $\overline{C}$. The first input switch SI+ is connected between the positive input terminal Vin+ and the gate of the transistor A. The second input switch SI− is connected between the negative input terminal Vin− and the gate of the transistor A.

The half output chopper circuit 370 includes a first output switch SO+ receiving the control signal C, and a second output switch SO− receiving the inverse control signal $\overline{C}$. The first output switch SO+ is connected between the positive output terminal $V_2$+ and the drain of the transistor A. The second output switch SO— is connected between the negative output terminal $V_2$− and the drain of the transistor A.

When the control signal C[k] for the k-th finger configures the first input switch SI+[k] and the first output switch SO+[k] to be closed during a first portion of a cycle and opened during a second portion of the cycle, the control signal C[k] configures the k-th finger to behave as a left transistor. Conversely, when the control signal C[k] for the k-th finger configures the second input switch SI−[k] and the second output switch SO−[k] to be closed during the first portion of a cycle and opened during the second portion of the cycle, the control signal C[k] configures the k-th finger to behave as a right transistor.

As such, the controller 340 is able to select which fingers to configure as left transistors and which fingers to configure as right transistors to reduce the offset between the left side of the differential amplifier and the right side of the differential amplifier.

Figure 3F:
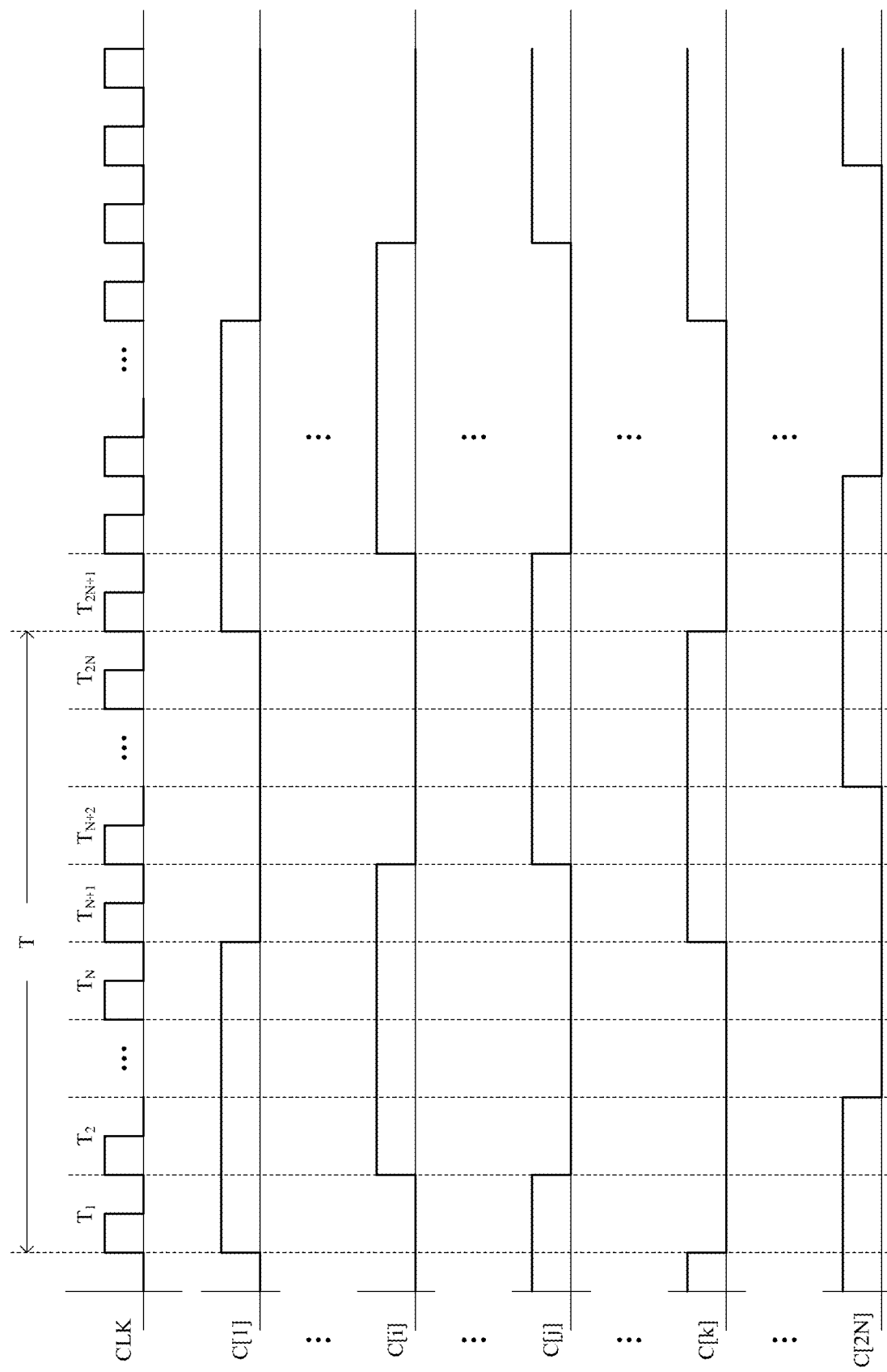
FIG. 3F is a timing diagram for the control signals for controlling each finger of the amplifier circuit of FIG. 3E, according to one or more embodiments.

FIG. 3F is a timing diagram for the control signals C[1:2N] generated by controller 340 for controlling each finger 380 of the amplifier circuit of FIG. 3E, according to one or more embodiments. The timing diagram includes a clock signal CLK periodically transitioning between a first level and a second level. Moreover, the timing diagram includes control signals that toggle between an inactive level and an active level every N clock cycles.

The control signals C[1:2N] include a first subset of signals that control a first subset of fingers 380 to behave as left transistors AL, and a second subset of signals that control a second subset of fingers 380 to behave as right transistors AR. For example, in the timing diagram of FIG. 3F, control signal C[1] and C[i] control respective fingers to behave as left transistors AL, and control signals C[j] and C[k] control respective fingers to behave as right transistors AR.

The first subset of signals that control the first subset of fingers 380 to behave as left transistors AL transition from a first level to a second level within the first half ($T_1$ through $T_N$) of a control period T, and transition from the second level to the first level within the second half ($T_{N+1}$ through $T_{2N}$) of the control period T. For example, control signal C[1] transitions from the first level (LO) to the second level (HI) at the beginning of cycle $T_1$ and transitions from the second level (HI) to the first level (LO) at the beginning of cycle $T_{N+1}$, and control signal C[i] transitions from the first level (LO) to the second level (HI) at the beginning of cycle $T_2$ and transitions from the second level (HI) to the first level (LO) at the beginning of cycle $T_{N+2}$. Moreover, the second subset of signals that control the second subset of fingers 380 to behave as right transistors AR transition from the second level to the first level within the first half of the control period T, and transition from the first level to the second level within the second half of the control period T. For example, control signal C[j] transitions from the second level (HI) to the first level (LO) at the beginning of cycle $T_2$ and transitions from the first level (LO) to the second level (HI) at the beginning of cycle $T_{N+2}$, and control signal C[k] transitions from the second level (HI) to the first level (LO)

at the beginning of cycle $T_1$ and transitions from the first level (LO) to the second level (HI) at the beginning of cycle $T_{N+1}$.

Additionally, each control signal in the first subset of control signals that control the first subset of fingers 380 has a corresponding control signal in the second subset of control signals that control the second subset of fingers 380. For example, in the timing diagram of FIG. 3F, control signal C[1] has a corresponding control signal C[k], and control signal C[i] has a corresponding control signal C[j]. When one control signal in the first subset of control signals transitions from the first level to the second level, the corresponding signal in the second subset of control signals transitions from the second level to the first level. Additionally, when the control signal in the first subset of control signals transitions from the second level to the first level, the corresponding signal in the second subset of control signals transitions form the first level to the second level.

In some embodiments, the control signals are generated such that during any cycle during the operation of the amplifier circuit 300, only one control signal transitions from the first level to the second level, and only one control signal transitions from the second level to the first level. Moreover, the control signals are generated such that during any cycle during the operation of the amplifier circuit 300, one half of the control signals (N control signals) are at the first level and the other half of the control signals (N control signals) are at the second level. As such, during any cycle during the operation of the amplifier circuit 300, one half of the fingers 380 are amplifying the positive input voltage Vin+ and the other half of the fingers 380 are amplifying the negative input voltage Vin−.

By controlling the order in which the control signals C[1:2N] switch between the first level and the second level, the controller 340 is able to pair two fingers 380 such that one behaves as a left transistor AL and the other behaves as a right transistor AR. This allows the control circuit 340 to reduce an amount of offset introduced by the amplifier circuit 300D.

Figure 4:
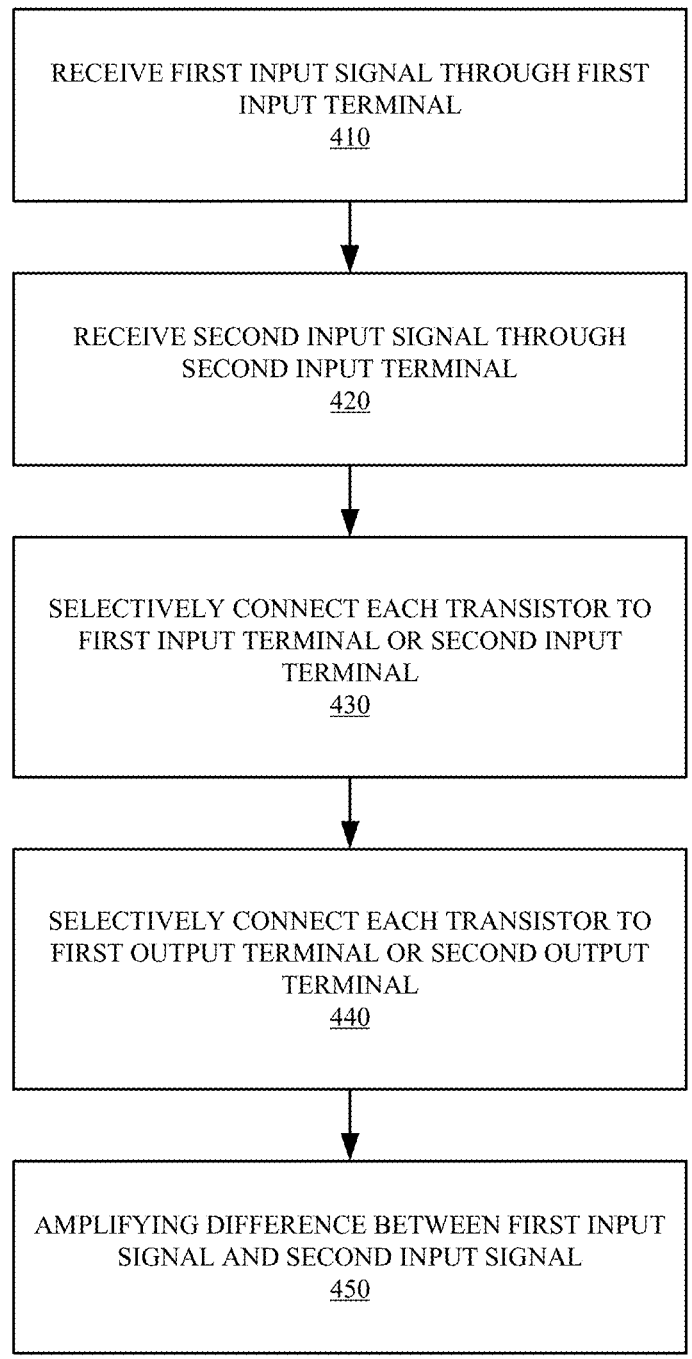
FIG. 4 is a flowchart illustrating a process for operating an amplifier circuit, according to one or more embodiments.

FIG. 4 is a flowchart illustrating a process for operating an amplifier circuit, according to one or more embodiments. The amplifier circuit 300 receives 410 a first input signal Vin+ through a first input terminal, and receives 320 a second input signal Vin− through a second input terminal. For example, the first input signal Vin+ and the second input signal Vin− ends of a differential signal Vin.

A set of input chopper circuits 320A selectively connects 430 each transistor of a set of transistors to either the first input terminal or the second input terminal based on the value of a control signal. Moreover, a set of output chopper circuits 320B selectively connects 440 each transistor of the set of transistors to a first output terminal or a second output terminal based on the value of the control signal. For example, if the control signal has a first value, a first input chopper circuit 325A connects the gate of a first left transistor AL[1] to the first input terminal and connects the gate of a first right transistor AR[1] to the second input terminal. Additionally, a first output chopper circuit 325B connects the drain of the first left transistor AR[1] to the first output terminal and connects the drain of the first right transistor AR[1] to the second output terminal. Alternatively, if the control signal has a second value, the first input chopper circuit 325A connects the gate of the first left transistor AL[1] to the second input terminal and connects the gate of the first right transistor AR[1] to the first input terminal. Additionally, the first output chopper circuit 325B connects the drain of the first left transistor AR[1] to the second output terminal and connects the drain of the first right transistor AR[1] to the first output terminal.

The amplifier circuit amplifies 450 the difference between the first input signal and the second input signal. That is, the set of transistors of the amplifier circuit 300 generates an amplified signal based on the received input signal. In some embodiments, the amplifier circuit amplifies 450 the difference between the first input signal and the second input signal. For example, if the amplifier circuit receives signals Vin+ and Vin− having a difference of [(Vin+)−(Vin−)], the amplifier circuit generates signals Vout+ and Vout− having a difference of $$[(Vout+)-(Vout-)]=[A(Vin+)-A(Vin-)]=A[(Vin+)-(Vin-)]$$

In particular, the operation of the amplifier circuit 300 is divided into a set of cycles. During a first cycle, a first transistor AL[1] of a first transistor pair is connected to the first input terminal and the first output terminal, and a second transistor AR[1] of the first transistor pair is connected to the second input terminal and the second output terminal. Moreover, during the first cycle, a first transistor AL[2] of a second transistor pair is connected to the first input terminal and the first output terminal, and a second transistor AR[2] of the second transistor pair is connected to the second input terminal and the second output terminal. That is, during the first cycle, the first control signal EN[1] has the first value (e.g., LO) and the second control signal EN[2] has the first value (e.g., LO). As such, the first input signal Vin+ is provided to the first transistor AL[1] of the first transistor pair and the first transistor AL[2] of the second transistor pair, and the second input signal Vin− is provided to the second transistor AR[1] of the first transistor pair and the second transistor AR[2] of the second transistor pair.

During a second cycle, the first transistor AL[1] of the first transistor pair is connected to the second input terminal and the second output terminal, and the second transistor AR[1] of the first transistor pair is connected to the first input terminal and the first output terminal. Moreover, during the second cycle, the first transistor AL[2] of the second transistor pair is connected to the first input terminal and the first output terminal, and the second transistor AR[2] of the second transistor pair is connected to the second input terminal and the second output terminal. That is, during the first cycle, the first control signal EN[1] has the second value (e.g., HI) and the second control signal EN[2] has the first value (e.g., LO). As such, the first input signal Vin+ is provided to the second transistor AR[1] of the first transistor pair and the first transistor AL[2] of the second transistor pair, and the second input signal Vin− is provided to the first transistor AL[1] of the first transistor pair and the second transistor AR[2] of the second transistor pair.

During a third cycle, the first transistor AL[1] of the first transistor pair is connected to the second input terminal and the second output terminal, and the second transistor AR[1] of the first transistor pair is connected to the first input terminal and the first output terminal. Moreover, during the third cycle, the first transistor AL[2] of the second transistor pair is connected to the second input terminal and the second output terminal, and the second transistor AR[2] of the second transistor pair is connected to the first input terminal and the first output terminal. That is, during the first cycle, the first control signal EN[1] has the second value (e.g., HI) and the second control signal EN[2] has the second value (e.g., HI). As such, the first input signal Vin+ is provided to the second transistor AR[1] of the first transistor pair and the second transistor AR[2] of the second transistor pair, and the second input signal Vin− is provided to the first transistor AL[1] of the first transistor pair and the first transistor AL[1] of the second transistor pair.

During a fourth cycle, the first transistor AL[1] of the first transistor pair is connected to the first input terminal and the first output terminal, and the second transistor AR[1] of the first transistor pair is connected to the second input terminal and the second output terminal. Moreover, during the third cycle, the first transistor AL[2] of the second transistor pair is connected to the second input terminal and the second output terminal, and the second transistor AR[2] of the second transistor pair is connected to the first input terminal and the first output terminal. That is, during the first cycle, the first control signal EN[1] has the first value (e.g., LO) and the second control signal EN[2] has the second value (e.g., HI). As such, the first input signal Vin+ is provided to the first transistor AL[1] of the first transistor pair and the second transistor AR[2] of the second transistor pair, and the second input signal Vin− is provided to the second transistor AR[1] of the first transistor pair and the first transistor AL[2] of the second transistor pair.

Amplifier Cell Having Distributed Input and Output Chopper Circuits

Figure 5A:
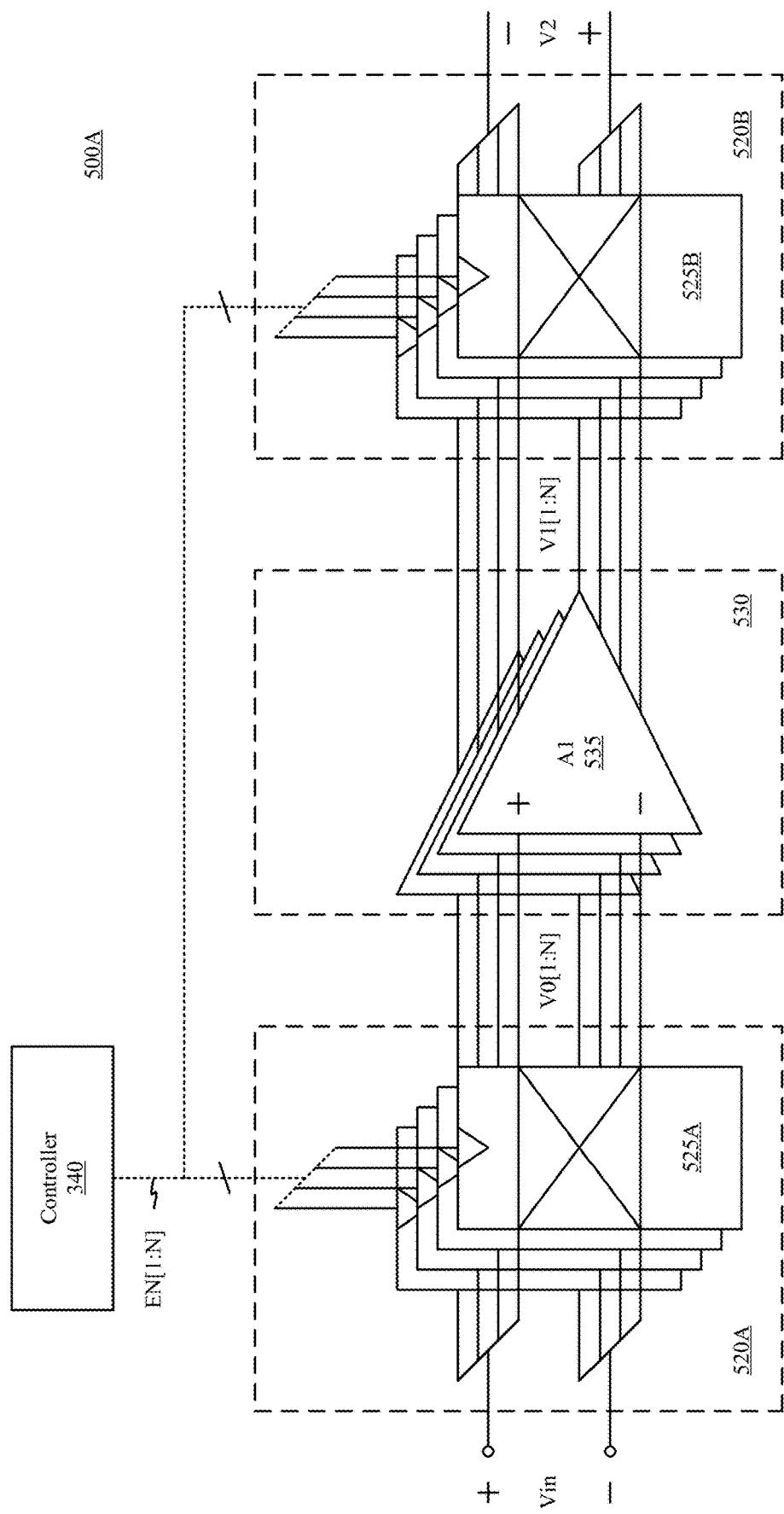
FIG. 5A is a block diagram of an amplifier circuit having distributed chopper circuits using amplifier cells, according to one or more embodiments.

FIG. 5A is a block diagram of an amplifier circuit having distributed chopper circuits using amplifier cells, according to one or more embodiments. The amplifier circuit 500 includes a set of differential amplifiers 530 having multiple differential amplifiers 535, a set of input chopper circuits 520A having multiple input chopper circuits 525A, and a set of output chopper circuits 520B having multiple output chopper circuits 525B.

Each input chopper circuit 525A from the set of input chopper circuits 520A is coupled to a corresponding differential amplifier 535 of the set of differential amplifiers 530. Additionally, each differential amplifier 535 of the set of differential amplifiers 530 is coupled to a corresponding output chopper circuit 525B of the set of output chopper circuits 520B. As such, the amplifier circuit 500 is implemented using a set of amplifier cells, each cell including an input chopper circuit 525A, a differential amplifier 535, and an output chopper circuit 525B.

The set of input chopper circuits 520A receives an input voltage Vin as an input and generates a set of alternating voltage $V_0[1:N]$ as an output. In the example of FIG. 5A, N alternating voltages $V_0[1]$ through $V_0[N]$ are generated. Moreover, the set of input chopper circuits 520A is controlled by a set of control signals EN[1:N].

The set of input chopper circuits 520A includes N input chopper circuits 525A. Each input chopper circuit 525A includes a first input and a second input. The first inputs of each input chopper circuit 525A are connected to each other, and the second inputs of each input chopper circuit 525A are connected to each other. Additionally, each input chopper circuit 525A in the set of input chopper circuits 520A is controlled by a corresponding control signal from the set of control signals EN[1:N] and generates a corresponding alternating voltage of the set of alternating voltages $V_0[1:N]$ based on the corresponding control signal.

The set of differential amplifiers 530 receives the set of alternating voltage $V_0[1:N]$ and amplifies the set of alternating voltages $V_0[1:N]$ to generate a set of amplified alternating voltages $V_1[1:N]$. In the example of FIG. 5A, N alternating voltages $V_0[1]$ through $V_0[N]$ are received as an input and N amplified alternating voltages $V_0[1]$ through $V_0[N]$ are generated as an output. Each alternative voltage is provided to one differential amplifier of the set of differential amplifiers 530. Each differential amplifier then amplifies the corresponding alternative voltage $V_0$ to generate a corresponding amplified alternating voltage $V_1$ from the set of amplified alternating voltages $V_1[1:N]$.

The set of output chopper circuits 520B receives the set of amplified alternating voltages $V_1[1:N]$ as an input and generates a second voltage $V_2$ as an output. In the example of FIG. 5A, N amplified alternating voltages $V_1[1]$ through $V_1[N]$ are received as an input. Moreover, the set of output chopper circuits 520B is controlled by the set of control signals EN[1:N].

The set of output chopper circuits 520B includes N output chopper circuits 525B. Each output chopper circuit 525B includes a first input, a second input, a first output, and a second output. The first outputs of each output chopper circuit 525B are connected to each other, and the second outputs of each output chopper circuit 525B are connected to each other. Additionally, each output chopper circuit 525B in the set of output chopper circuits 520B is controlled by a corresponding control signal from the set of control signals EN[1:N].

Figure 5B:
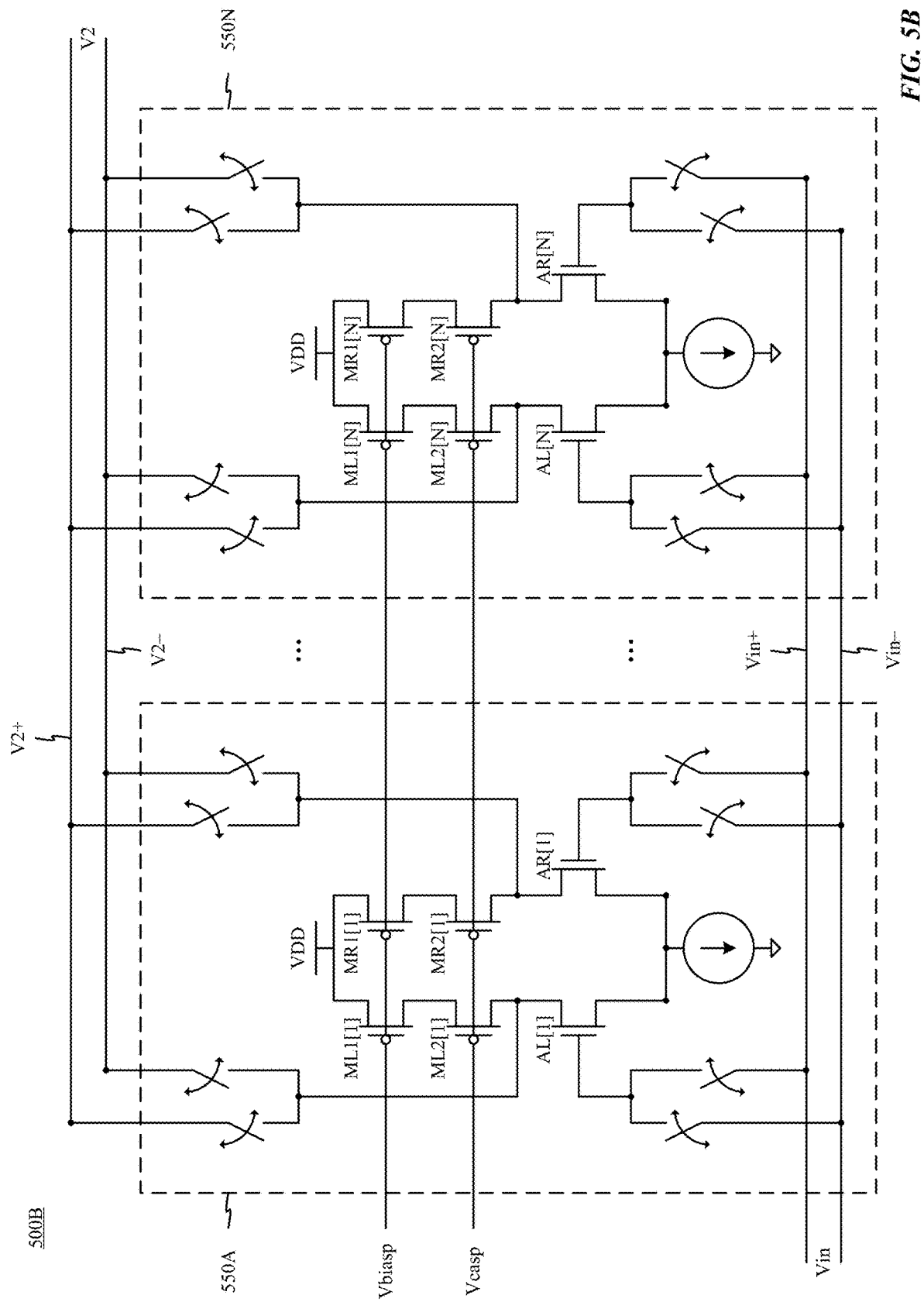
FIG. 5B is a circuit diagram of the amplifier circuit of FIG. 5A, according to one or more embodiments.
Figure 5C:
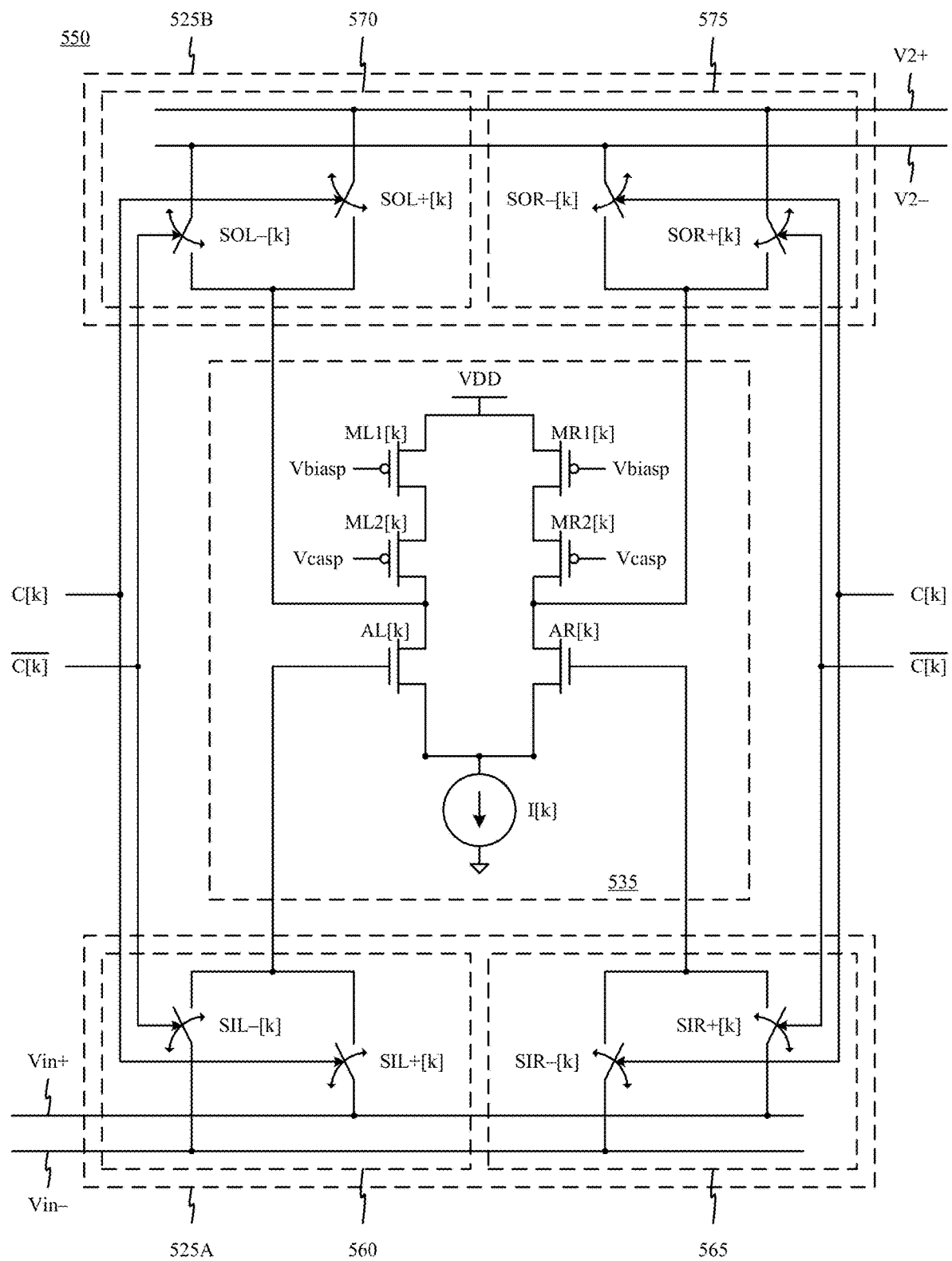
FIG. 5C is a detailed circuit diagram of an amplifier cell used in the amplifier circuits of FIGS. 5A and 5B, according to one or more embodiments.

FIG. 5B is a circuit diagram of the amplifier circuit of FIG. 5A, according to one or more embodiments. The amplifier circuit 500B includes multiple cells 550. Each cell 550 is connected to the first input voltage terminal Vin+, the second input voltage terminal Vin−, the first output voltage terminal V2+, and the second output voltage terminal V2−. FIG. 5C shows a detailed circuit diagram of an amplifier cell used in the amplifier circuits of FIGS. 5A and 5B, according to one or more embodiments. In particular, FIG. 5C illustrates a detailed circuit diagram for the k-th amplifier cell used in the amplifier circuits of FIGS. 5A and 5B.

The amplifier cell 550 includes an input chopper circuit 525A, and output chopper circuit 525B, and a differential amplifier 535. The differential amplifier includes a left transistor AL[k] and a right transistor AR[k]. The left transistor AL[k] and the right transistor AR[k] include a source terminal that are coupled to each other, and to a current source I[k]. The left transistor additionally includes a drain terminal coupled to transistors ML1[k] and ML2[k]. Similarly, the right transistor includes a drain terminal coupled to transistors MR1[k] and MR2[k]. The transistors ML1[k] and MR1[k] receive a first bias voltage Vbiasp, and the transistors ML2[k] and MR2[k] receive a second bias voltage Vcasp. The first bias voltage Vbiasp sets a current level through transistors ML1[k] and MR1[k]. Transistors ML2[k] and MR2[k] act as cascading transistors to increase the output impedance of transistors ML1[k] and MR1[k], increasing the gain of amplifier circuit 500B.

The input chopper circuit 525A includes a first half input chopper circuit 560 coupled to the gate terminal of the left transistor AL[k], and a second half input chopper circuit 565 coupled to the gate terminal of the right transistor AR[k]. The first half input chopper circuit 560 includes a first input switch SIL+[k] coupled between the first input voltage terminal Vin+ and the gate terminal of the left transistor AL[k], and a second input switch SIL−[k] coupled between the second input voltage terminal Vin− and the gate terminal of the left transistor AL[k]. The second half input chopper circuit 565 includes a first input switch SIR+[k] coupled between the first input voltage terminal Vin+ and the gate terminal of the right transistor AR[k], and a second input switch SIR−[k] coupled between the second input voltage terminal Vin− and the gate terminal of the right transistor AR[k]. The first input switch SIL+[k] of the first half input chopper circuit 560 and the second input switch SIR−[k] of the second half input chopper circuit 565 receive a control signal EN[k]. The second input switch SIL−[k] and of the first half input chopper circuit 560 and the first input switch SIR+[k] of the second half input chopper circuit 565 receive the inverse control signal $\overline{EN}$.

The output chopper circuit 525B includes a first half output chopper circuit 570 coupled to the drain of the left transistor AL[k], and a second half output chopper circuit 575 coupled to the drain terminal of the right transistor AR[k]. The first half output chopper circuit 570 includes a first output switch SOL+[k] coupled between the drain terminal of the left transistor AL[k] and the first output terminal V2+, and a second output switch SOL−[k] coupled between the drain terminal of the left transistor AL[k] and the second output terminal V2−. The second half output chopper circuit 575 includes a first output switch SOR+[k] coupled between the drain terminal of the right transistor AR[k] and the first output terminal V2+, and a second output switch SOR−[k] coupled between the drain terminal of the right transistor AR[k] and the second output terminal V2−. The first output switch SOL+[k] of the first half output chopper circuit 570 and the second output switch SOR−[k] of the second half output chopper circuit 575 receive the control signal EN[k]. The second output switch SOL−[k] and of the first half output chopper circuit 570 and the first output switch SOR+[k] of the second half output chopper circuit 575 receive the inverse control signal $\overline{EN[k]}$.

In some embodiments, the amplifier circuit of FIG. 5B uses the timing diagram shown in FIG. 3D. That is, the amplifier circuit 500B uses N control signals EN[1:N] that toggles between a first level and a second level every N cycles. Moreover, each control signal EN is configured to toggle at a different cycle. For example, a first control signal EN[1] for controlling a first cell 550A is configured to switch from the first level to the second level at the beginning of cycle $T_1$, and toggle from the second level to the first level at the beginning of cycle $T_{N+1}$. Moreover, a i-th control signal EN[i] for controlling a first cell 550I is configured to switch from the first level to the second level at the beginning of cycle $T_i$, and toggle from the second level to the first level at the beginning of cycle $T_{N+1}$.

Amplifier Calibration

Figure 6A:
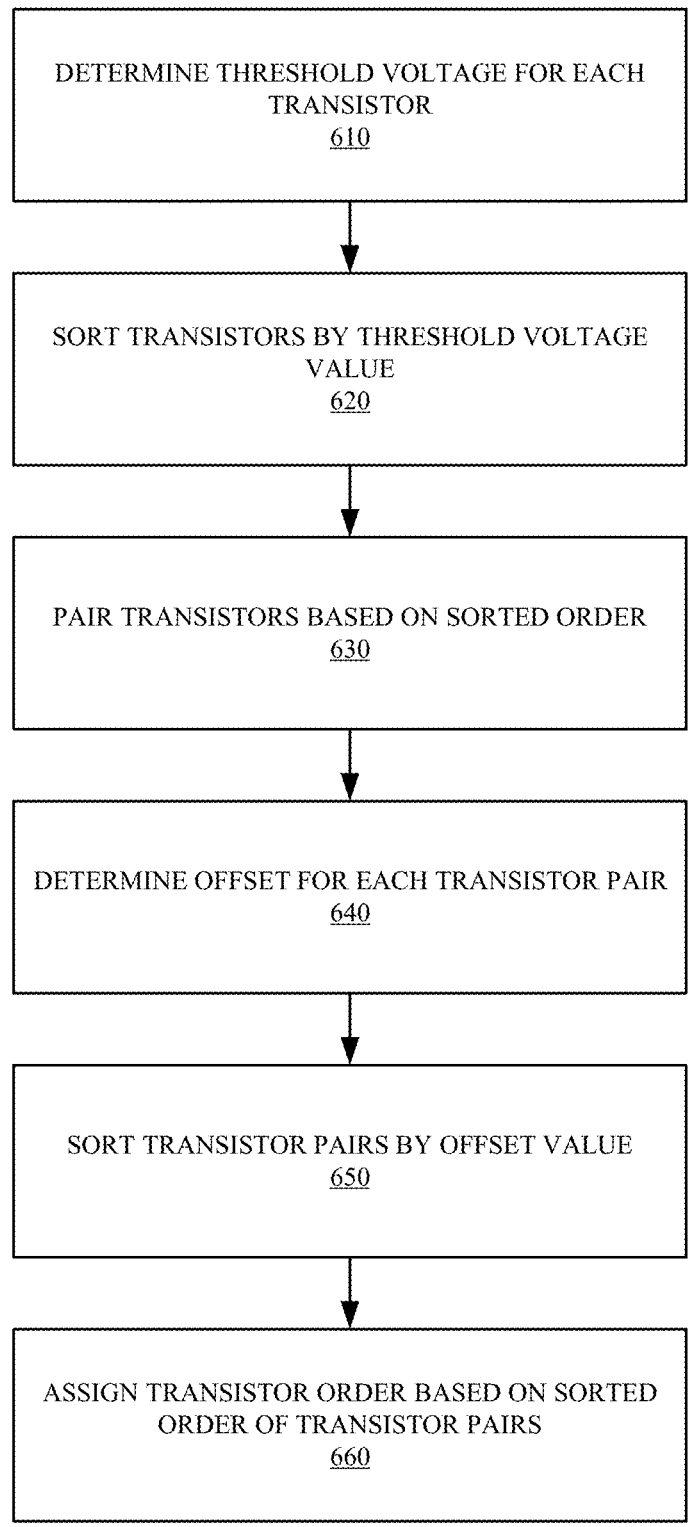
FIG. 6A is a flowchart illustrating a process for calibrating an amplifier circuit, according to one or more embodiments.
Figure 6B:
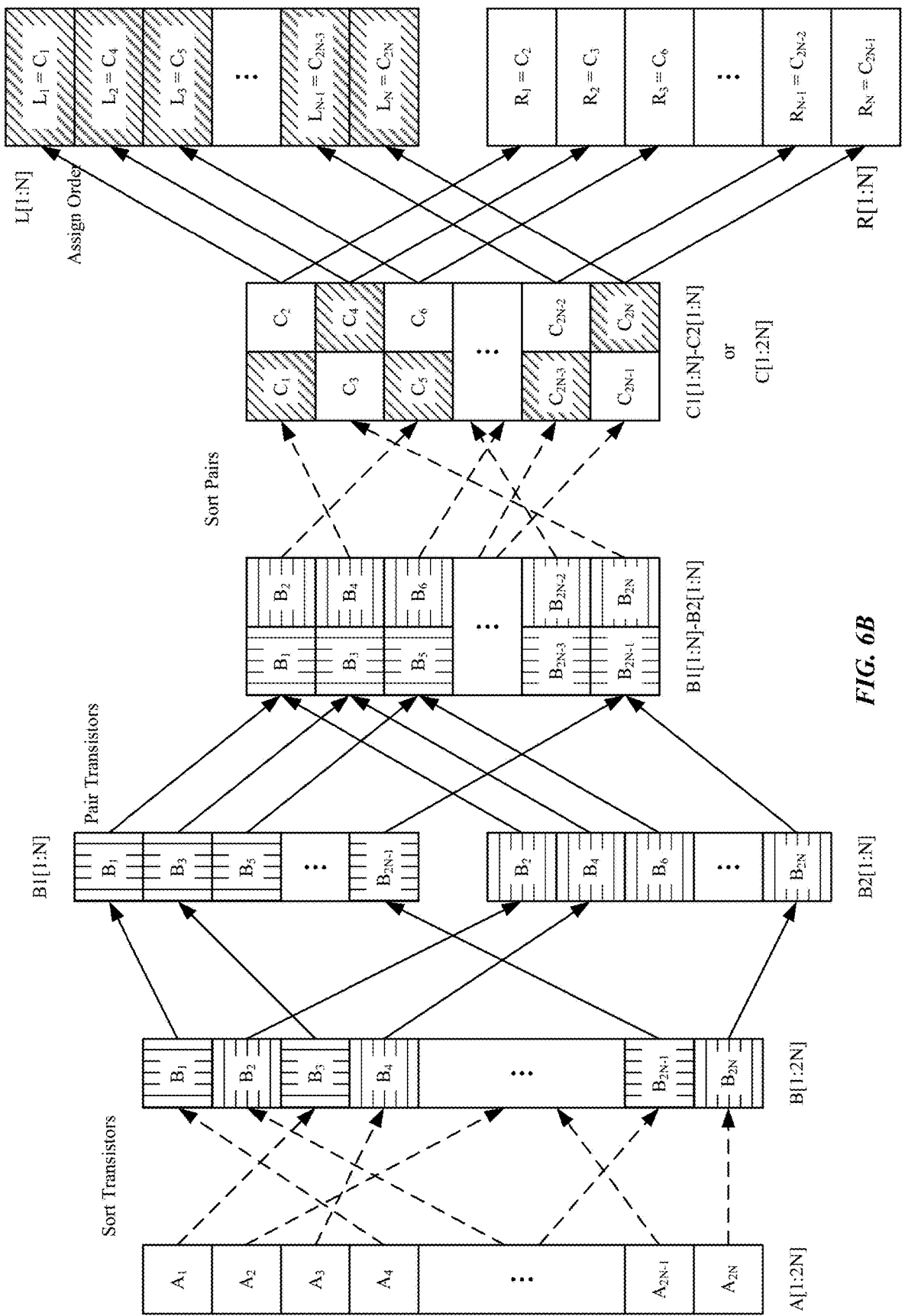
FIG. 6B illustrates an example calibration following the process of FIG. 6A.

FIG. 6A is a flowchart illustrating a process for calibrating an amplifier circuit, according to one or more embodiments. FIG. 6B illustrates an example calibration following the process of FIG. 6A. The calibration process depicted in FIG. 6A may be used with any of the amplifier circuits described above. The controller may first 340 determine 610 a threshold voltage for each transistor A of the array of transistors A[1:2N] used in the differential amplifier 330. Alternatively, this step may be skipped, and the calibration process may be executed by performing a series of threshold voltage comparisons without first determining the actual value of the threshold voltages of each of the transistors.

The controller 340 sorts 620 the transistors A based on their respective threshold voltage values. In some embodiments, array of transistors A[1:2N] are sorted to generate the sorted array of transistors B[1:2N]. In some embodiments, the sorted array of transistors B[1:2N] is further split into two sorted arrays of transistors, B1[1:N] and B2[1:N], each containing half of the elements of the sorted array B[1:2N]. Here, the first sorted array of transistors B1[1:N] contains the odd elements of the sorted array of transistors B[1:2N] and the second sorted array of transistors B2[1:N] contains the even elements of the sorted array of transistors B[1:2N].

In some embodiments, the array of transistors A[1:2N] are sorted without first determining the threshold voltages of each of the transistors. That is, the array of transistors A[1:2N] are sorted by performing comparisons between the threshold voltages of two transistors to determine which transistor of the two has a larger threshold voltage. The process for comparing the threshold voltage of two transistors is described below in conjunction with FIG. 7A.

The controller 340 pairs 630 transistors A based on the sorted order. In some embodiments, the controller 340 pairs transistors A and generates an array of transistor pairs B1[1:N]–B2[1:N]. Each pair of transistors B1[k]–B2[k] in the array of transistor pairs B1[1:N]–B2[1:N] includes a first transistor B1[k] and a second transistor B2[k]. In some embodiments, the controller 340 pairs a transistor corresponding to an odd element in the sorted array of transistors B[1:2N] with an even element in the sorted array of transistors B[1:2N]. For example, the controller 340 pairs a transistor corresponding to an odd element in the sorted array of transistors B[1:2N] with a transistor corresponding to a subsequent element in the sorted array of transistors B[1:2N]. In other embodiments, the controller 340 pairs a transistor in the first sorted array of transistors B1[1:N] with a corresponding element in the second sorted array of transistors B2[1:N].

The controller 340 determines 640 an offset for each transistor pair. That is, the controller 340 determines a difference between the threshold voltage of the first transistor in the pair of transistors and the threshold voltage of the second transistor in the pair of transistors. Since transistors were paired based on the sorted order of transistors, the polarity of each offset will be the same.

The controller 340 sorts 650 the transistor pairs based on the determined offset values. As such, the transistors are sorted in a new order. That is, the array of transistor pairs B1[1:N]–B2[1:N] are sorted to generate a sorted array transistor pairs C1[1:N]–C2[1:N]. Said differently, the sorted array of transistors B[1:2N] are re-sorted to generate a second sorted array of transistors C[1:2N].

In some embodiments, the transistor pairs are sorted without first determining the threshold voltages of each of the transistors. That is, the transistor pairs are sorted by performing comparisons between the threshold voltage offsets of two transistor pairs to determine which transistor pair of the two has a larger threshold voltage offset. The process for comparing the threshold voltage offset of two transistor pairs is described below in conjunction with FIG. 7C.

The controller 340 assigns 660 a transistor order based on the sorted order of the transistor pairs. In some embodiments, the controller 340 generates an array of left transistors L[1:N] to be controlled to behave as left transistors AL, and an array of right transistors R[1:N] to be controller to behave as right transistors AR. To assign the transistor order, the controller 340 determines whether a transistor pair is in an odd position or an even position in the sorted array of transistor pairs C1[1:N]–C2[1:2N]. If the transistor pair is in an odd position, the controller 340 assigns the first transistor of the transistor pair to a first side (e.g., left side) and the second transistor of the transistor pair to a second side (e.g., right side). Conversely, if the transistor pair is in an even position, the controller 340 assigns the first transistor of the transistor pair to the second side (e.g., right side) and the second transistor of the transistor pair to the first side (e.g., left side). As such, the threshold voltage offset alternates in polarity between the transistor pairs in odd positions and transistor pairs in even positions, thus reducing the overall offset of the amplifier circuit. That is, the polarity of the threshold voltage offset between the transistor assigned to the first side and the transistor assigned to the second side for a given transistor pair depends on whether the transistor pair was in an even position or an odd position in the sorted array of transistor pairs. As such, the threshold voltage offset (having a first polarity, e.g., a positive polarity) of transistor pairs that were in an even position will be counterbalanced by the threshold voltage offset (having a second polarity, e.g., a negative polarity) of transistor pairs that were in an odd position.

As used herein, during operation, transistors are "paired" when they are controlled by complementary control signals. That is a first transistor is paired with a second transistor when the half input chopper circuit and the half output chopper circuit of the first transistor is controlled by a first control signal, and the half input chopper circuit and the half output chopper circuit of the second transistor is controlled by a second control signal, complementary to the first control signal (e.g., the second control signal is the inverse of the first control signal). As such, the half input chopper circuit of the first transistor and the half input chopper circuit of the second transistor behave as a full input chopper circuit. Additionally, the half output chopper circuit of the first transistor and the half output chopper circuit of the second transistor behave as a full output chopper circuit.

Moreover, as used herein, during operation, a transistor is "assigned" to a first side when the transistor is controlled by a control signal that transitions from a first level (e.g., LO) to a second level (e.g., HI) during the first half of a control period T, and transitions from the second level to the first level during the second half of the control period T. Moreover, a transistor is "assigned" to a second side when the transistor is controlled by a control signal that transitions from the second level (e.g., HI) to the first level (e.g., LO) during the first half of the control period T, and transitions from the first level to the second level during the second half of the control period T. As a result, transistors "assigned" to the first side are switched from amplifying a first input signal (e.g., Vin+) to amplifying a second input signal (e.g., Vin-) at some point during the first half of the control period T, while a corresponding transistor "assigned" to the second side is switched from amplifying the second input signal to amplifying the first input signal. Furthermore, transistors "assigned" to the first side are switched from amplifying the second input signal (e.g., Vin-) to amplifying the first input signal (e.g., Vin+) at some point during the second half of the control period T, while a corresponding transistor "assigned" to the second side is switched from amplifying the first input signal to amplifying the second input signal.

Threshold Voltage Analysis

Figure 7A:
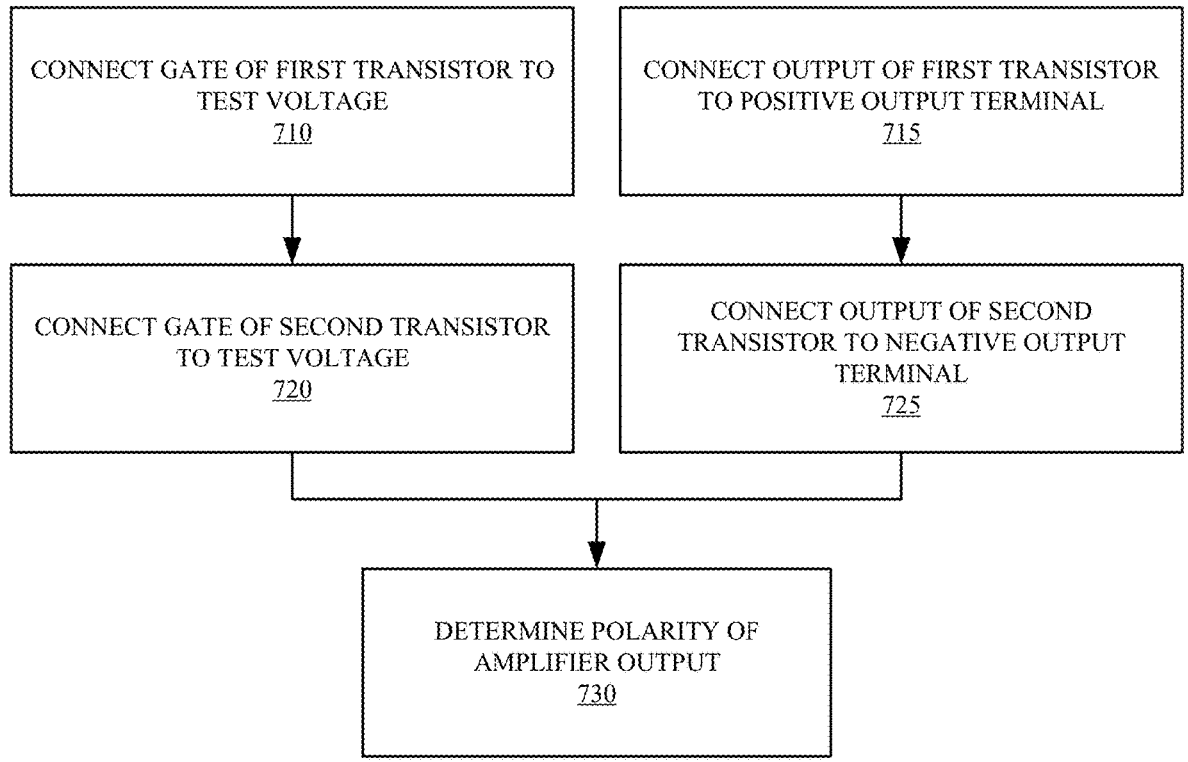
FIG. 7A is a flowchart illustrating a process for comparing threshold voltages of two transistors, according to one or more embodiments.
Figure 7B:
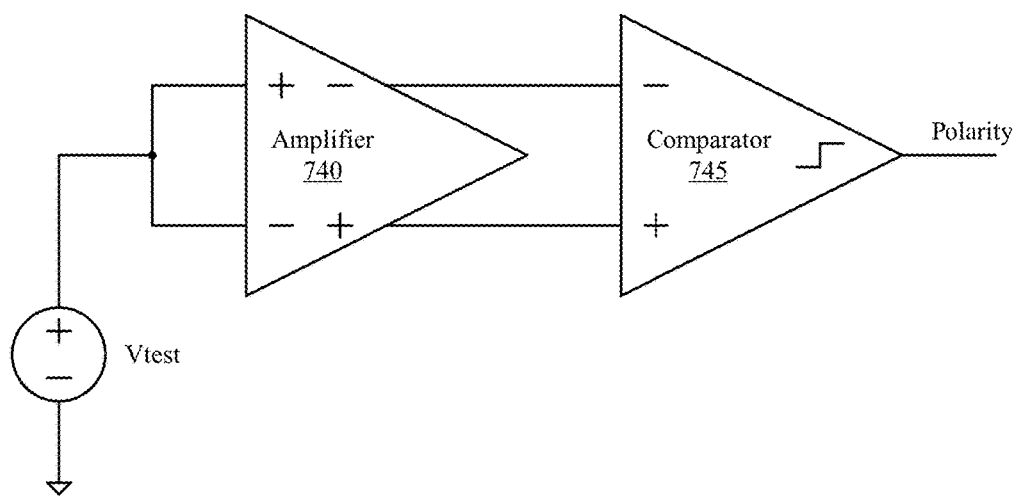
FIG. 7B is a circuit diagram for testing the threshold voltages of transistors, according to one or more embodiments.

FIG. 7A is a flowchart illustrating a process for comparing threshold voltages of two transistors, according to one or more embodiments. FIG. 7B is a circuit diagram for testing the threshold voltages of transistors, according to one or more embodiments.

The controller 340 connects 710 the gate of a first transistor A[i] to a test voltage Vtest. In some embodiments, the controller 340 closes the first input switch SI+[i] of the half input chopper circuit 360 of the first transistor A[i] to connect the gate of the first transistor A[i] to the positive input terminal Vin+ of the amplifier circuit 740. Alternatively, the controller 340 closes the second input switch SI−[i] of the half input chopper circuit 360 of the first transistor A[i] to connect the gate of the first transistor A[i] to the negative input terminal Vin− of the amplifier circuit 740. Alternatively, the controller 340 closes the first input switch SI+[i] and the second input switch SI−[i] of the half input chopper circuit 360 of the first transistor A[i] to connect the gate of the first transistor A[i] to both the positive and negative input terminals of the amplifier circuit 740.

The controller 340 connects 715 the output of the first transistor A[i] to the positive output terminal V2+ of the amplifier circuit 740. In some embodiments, the controller 340 closes the first output switch SO+[i] of the half output chopper circuit 370 of the first transistor A[i].

The controller 340 connects 720 the gate of a second transistor A[k] to a test voltage Vtest. In some embodiments, the controller 340 closes the first input switch SI+[k] of the half input chopper circuit 360 of the second transistor A[k] to connect the gate of the second transistor A[k] to the positive input terminal Vin+ of the amplifier circuit 740. Alternatively, the controller 340 closes the second input switch SI−[k] of the half input chopper circuit 360 of the second transistor A[k] to connect the gate of the second transistor A[k] to the negative input terminal Vin− of the amplifier circuit 740. Alternatively, the controller 340 closes the first input switch SI+[k] and the second input switch SI−[k] of the half input chopper circuit 360 of the second transistor A[k] to connect the gate of the second transistor A[k] to both the positive and negative input terminals of the amplifier circuit 740.

The controller 340 connects 725 the output of the second transistor A[k] to the negative output terminal V2− of the amplifier circuit 740. In some embodiments, the controller 340 closes the second output switch SO−[k] of the half output chopper circuit 370 of the second transistor A[k].

The controller 340 then determines a polarity of the output of the amplifier circuit 740. In some embodiments, the controller 340 uses a comparator 745 for determining the polarity of the output of the amplifier circuit 740. Based on the polarity of the output of the amplifier circuit 740, the controller determines which transistor has a larger threshold voltage. For example, if the output of the comparator 745 has a first value (e.g., HI), the controller 340 determines that the threshold voltage of the first transistor is larger than threshold voltage of the second transistor. Conversely, if the output of the comparator 745 has a second value (e.g., LO), the controller 340 determines that the threshold voltage of the second transistor is larger than the threshold voltage of the first transistor.

Based on these comparisons, the controller 340 is able to sort the array of transistors A[1:2N] based on their respective threshold voltages. That is, when sorting, the array of transistors A[1:2N] to generate the sorted array of transistors B[1:2N], the controller 340 picks two transistors to test which transistor has the larger threshold voltage value and performs the steps of FIG. 7A to make the determination.

Figure 7C:
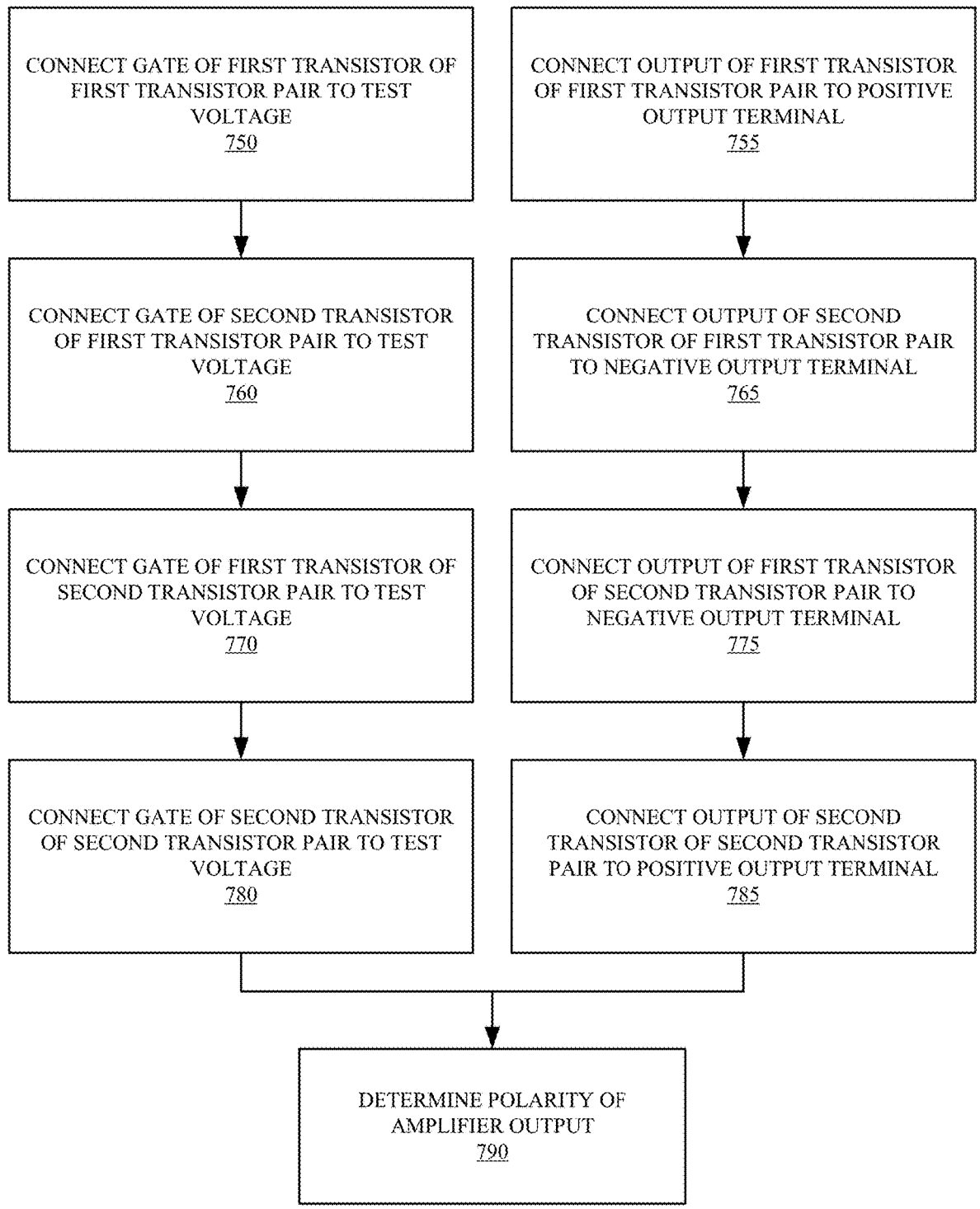
FIG. 7C is a flowchart illustrating a process for threshold voltage offsets between two transistor pairs, according to one or more embodiments.

FIG. 7C is a flowchart illustrating a process for comparing threshold voltage offsets between two transistor pairs, according to one or more embodiments. When sorting the transistor pairs in step 650 of FIG. 6A, the threshold voltage offsets (threshold voltage difference) between pairs of transistors are compared. That is, the threshold voltage offset of a first transistor pair is compared to the threshold voltage offset of a second transistor pair.

The controller 340 controls the half input chopper circuit 360 of the first transistor of the first transistor pair to connect 750 the gate of the first transistor of the first transistor pair to a test voltage. Moreover, the controller 340 controls the half output chopper circuit 370 of the first transistor of the first transistor pair to connect 755 the output of the first transistor of the first transistor pair to the positive output terminal V2+ of the amplifier circuit 740.

In some embodiments, to connect the gate of the first transistor of the first transistor pair to the test voltage, the controller 340 closes the first input switch SI+ of the half input chopper circuit 360 to connect the gate of the first transistor of the first transistor pair to the positive input terminal Vin+ of the amplifier circuit 740. Alternatively, the controller 340 closes the second input switch SI− of the half input chopper circuit 360 to connect the gate of the first transistor of the first transistor pair to the negative input terminal Vin− of the amplifier circuit 740. Alternatively, the controller 340 closes the first input switch SI+ and the second input switch SI− of the half input chopper circuit 360 to connect the gate of the first transistor of the first transistor pair to both the positive and negative input terminals of the amplifier circuit 740.

The controller 340 controls the half input chopper circuit 360 of the second transistor of the first transistor pair to connect 760 the gate of the second transistor of the first transistor pair to the test voltage. Moreover, the controller 340 controls the half output chopper circuit 370 of the second transistor of the first transistor pair to connect 765 the output of the first transistor of the first transistor pair to the negative output terminal V2− of the amplifier circuit 740.

In some embodiments, to connect the gate of the second transistor of the first transistor pair to the test voltage, the controller 340 closes the second input switch SI− of the half input chopper circuit 360 to connect the gate of the second transistor of the first transistor pair to the negative input terminal Vin− of the amplifier circuit 740. Alternatively, the controller 340 closes the first input switch SI+ of the half input chopper circuit 360 to connect the gate of the second transistor of the first transistor pair to the positive input terminal Vin+ of the amplifier circuit 740. Alternatively, the controller 340 closes the first input switch SI+ and the second input switch SI− of the half input chopper circuit 360 to connect the gate of the second transistor of the first transistor pair to both the positive and negative input terminals of the amplifier circuit 740.

The controller 340 controls the half input chopper circuit 360 of the first transistor of the second transistor pair to connect 770 the gate of the first transistor of the second transistor pair to the test voltage. Moreover, the controller 340 controls the half output chopper circuit 370 of the first transistor of the second transistor pair to connect 775 the output of the first transistor of the second transistor pair to the negative output terminal V2− of the amplifier circuit 740.

In some embodiments, to connect the gate of the first transistor of the second transistor pair to the test voltage, the controller 340 closes the second input switch SI− of the half input chopper circuit 360 to connect the gate of the second transistor of the first transistor pair to the negative input terminal Vin− of the amplifier circuit 740. Alternatively, the controller 340 closes the first input switch SI+ of the half input chopper circuit 360 to connect the gate of the first transistor of the second transistor pair to the positive input terminal Vin+ of the amplifier circuit 740. Alternatively, the controller 340 closes the first input switch SI+ and the second input switch SI− of the half input chopper circuit 360 to connect the gate of the first transistor of the second transistor pair to both the positive and negative input terminals of the amplifier circuit 740.

The controller 340 controls the half input chopper circuit 360 of the second transistor of the second transistor pair to connect 780 the gate of the second transistor of the second transistor pair to the test voltage. Moreover, the controller 340 controls the half output chopper circuit 370 of the second transistor of the second transistor pair to connect 775 the output of the second transistor of the second transistor pair to the positive output terminal V2+ of the amplifier circuit 740.

In some embodiments, to connect the gate of the second transistor of the second transistor pair to the test voltage, the controller 340 closes the first input switch SI+ of the half input chopper circuit 360 to connect the gate of the second transistor of the second transistor pair to the positive input terminal Vin+ of the amplifier circuit 740. Alternatively, the controller 340 closes the second input switch SI− of the half input chopper circuit 360 to connect the gate of the second transistor of the second transistor pair to the negative input terminal Vin− of the amplifier circuit 740. Alternatively, the controller 340 closes the first input switch SI+ and the second input switch SI− of the half input chopper circuit 360 to connect the gate of the second transistor of the second transistor pair to both the positive and negative input terminals of the amplifier circuit 740.

The controller 340 then determines a polarity of the output of the amplifier circuit 740. In some embodiments, the controller 340 uses the comparator 745 for determining the polarity of the output of the amplifier circuit 740. Based on the polarity of the output of the amplifier circuit 740, the controller determines which transistor pair has a larger threshold voltage offset. For example, if the output of the comparator 745 has a first value (e.g., HI), the controller 340 determines that the threshold voltage offset of the first transistor pair is larger than threshold voltage offset of the second transistor pair. Conversely, if the output of the comparator 745 has a second value (e.g., LO), the controller 340 determines that the threshold voltage offset of the second transistor pair is larger than the threshold voltage offset of the first transistor pair.

Amplifier Dynamic Offset Calibration

Figure 8A:
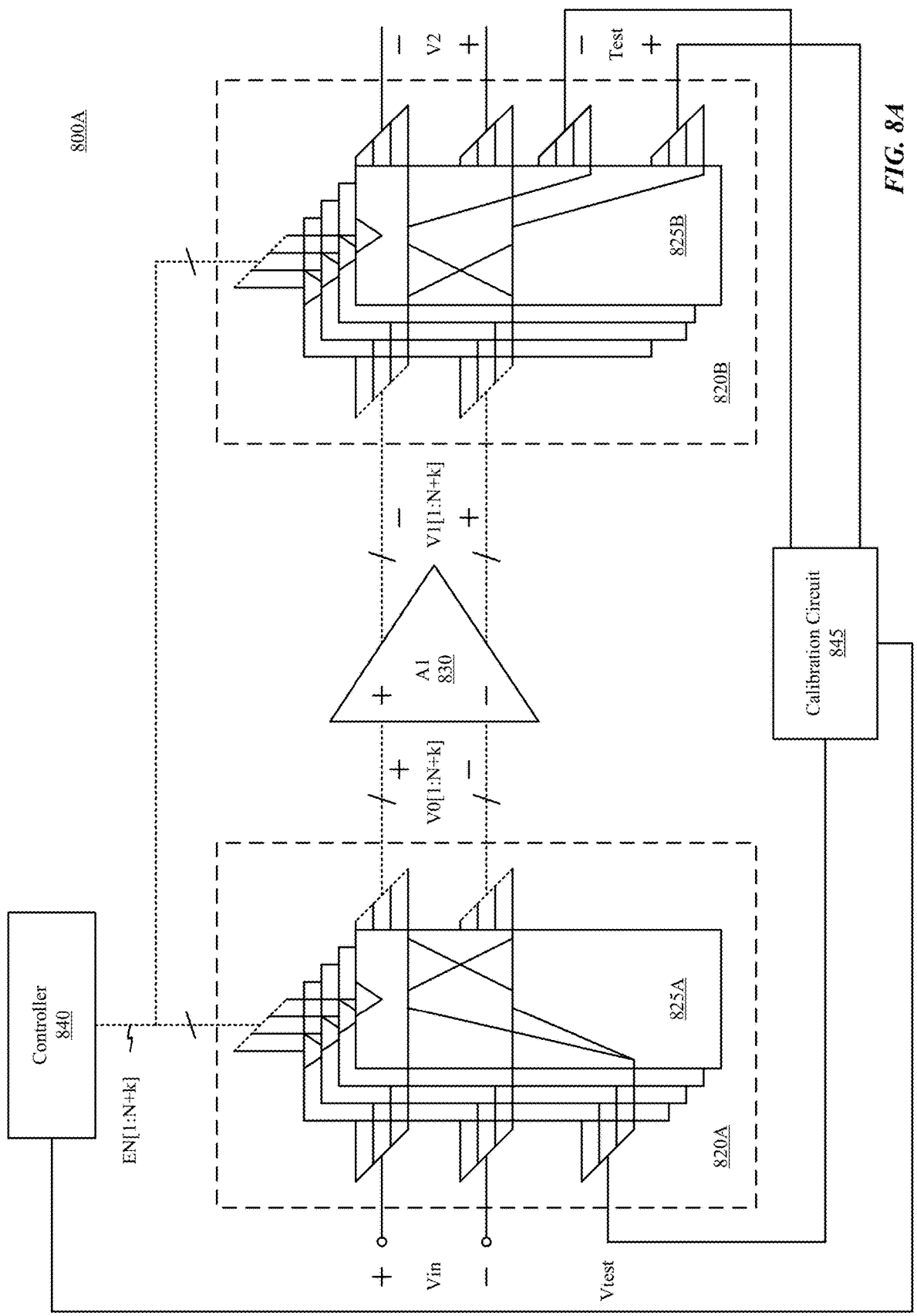
FIG. 8A is a block diagram of an amplifier circuit having a calibration circuit for dynamically calibrating the amplifier offset, according to one or more embodiments.

FIG. 8A is a block diagram of an amplifier circuit 800A having a calibration circuit for dynamically calibrating the amplifier offset, according to one or more embodiments. The amplifier circuit 800A includes a differential amplifier 830 having a gain A1, a set of input routing circuits 820A having multiple input routing circuits 825A, a set of output routing circuits 820B having multiple output routing circuits 825B. In the diagram of FIG. 8A, the dotted connections denote a parallel connection including multiple signals being routed in parallel.

The set of input routing circuits 820A receives a differential input voltage Vin (having a positive input voltage Vin+ received through a first input terminal, and a negative input voltage Vin− received through a second input terminal) and a test voltage Vtest received through a third input terminal. Each input routing circuit connects a first output terminal to either the first input terminal to provide the positive input voltage Vin+ to a corresponding positive input terminal of the differential amplifier 830, the second input terminal to provide the negative input voltage Vin− to the corresponding positive input terminal of the differential amplifier 830, or the third input terminal to provide the test voltage Vtest to the corresponding positive input terminal of the differential amplifier 830. Additionally, each input routing circuit connects a second output terminal to either the second input terminal to provide the negative input voltage Vin− to a corresponding negative input terminal of the differential amplifier 830, the first input terminal to provide the positive input voltage Vin+ to the corresponding negative input terminal of the differential amplifier 830, or the third input terminal to provide the test voltage Vtest to the corresponding negative input terminal of the differential amplifier 830.

In some embodiments, the set of input routing circuits 820A include N+k input routing circuits 825. Moreover, the set of input routing circuits 820A is configured to connect each output of N input routing circuits 825A to the differential input voltage Vin (i.e., to connect each output of N input routing circuits 825A to either the first input terminal or the second input terminal). In some embodiments, when an input routing circuit 825A is configured to connect the first output to the first input, the input routing circuit 825A connects the second output to the second input. Moreover, when an input routing circuit 825A is configured to connect the first output to the second input, the input routing circuit 825A connects the second output to the first input.

Moreover, during a calibration process, the set of input routing circuits 820A is configured to connect the output of one or more input routing circuits 825A to the test voltage (i.e., to connect the output of one or more input routing circuits 825A to the third input terminal). In some embodiments, the set of input routing circuits 820A is configured to connect the output of at most k input routing circuits 825A to the third input terminal. In some embodiments, when an input routing circuit 825A is configured to connect the first output to the third input, the input routing circuit 825A connects the second output to the third input.

The differential amplifier 830 receives the set of differential inputs $V_0[1:N+k]$ and generates a set of amplified differential outputs $V_1[1:N+k]$. In some embodiments, the differential amplifier 830 receives N differential input voltages and generates N differential output voltages. That is, the differential amplifier includes 2N transistors used for amplifying the N differential input voltages of set of differential input $V_0[1:N+k]$. Additionally, the differential amplifier includes 2k spare transistor that are used during the offset calibration process. During the offset calibration process, one or more transistors from the set of 2N transistors are replaced by one or more of the 2k spare transistors to allow each of the transistors from the set of 2N transistors to be tested. In some embodiments, the differential amplifier includes 2N+2k transistors and 2k transistors are configured as spare transistors (e.g., during a startup process or after each offset calibration process).

The set of output routing circuits 820B receives N+k amplified differential voltages $V_1[1:N+k]$ from the differential amplifier. Each output routing circuit 825B connects a first input terminal to one output terminal, and connects a second input terminal to another output terminal. In some embodiments, each output routing circuit 825B includes four output terminals. When the output routing circuit 825 is configured to connect the first input terminal to a first output terminal, the output routing circuit 825 connects the second input terminal to a second output terminal. When the output routing circuit 825 is configured to connect the first input terminal to the second output terminal, the output routing circuit 825 connects the second input terminal to the first output terminal. When the output routing circuit 825 is configured to connect the first input terminal to a third output terminal, the output routing circuit 825 connects the second input terminal to a fourth output terminal. When the output routing circuit 825 is configured to connect the first input terminal to the fourth output terminal, the output routing circuit 825 connects the second input terminal to the third output terminal.

The first output of each output routing circuit 825B is connected to the first output of the amplifier circuit 800A. The second output of each output routing circuit 825B is connected to the second output of the amplifier circuit 800A. The third output of each output routing circuit 825 is connected to a first input terminal of the calibration circuit 845. The fourth output of each output routing circuit 825 is connected to a second input terminal of the calibration circuit 845.

The set of input routing circuits 820A and the set of output routing circuits 820B are controlled by a set of control signals $EN[1:N+k]$. In some embodiment, each control signal EN multiple bits. Moreover, each control signal EN may indicate whether the corresponding set of transistors of the differential amplifier 830 are in a normal operation mode or in a calibration mode. In the normal operation mode, the corresponding set of transistors of the differential amplifier 830 receive the input voltage Vin and amply the input voltage Vin. In the calibration mode, the corresponding set of transistors of the differential amplifier 830 receive the test voltage Vtest and generate a test output.

Although the controller 840 is described as providing a set of control signals $EN[1:N+k]$ for controlling N+k pairs of transistors, it is understood that the transistors might be dynamically paired by the controller 840. That is, the controller generates 2N+2k signals, each for controlling one of the 2N+2k transistors of the differential amplifier 830. The 2N+2k include N+k signals $C[1:N+k]$ and N+k signals $\overline{C}[1:N+k]$. The controller 840 pairs a first transistor of the 2N+2k transistors of the differential amplifier 830 with a second transistor of the 2N+2k transistors of the differential amplifier 830 by providing a signal $C[k]$ to the first transistor and providing the complement $\overline{C}[k]$ of the signal $C[k]$ to the second transistor. As such, a k-th control signal $EN[k]$ shown in FIG. 8A includes a signal $C[k]$ and a complement signal $\overline{C}[k]$.

If a control signal EN indicates an operation in normal operation, the corresponding input routing circuit 825A propagates the differential input voltage Vin to the first and second output terminal. The control signal EN further indicates whether to invert the differential input signal. For example, the control signal EN may have a first value indicating a non-inverting normal operation, and a second value indicating an inverting normal operation. If the control signal EN indicates not the invert the differential input signal (a non-inverting normal operation, e.g., by having the first value), the corresponding input routing circuit 825A connects the first input terminal to the first output terminal, and connects the second input terminal to the second output terminal. Alternatively, if the control signal EN indicates inversion of the differential input (an inverting normal operation, e.g., by having the second value), the corresponding input routing circuit 825A connects the first input terminal to the second output terminal, and connects the second input terminal to the first output terminal.

Moreover, when the control signal EN indicates to operate in normal operation, the corresponding output routing circuit 825B propagates the amplified differential voltage $V_1$ provided to the output routing circuit 825 to the output $V_2$ of the amplifier circuit 800A. In some embodiments, if the control signal EN indicates a non-inverting normal operation, the corresponding output routing circuit 825 connects the first input terminal to the first output terminal, and connects the second input terminal to the second input terminal. Alternatively, if the control signal EN indicates an inverting normal operation, the corresponding output routing circuit 825 connects the first input terminal to the second output terminal, and connects the second input terminal to the first input terminal.

If a control signal EN indicates to operate in the calibration mode, the corresponding input routing circuit 825A propagates the test voltage Vtest to the first and second output terminals. In some embodiments, when the control signal EN indicates to operate in the calibration mode, the corresponding input routing circuit connects the third input terminal to the first output terminal, and connects the third input terminal to the second output terminal.

Moreover, when the control signal EN indicates to operate in the calibration mode, the corresponding output routing circuit 825B propagates the amplified differential voltage $V_1$ provided to the output routing circuit 825 to the third and fourth output terminals. In some embodiments, the control signal EN has a third value to indicate a non-inverting calibration mode, and a fourth value to indicate an inverting calibration mode. If the control signal EN indicates a non-inverting calibration mode, the corresponding output routing circuit 825B connects the first input terminal to the third output terminal, and connects the second input terminal to the fourth output terminal. Alternatively, if the control signal EN indicates an inverting calibration mode, the corresponding output routing circuit 825B connects the first input terminal to the fourth output terminal, and connects the second input terminal to the third output terminal.

In some embodiments, the input routing circuits 825A and the output routing circuits 825B are further configured to be turned off (e.g., in response to receiving a control signal EN having a fifth value).

In other embodiments, N input routing circuits 825A and N output routing circuits 825B are configured to operate in the normal operation and the calibration mode as described above, and k input routing circuits 825A and k output routing circuits 825B corresponding to k spare transistor pairs in the differential amplifier 830 are configured to be turned off when receiving a control signal indicating to operate in the calibration mode.

In some embodiments, during operation of the amplifier circuit 800A, the control signals EN[1:N+k] are generated such that N control signals EN indicate normal operation (e.g., by having the first or second value). Moreover, the remaining k control signals are configured to indicate a calibration operation (e.g., by having the third of fourth value) or to turn off a corresponding input routing circuit 825A or a corresponding output routing circuit 825B (e.g., by having the fifth value).

A more detailed description of the input routing circuit 825A and the output routing circuit 825B is described below in conjunction with FIGS. 8B and 8C.

The controller 840 generates the control signals EN[1:N+k] for controlling the input routing circuits 825A and the output routing circuits 825B. In some embodiments, the controller 840 further generates signals for controlling the calibration circuit 845. The controller 840 may generate the control signals EN[1:N+k] based on an output of the calibration circuit 845. Although FIG. 8A is shown as having N+k input routing circuits 825A and N+k output routing circuits, each receiving a control signal EN, it would be understood that the amplifier circuit 800 may be implemented using 2N+2k half input routing circuits and 2N+2k half output routing circuits. Each half input routing circuit and each half output routing circuit receives a control signal C. The controller 840 pairs a first input routing circuit to a second input routing circuit by controlling the second input routing circuit with a signal complementary to the signal used for controlling the first input routing circuit. Moreover, the controller 840 pairs a first output routing circuit to a second output routing circuit by controlling the second output routing circuit with a signal complementary to the signal used for controlling the first output routing circuit. As such, to pair a j-th transistor of the differential amplifier 830 to an i-th transistor of the differential amplifier 830, the controller 840 controls the half input routing circuit and the half output routing circuit coupled to the i-th transistor with a control signal C[i], and controls the half input routing circuit and the half output routing circuit coupled to the j-th transistor with the complement $\overline{C}[i]$ of the i-th control signal C[i]. That is, the j-th control signal C[j] is the complement of the i-th control signal C[i]. The use of half input routing circuit and half output routing circuits are described below in conjunction with FIGS. 8B through 8E.

The calibration circuit 845 generates the test voltage Vtest for testing transistors of the differential amplifier 830. Moreover, the calibration circuit 845 receives an output test voltage generated based on the test voltage Vtest. A detailed description of the calibration circuit 845 is described below in conjunction with FIG. 8F.

Figure 8B:
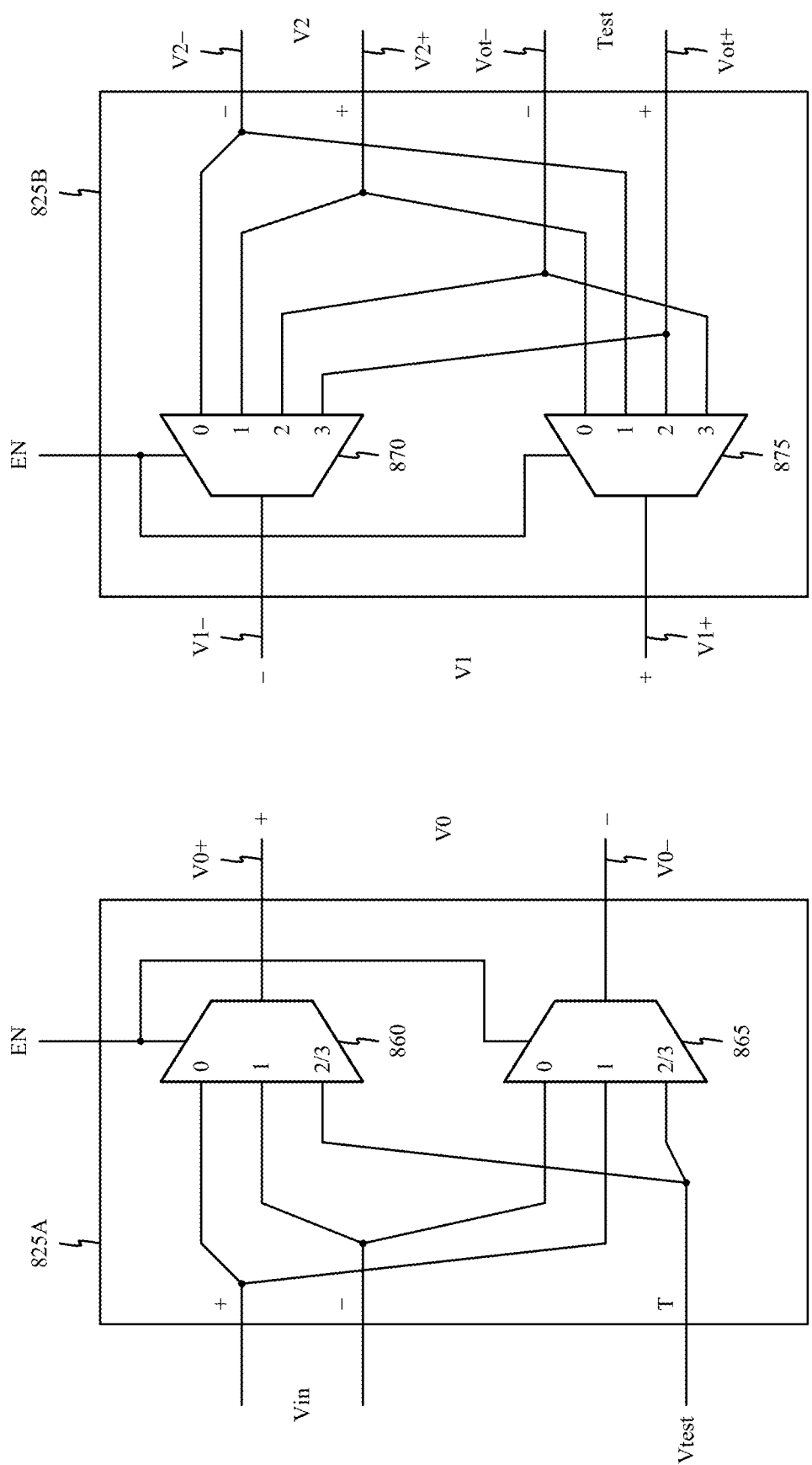
FIG. 8B illustrates a block diagram of an input routing circuit and an output routing circuit, according to one or more embodiments.

FIG. 8B illustrates a block diagram of an input routing circuit 825A and an output routing circuit 825B, according to one or more embodiments. The input routing circuit 825A includes a first half input routing circuit 860 and a second half input routing circuit 865. As described above, the first half input routing circuit 860 may be paired with the second half input routing circuit 865 dynamically by the controller 840. The controller dynamically pairs the second half input routing circuit 865 from a set of half input routing circuit with the first input routing circuit by controlling the second input routing circuit 865 with a signal that is complementary to the signal used for controlling the first half input routing circuit 860. In the embodiment of FIG. 8B, the first half input routing circuit 860 and the second half input routing circuit 865 are multiplexers (e.g., a 3-to-1 multiplexer or a 4-to-1 multiplexer).

The first half input routing circuit 860 has a first input terminal coupled to positive end (Vin+) of the input voltage Vin, a second input terminal coupled to the negative end (Vin−) of the input voltage Vin, and a third input terminal coupled to the test voltage Vtest. In some embodiments, the first half input routing circuit 860 additionally includes a fourth input terminal coupled to the test voltage Vtest. In other embodiments, the fourth input terminal may be coupled to a voltage to turn off a corresponding transistor of the differential amplifier 830.

The second half input routing circuit 865 has a first input terminal coupled to negative end (Vin−) of the input voltage Vin, a second input terminal coupled to the positive end (Vin+) of the input voltage Vin, and a third input terminal coupled to the test voltage Vtest. In some embodiments, the first half input routing circuit 865 additionally includes a fourth input terminal coupled to the test voltage Vtest. In other embodiments, the fourth input terminal may be coupled to a voltage to turn off a corresponding transistor of the differential amplifier 830.

The output routing circuit 825B includes a first half output routing circuit 870 and a second half output routing circuit 875. As described above, the first half output routing circuit 870 may be paired with the second half output routing circuit 875 dynamically by the controller 840. The controller dynamically pairs the second half output routing circuit 875 from a set of half output routing circuit with the first output routing circuit by controlling the second output routing circuit 875 with a signal that is complementary to the signal used for controlling the first half output routing circuit 860. In the embodiment of FIG. 8B, the first output routing circuit 870 and the second output routing circuit 875 are demultiplexers (e.g., a 1-to-4 demultiplexer).

The first half output routing circuit 870 has an input terminal coupled to the negative end of the amplified differential voltage $V_1-$. The first half output routing circuit 870 has a first output terminal coupled to the negative output terminal (V₂−) of the amplifier circuit 800, a second output terminal coupled to the positive output terminal (V₂+) of the amplifier circuit 800, a third output terminal coupled to the negative end (Vot−) of the output test voltage, and a fourth output terminal coupled to the positive end (Vot+) of the output test voltage.

The second half output routing circuit 870 has an input terminal coupled to the positive end of the amplified differential voltage V₁+. The second half output routing circuit 870 has a first output terminal coupled to the positive output terminal (V₂+) of the amplifier circuit 800, a second output terminal coupled to the negative output terminal (V₂−) of the amplifier circuit 800, a third output terminal coupled to the positive end (Vot+) of the output test voltage, and a fourth output terminal coupled to the negative end (Vot−) of the output test voltage.

Figure 8C:
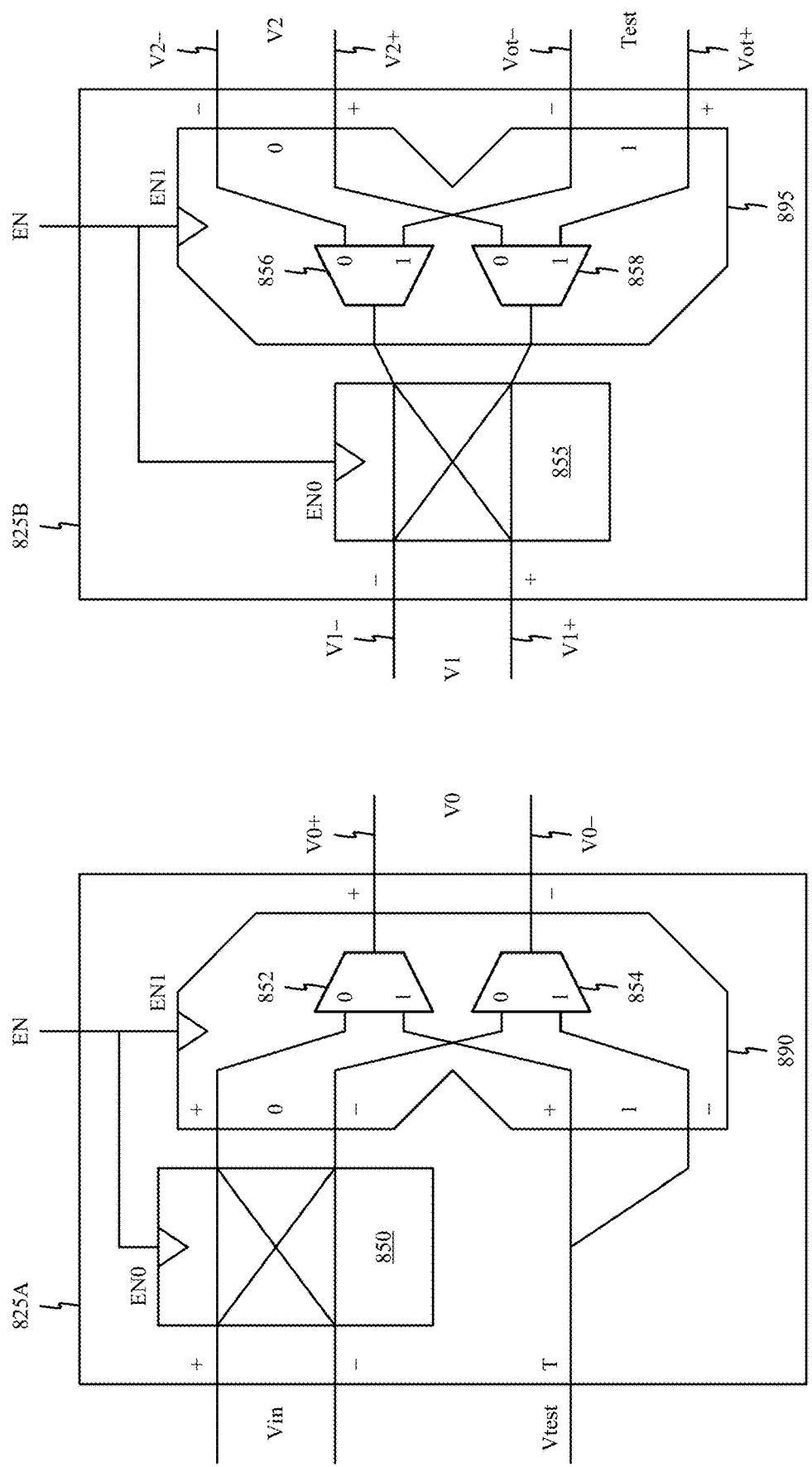
FIG. 8C illustrates a block diagram of an input routing circuit and an output routing circuit using chopper circuits, according to one or more embodiments.

FIG. 8C illustrates a block diagram of an input routing circuit 825A and an output routing circuit 825B using chopper circuits, according to one or more embodiments. The input routing circuit 825A includes an input chopper circuit 850 (e.g., the chopper circuit shown in FIG. 2C) and a two-bit 2-to-1 multiplexer 890. In some embodiments, the input routing circuit 825A may be split into two half input routing circuits. A first half input routing circuit includes a first half input chopper circuit (e.g., including first switch S1 and fourth switch S4 as shown in FIG. 2C) and a first one-bit 2-to-1 multiplexer 852. A second half input routing circuit includes a second half input chopper circuit (e.g., including second switch S2 and third switch S3 as shown in FIG. 2C) and a second one-bit 2-to-1 multiplexer 854. The inputs of the input chopper circuit 850 are connected to the differential input voltage Vin. The outputs of the input chopper circuit 850 are connected to one set of inputs of the two-bit 2-to-1 multiplexer 890 (e.g., inputs corresponding to a select signal having a value of 0). Additionally, a second set of inputs of the two-bit 2-to-1 multiplexer 890 (e.g., inputs corresponding to a select signal having a value of 1) are connected to the test voltage Vtest.

In some embodiments, the input chopper circuit 850 is controlled by a first bit EN0 of a corresponding control signal EN and the two-bit 2-to-1 multiplexer 890 is controlled by a second bit EN1 of the corresponding control signal EN. In this embodiment, when the first bit EN0 of the enable signal EN has a first value, the input chopper circuit 850 propagates the differential input voltage Vin to the first set of inputs of the two-bit 2-to-1 multiplexer 890 without inverting the differential input voltage Vin. Alternatively, when the first bit EN0 of the control signal EN has a second value, the input chopper circuit 850 inverts the differential input voltage Vin and propagates the inverted differential input voltage Vin to the first set of inputs of the two-bit 2-to-1 multiplexer 890. Additionally, in this embodiment, when the second bit EN1 of the control signal EN has a first value, the two-bit 2-to-1 multiplexer 890 propagates the signals received at the first set of inputs to the output of the input routing circuit 825A. Alternatively, when the second bit EN1 of the control signal EN has a second value, the two-bit 2-to-1 multiplexer 890 propagates the signals Vtest received at the second set of inputs to the output of the input routing circuit 825A. That is, when the second bit EN1 of the control signal EN has the second value, the two-bit 2-to-1 multiplexer 890 provides the test voltage to the output of the input routing circuit 825A (e.g., to be used during testing of the transistors of the amplifier circuit).

The output routing circuit 825B includes an output chopper circuit 855 (e.g., the chopper circuit shown in FIG. 2C) and a two-bit 1-to-2 demultiplexer 895. In some embodiments, the output routing circuit 825B may be split into two half output routing circuits. A first half output routing circuit includes a first half output chopper circuit (e.g., including first switch S1 and third switch S3 as shown in FIG. 2C) and a first one-bit 1-to-2 demultiplexer 856. A second half output routing circuit includes a second half output chopper circuit (e.g., including second switch S2 and fourth switch S4 as shown in FIG. 2C) and a second one-bit 1-to-2 demultiplexer 858. The inputs of the output chopper circuit 855 are connected to the differential input voltage V1. The outputs of the output chopper circuit 855 are connected to the inputs of the two-bit 1-to-2 demultiplexer 895. A first set of outputs of the two-bit 1-to-2 demultiplexer 895 (e.g., outputs corresponding to a select signal having a value of 0) are connected to a first output V2 of the output routing circuit 825B and are configured to be connected to the output terminals of the amplifier circuit 800. A second set of outputs of the two-bit 1-to-2 demultiplexer 895 (e.g., outputs corresponding to a select signal having a value of 1) are configured to be connected to the calibration circuit 845.

In some embodiments, the output chopper circuit 855 is controlled by a first bit EN0 of a corresponding control signal EN and the two-bit 1-to-2 demultiplexer 895 is controlled by a second bit EN1 of the corresponding control signal EN. In this embodiment, when the first bit EN0 of the enable signal EN has a first value, the output chopper circuit 850 propagates the differential input voltage V1 to the inputs of the two-bit 1-to-2 demultiplexer 895 without inverting the differential input voltage V1. Alternatively, when the first bit EN0 of the control signal EN has a second value, the output chopper circuit 855 inverts the differential input voltage V1 and propagates the inverted differential input voltage V1 to the inputs of the two-bit 1-to-2 demultiplexer 895. Additionally, in this embodiment, when the second bit EN1 of the control signal EN has a first value, the two-bit 1-to-2 demultiplexer 895 propagates the signals received at the inputs of the two-bit 1-to-2 demultiplexer 895 to the first set of output of the output routing circuit 825B. Alternatively, when the second bit EN1 of the control signal EN has a second value, the two-bit 1-to-2 demultiplexer 895 propagates the signals received at the inputs of the two-bit 1-to-2 demultiplexer 895 to the second set of output of the output routing circuit 825B. Moreover, in some embodiments, when the second bit EN1 of the control signal EN has the first value, the second set of outputs (Vot− and Vot+) of the output routing circuit 825B are controlled to have a high impedance value (e.g., floating) and the first set of outputs (V2− an V2+) are connected to the output of the chopper circuit 855. Alternatively, when the second bit EN1 of the control signal EN has the second value, the first set of outputs (V2− and V2+) of the output routing circuit 825B are controlled to have a high impedance value (e.g., floating) and the second set of outputs (Vot− and Vot+) are connected to the output of the chopper circuit 855.

Figure 8D:
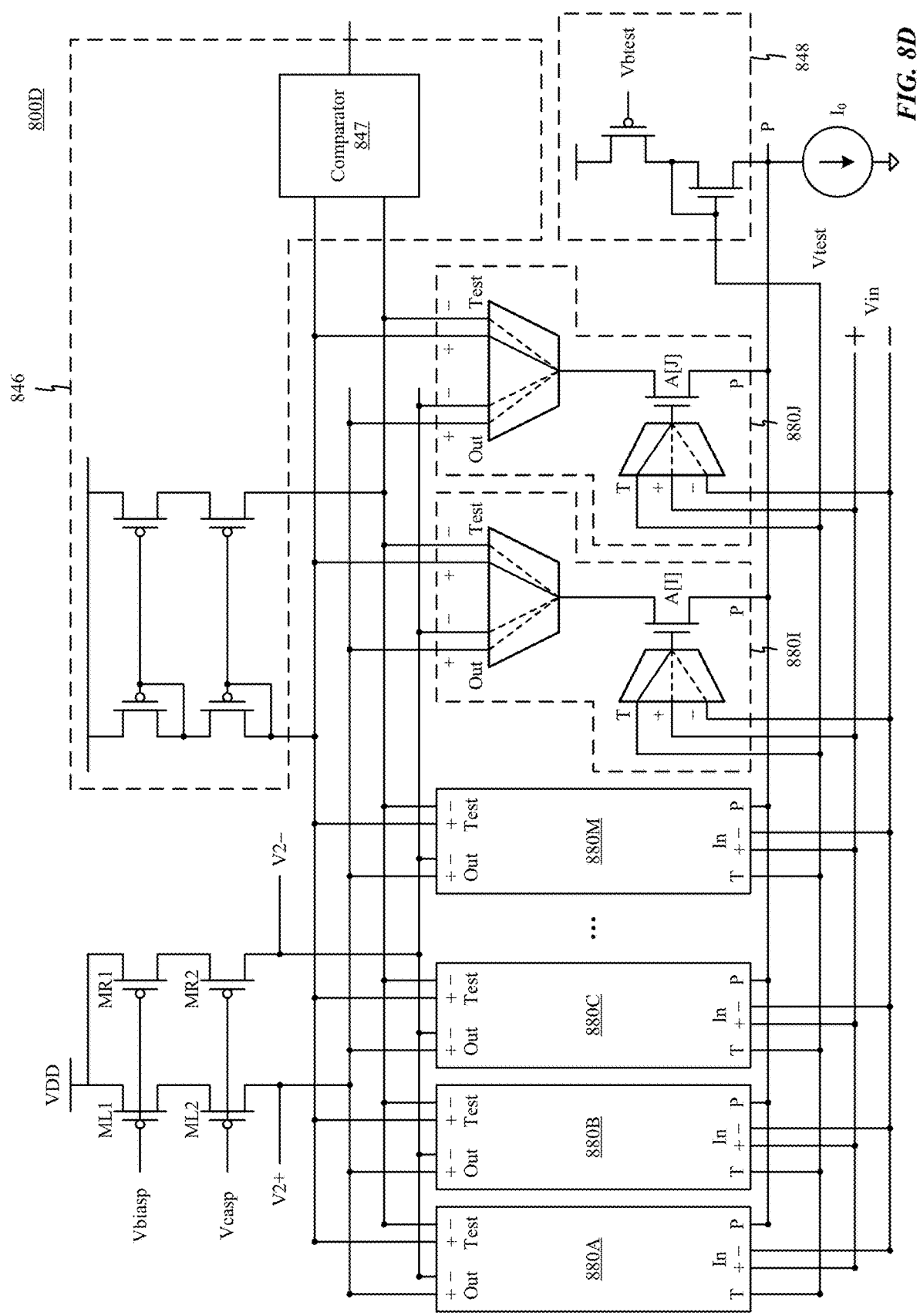
FIG. 8D is a circuit diagram of the amplifier circuit of FIG. 8A implemented using fingers, according to one or more embodiments.

FIG. 8D is a circuit diagram of the amplifier circuit 800 of FIG. 8A implemented using fingers, according to one or more embodiments. Although the circuit diagram is described with regards to a configuration using fingers, other configuration may also be possible. For example, a configuration similar to the amplifier circuit 300B of FIG. 3B or amplifier 300C of FIG. 3C with half input chopper circuits 360 and 365 replaced by half input routing circuits 860 and 865, and half output chopper circuits 370 and 375 replaced by half output routing circuits 870 and 875 is possible. In another example, a configuration similar to the amplifier circuit 500B of FIGS. 5B and 5C with half input chopper circuits 560 and 565 replaced by half input routing circuits 860 and 865, and half output chopper circuits 570 and 575 replaced by half output routing circuits 870 and 875 is also possible.

The amplifier circuit 800D includes a set of fingers 880. In some embodiments, the amplifier circuit 800D includes 2N+2k fingers 880. In other embodiments, the amplifier circuit 800D includes 2N main fingers 880 and 2k (or any other suitable number) of spare fingers 880. In some embodiments, the spare fingers are identical (or substantially similar) to the main fingers. In other embodiments, the spare fingers are different from the main fingers, or are connected in a different configuration than the main fingers. The fingers 880 are described in more detail below in conjunction with FIG. 8E.

Figure 8E:
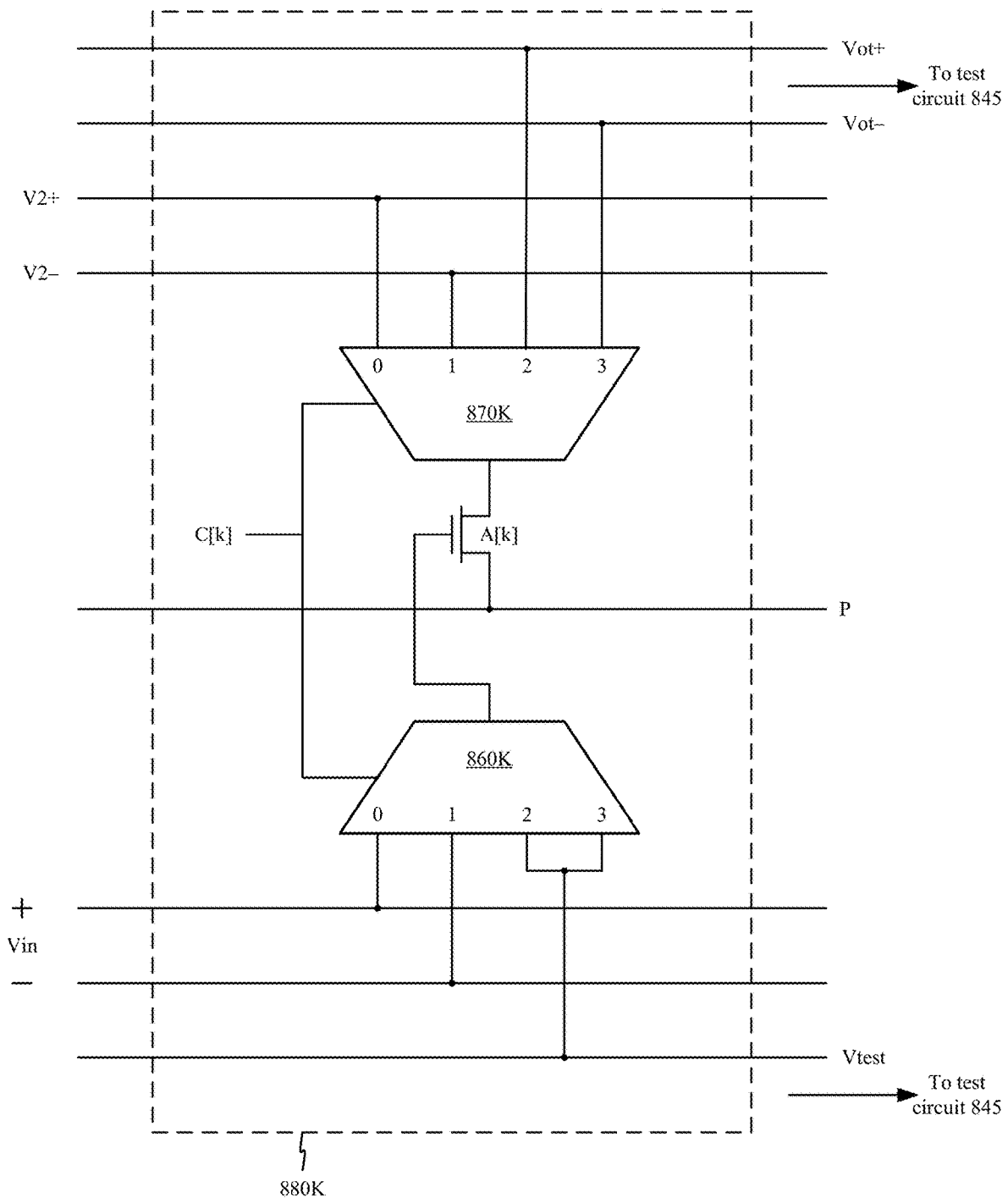
FIG. 8E is a circuit diagram of a finger of the amplifier circuit of FIG. 8D, according to one or more embodiments.

Each finger 880 includes a transistor A, a half input routing circuit 860, and a half output routing circuit 870. For example, FIG. 8E illustrates a finger 880K having a transistor A[k], a half input routing circuit 860K, and a half output routing circuit 870K. Moreover, each finger receives a control signal C for controlling the half input routing circuit 860 and the half output routing circuit 870.

The transistor A has an input terminal (e.g., a gate terminal) coupled to an output of the half input routing circuit 860. Moreover, the transistor A has an output terminal (e.g., a drain terminal) coupled to an input of the half output routing circuit 870. Additionally, the transistor has a third terminal (e.g., a source terminal) coupled to a common node P.

The half input routing circuit 860 includes a first input (e.g., input 0) coupled to the positive input terminal (Vin+) of the amplifier circuit 800D, a second input (e.g., input 1) coupled to the negative input terminal (Vin−) of the amplifier circuit 800D, and a third input terminal (e.g., input 2) coupled to an output of the test circuit 845 providing the test voltage Vtest. In some embodiments, the half input routing circuit 860 further includes a fourth input terminal (e.g., input 3) coupled to the output of the test circuit 845 providing the test voltage Vtest. In other embodiments, the fourth input terminal of the half input routing circuit 860 is coupled to a second output of the test circuit 845 providing a bias voltage to turn off the transistor A.

The half output routing circuit 870 includes a first output (e.g., output 0) coupled to a positive output terminal (V2+) of the amplifier circuit 800D, a second output terminal (e.g., output 1) coupled to a negative output terminal (V2−) of the amplifier circuit 800D, a third output terminal (e.g., output 2) coupled to a positive input terminal of the test circuit 845, and a fourth output terminal (e.g., output 3) coupled to a negative input terminal of the test circuit 845. In some embodiments, other configurations are possible. For example, the first output terminal of the half output routing circuit 870 may be coupled to the negative output terminal (V2−) of the amplifier circuit 800D, the second output terminal of the half output routing circuit 870 may be coupled to the positive output terminal (V2+) of the amplifier circuit 800D, the third output terminal of the half output routing circuit 870 may be coupled to the negative input terminal of the test circuit 845, and the fourth output terminal of the half output routing circuit 870 may be coupled to the positive input terminal of the test circuit 845.

In some embodiments, the main fingers of the amplifier circuit 800D and the spare fingers of the amplifier circuit 800D are identical (or substantially similar). In this embodiment, the controller 840 is able to select which fingers will be controlled as main fingers, and which fingers will be controlled as spare fingers. During an offset calibration process, the spare fingers are used to temporarily replace one or more main fingers while the replaced main fingers are being tested.

In other embodiments, the main fingers of the amplifier circuit 800D are different from the spare fingers of the amplifier circuit 800D. For example, in this embodiment, instead of connecting the half output routing circuit 870 of spare fingers to the calibration circuit 845, the third and fourth outputs of the half output routing circuit 870 are left floating. Alternatively, the half output routing circuit 870 of the spare fingers may be implemented to only have two outputs. For example, in some embodiments, the spare fingers are implemented in a similar manner to the fingers 380 shown in FIG. 3E.

Figure 8F:
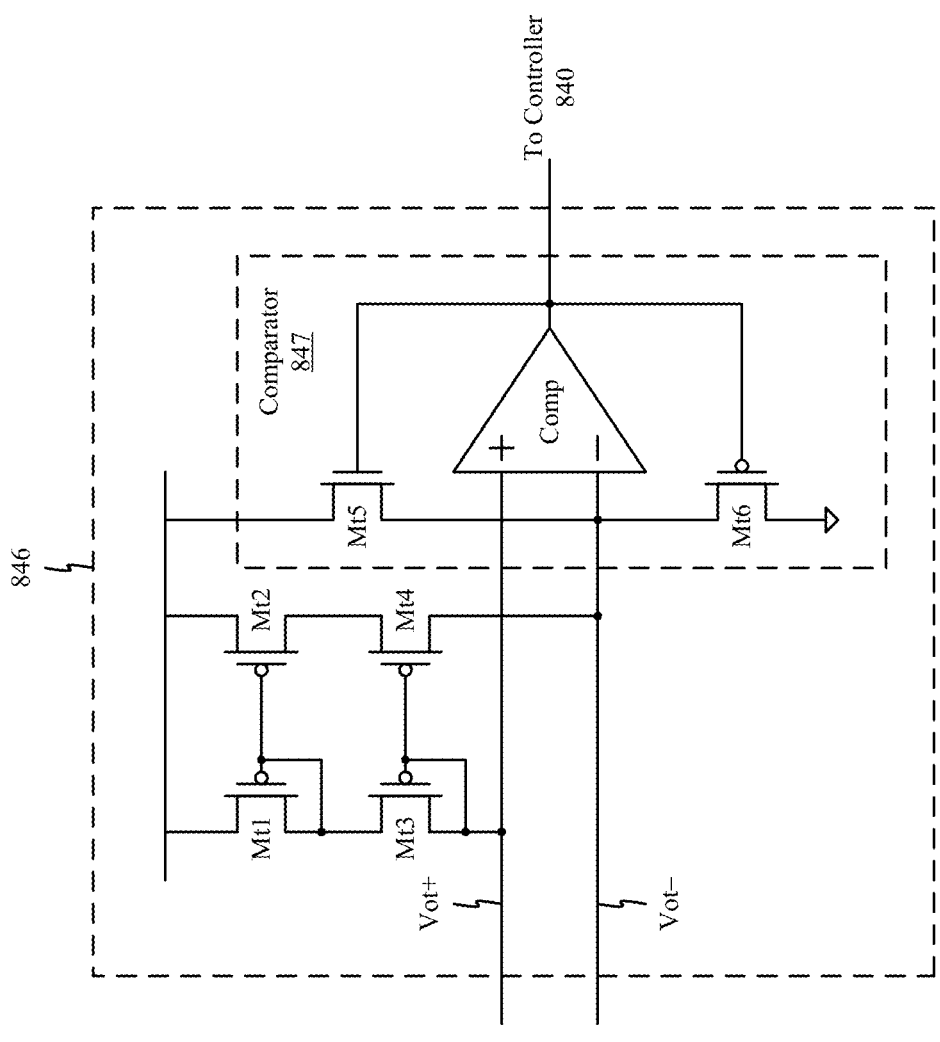
FIG. 8F is a circuit diagram of the calibration circuit, including the calibration input circuit and the calibration output circuit, according to one or more embodiments.
Figure 8F:
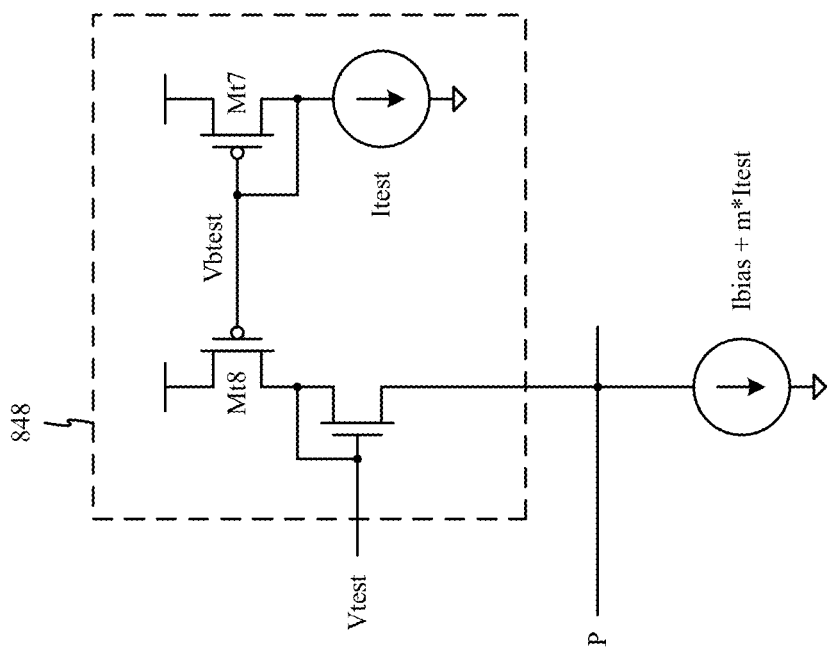

FIG. 8F is a circuit diagram of the calibration circuit, including the calibration input circuit and the calibration output circuit, according to one or more embodiments. The calibration circuit 845 includes a calibration output circuit 846 and a calibration input circuit 848. The calibration output circuit 846 receives the compares the outputs of two or more transistors and determines which output is larger. The calibration input circuit 848 generates the test voltage Vtest for testing the transistors of the differential amplifier 830

The calibration output circuit 846 includes biasing transistors (e.g., transistors Mt1 through Mt4) for biasing the transistors under test. The biasing transistors include left biasing transistors (transistors Mt1 and Mt3) for biasing transistors under test coupled to the positive input terminal Vot+ of the calibration circuit 845, and right biasing transistors (transistors Mt2 and Mt4) for biasing transistors under test coupled to the negative input terminal Vot− of the calibration circuit 845.

The calibration output circuit 846 further includes a comparator 847. In some embodiments, comparator 847 has a first input terminal coupled to the positive input terminal Vot+ of the calibration circuit 845, and a second input terminal coupled to the negative input terminal Vot− of the calibration circuit 845. In other embodiments, the positive input terminal or the negative input terminal may be coupled to a reference voltage that is adjusted depending on an input common mode range. In some embodiments, the calibration output circuit 846 further includes a feedback loop (e.g., using transistors Mt5 and Mt6). In other embodiments, other implementations of a comparator 847 may be used. In some embodiments, the output of the comparator is connected to additional components such as additional logic or an amplifier to further process the output of the comparator before being provided to the controller 840.

When the output terminal of a transistor A of a first finger 880 is connected to the positive input terminal Vot+ of the calibration circuit 845 and the output terminal of a second transistor A of a second finger 880 is connected to the negative input terminal Vot− of the calibration circuit 845, the comparator 847 generates an output signal indicative of which transistor has a larger threshold voltage. For example, if the transistor of the first finger has a threshold voltage that is larger than the threshold voltage of the transistor of the second finger, the comparator 847 generates a signal having a first value. Alternatively, if the transistor of the second finger has a threshold voltage that is larger than the threshold voltage of the transistor of the first finger, the comparator 847 generates a signal having a second value.

Moreover, the comparator 847 can be configured to compare threshold voltage offsets between pairs of transistors. For example, the comparator 847 may be used to compare the threshold voltage offset between a first transistor of a first transistor pair and a second transistor of the first transistor pair, to the threshold voltage offset between a first transistor of a second transistor pair and a second transistor of the second transistor pair. To compare threshold voltage offsets, the output terminals of the first transistor of the first transistor pair and the second transistor of the second transistor pair are connected to the positive input terminal Vot+ of the calibration circuit 845, and the output terminals of the second transistor of the first transistor pair and the first transistor of the second transistor pair are connected to the negative input terminal Vot− of the calibration circuit 845.

In some embodiments, the output of the comparator 847 is coupled to the controller 840. The controller 840 receives the signal indicative of the comparison between threshold voltage of two transistors, or indicative of the comparison between threshold voltage offsets of transistor pairs and determines an order for each of the fingers of the amplifier circuit 800. The process for calibrating the amplifier circuit and determining an order for each of the fingers is described in more detail below in conjunction with FIGS. 9 and 10.

The calibration input circuit 848 generates the test voltage Vtest. The calibration input circuit 848 may include a test current Itest, and a current mirror (including transistors Mt7 and Mt8). In other embodiments, other architectures for generating a reference voltage may be used instead. In some embodiments, the test voltage Vtest may be generated to bias transistor in the sub-threshold region of operation to use the exponential nature of the transistor current in the sub-threshold region of operation to achieve an increased granularity in the calibration operation and to reduce the sensitivity of the process to the offset of transistors Mt1 through Mt4.

Figure 9:
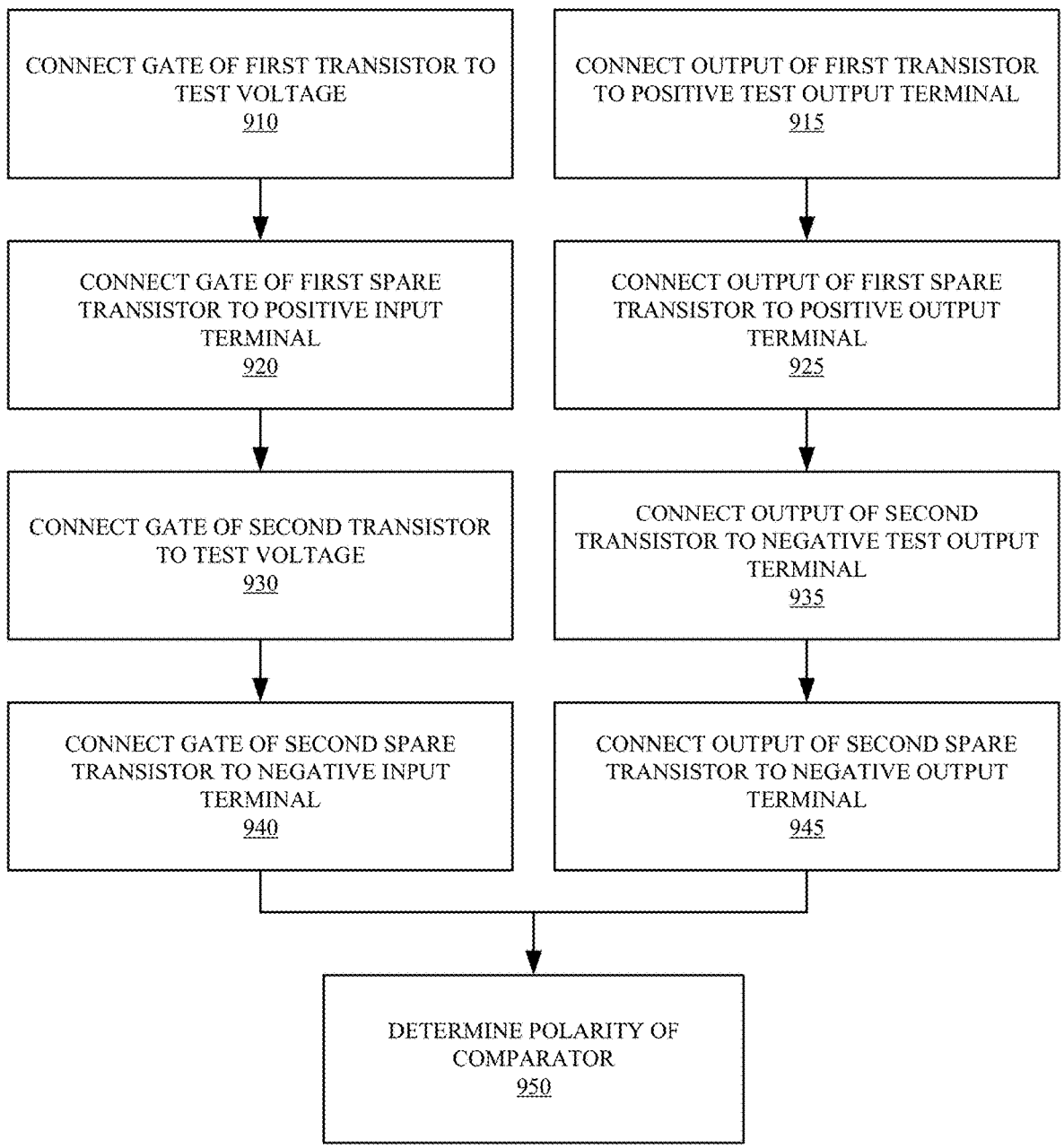
FIG. 9 is a flowchart illustrating a process for comparing threshold voltages of two transistors, according to one or more embodiments.

FIG. 9 is a flowchart illustrating a process for comparing threshold voltages of two transistors, according to one or more embodiments. The controller 840 connects 910 the gate of a first transistor A[i] to the test voltage Vtest. In some embodiments, the controller 840 controls the half input routing circuit 860 corresponding to the first transistor A[i] to connect the gate of the first transistor A[i] to the output of the calibration input circuit 848.

The controller 840 connects 915 the output of the first transistor A[i] to the positive input terminal Vot+ of the calibration circuit 845. In some embodiments, the controller 840 controls the half output routing circuit 870 corresponding to the first transistor A[i] to connect the output of the first transistor A[i] to the positive input terminal Vot+ of the calibration circuit 845.

The controller 840 connects 920 the gate of a first spare transistor A[N+1] to the positive input terminal Vin+ of the amplifier circuit 800. In some embodiments, the controller 840 controls the half input routing circuit 860 corresponding to the first spare transistor A[N+1] to connect the gate of the first spare transistor A[N+1] to the positive input terminal Vin+ of the amplifier circuit 800.

The controller 840 connects 925 the output of the first spare transistor A[N+1] to the positive output terminal V2+ of the amplifier circuit 800. In some embodiments, the controller 840 controls the half output routing circuit 870 corresponding to the first spare transistor A[N+1] to connect the output of the first spare transistor A[N+1] to the positive output terminal V2+ of the amplifier circuit 800.

The controller 840 connects 930 the gate of a second transistor A[k] to the test voltage Vtest. In some embodiments, the controller 840 controls the half input routing circuit 860 corresponding to the second transistor A[k] to connect the gate of the second transistor A[k] to the output of the calibration input circuit 848.

The controller 840 connects 935 the output of the second transistor A[k] to the negative input terminal Vot− of the calibration circuit 845. In some embodiments, the controller 840 controls the half output routing circuit 870 corresponding to the second transistor A[k] to connect the output of the second transistor A[k] to the negative input terminal Vot− of the calibration circuit 845.

The controller 840 connects 940 the gate of a second spare transistor A[N+2] to the negative input terminal Vin− of the amplifier circuit 800. In some embodiments, the controller 840 controls the half input routing circuit 860 corresponding to the second spare transistor A[N+2] to connect the gate of the second spare transistor A[N+2] to the negative input terminal Vin− of the amplifier circuit 800.

The controller 840 connects 945 the output of the second spare transistor A[N+2] to the negative output terminal V2− of the amplifier circuit 800. In some embodiments, the controller 840 controls the half output routing circuit 870 corresponding to the second spare transistor A[N+2] to connect the output of the second spare transistor A[N+2] to the negative output terminal V2− of the amplifier circuit 800.

The controller 840 then determines 950 the polarity of the output of the comparator 847 of the calibration output circuit 846. Based on the polarity of the comparator 847 of the calibration output circuit 846, the controller 840 determines which transistor has a larger threshold voltage. For example, if the output of the calibration output circuit 846 has a first value (e.g., HI), the controller 840 determines that the threshold voltage of the first transistor A[i] is larger than threshold voltage of the second transistor A[k]. Conversely, if the output of the calibration output circuit 846 has a second value (e.g., LO), the controller 840 determines that the threshold voltage of the second transistor A[k] is larger than the threshold voltage of the first transistor A[i]. Based on these comparisons, the controller 840 is able to sort the array of transistors A[1:2N] (or A[1:2N+2k]) based on their respective threshold voltages.

The process for comparing threshold voltage of two transistors for pairing the transistors in a differential amplifier may be used in calibrating an amplifier circuit having distributed chopper circuits as shown in FIG. 2A, 3A or 5A. For amplifier circuits having distributed chopper circuits, the paired transistors are further compared with each other as described below in conjunction with FIG. 10 to sort the paired transistors. Alternatively, the process for comparing threshold voltage of two transistors for pairing the transistors in a differential amplifier may be used in calibrating an amplifier circuit without the distributed chopper circuits. In this implementation, the pairing of the transistors is performed to reduce the offset between the positive and negative input terminals of the amplifier circuit. In this implementation, since the chopping process shown in FIG. 2B is not executed, the transistor pairs may be operated without being sorted.

Figure 10:
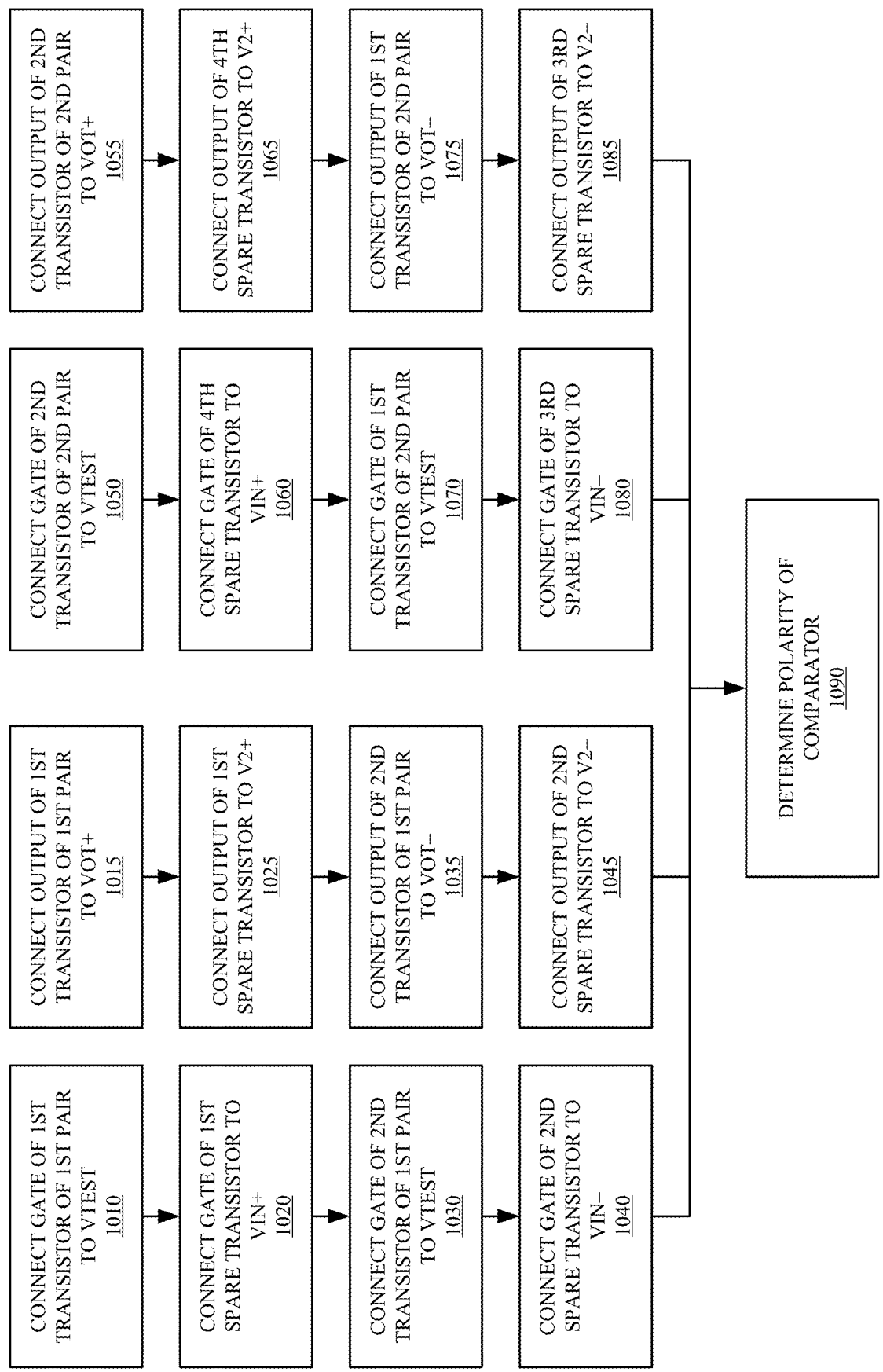
FIG. 10 is a flowchart illustrating a process for comparing threshold voltage offsets between two transistor pairs, according to one or more embodiments.

FIG. 10 is a flowchart illustrating a process for comparing threshold voltage offsets between two transistor pairs, according to one or more embodiments. For example, the process of FIG. 10 may be used for comparing the threshold offset between a first transistor pair including transistor B[i] and B[i+1], and a second transistor pair including transistor B[k] and B[k+1].

The controller 840 connects 1010 the gate of a first transistor B[i] of the first transistor pair to the test voltage Vtest. In some embodiments, the controller 840 controls the half input routing circuit 860 corresponding to the first transistor B[i] of the first transistor pair to connect the gate of the first transistor B[i] of the first transistor pair to the output of the calibration input circuit 848.

The controller 840 connects 1015 the output of the first transistor B[i] of the first transistor pair to the positive input terminal Vot+ of the calibration circuit 845. In some embodiments, the controller 840 controls the half output routing circuit 870 corresponding to the first transistor B[i] of the first transistor pair to connect the output of the first transistor B[i] of the first transistor pair to the positive input terminal Vot+ of the calibration circuit 845.

The controller 840 connects 1020 the gate of a first spare transistor A[N+1] to the positive input terminal Vin+ of the amplifier circuit 800. In some embodiments, the controller 840 controls the half input routing circuit 860 corresponding to the first spare transistor A[N+1] to connect the gate of the first spare transistor A[N+1] to the positive input terminal Vin+ of the amplifier circuit 800.

The controller 840 connects 1025 the output of the first spare transistor A[N+1] to the positive output terminal V2+ of the amplifier circuit 800. In some embodiments, the controller 840 controls the half output routing circuit 870 corresponding to the first spare transistor A[N+1] to connect the output of the first spare transistor A[N+1] to the positive output terminal V2+ of the amplifier circuit 800.

The controller 840 connects 1030 the gate of a second transistor B[i+1] of the first transistor pair to the test voltage Vtest. In some embodiments, the controller 840 controls the half input routing circuit 860 corresponding to the second transistor B[i+1] of the first transistor pair to connect the gate of the second transistor B[i+1] of the first transistor pair to the output of the calibration input circuit 848.

The controller 840 connects 1035 the output of the second transistor B[i+1] of the first transistor pair to the negative input terminal Vot− of the calibration circuit 845. In some embodiments, the controller 840 controls the half output routing circuit 870 corresponding to the second transistor B[i+1] of the first transistor pair to connect the output of the second transistor B[i+1] of the first transistor pair to the negative input terminal Vot− of the calibration circuit 845.

The controller 840 connects 1040 the gate of a second spare transistor A[N+2] to the negative input terminal Vin− of the amplifier circuit 800. In some embodiments, the controller 840 controls the half input routing circuit 860 corresponding to the second spare transistor A[N+2] to connect the gate of the second spare transistor A[N+2] to the negative input terminal Vin− of the amplifier circuit 800.

The controller 840 connects 1045 the output of the second spare transistor A[N+2] to the negative output terminal V2− of the amplifier circuit 800. In some embodiments, the controller 840 controls the half output routing circuit 870 corresponding to the second spare transistor A[N+2] to connect the output of the second spare transistor A[N+2] to the negative output terminal V2− of the amplifier circuit 800.

The controller 840 connects 1050 the gate of a second transistor B[k+1] of the second transistor pair to the test voltage Vtest. In some embodiments, the controller 840 controls the half input routing circuit 860 corresponding to the second transistor B[k+1] of the second transistor pair to connect the gate of the second transistor B[k+1] of the second transistor pair to the output of the calibration input circuit 848.

The controller 840 connects 1055 the output of the second transistor B[k+1] of the second transistor pair to the positive input terminal Vot+ of the calibration circuit 845. In some embodiments, the controller 840 controls the half output routing circuit 870 corresponding to the second transistor B[k+1] of the second transistor pair to connect the output of the second transistor B[k+1] of the second transistor pair to the positive input terminal Vot+ of the calibration circuit 845.

The controller 840 connects 1060 the gate of a fourth spare transistor A[N+4] to the positive input terminal Vin+ of the amplifier circuit 800. In some embodiments, the controller 840 controls the half input routing circuit 860 corresponding to the fourth spare transistor A[N+4] to connect the gate of the fourth spare transistor A[N+4] to the positive input terminal Vin+ of the amplifier circuit 800.

The controller 840 connects 1065 the output of the fourth spare transistor A[N+4] to the positive output terminal V2+ of the amplifier circuit 800. In some embodiments, the controller 840 controls the half output routing circuit 870 corresponding to the fourth spare transistor A[N+4] to connect the output of the fourth spare transistor A[N+4] to the positive output terminal V2+ of the amplifier circuit 800.

The controller 840 connects 1070 the gate of a first transistor B[k] of the second transistor pair to the test voltage Vtest. In some embodiments, the controller 840 controls the half input routing circuit 860 corresponding to the first transistor B[k] of the second transistor pair to connect the gate of the first transistor B[k] of the second transistor pair to the output of the calibration input circuit 848.

The controller 840 connects 1075 the output of the first transistor B[k] of the second transistor pair to the negative input terminal Vot− of the calibration circuit 845. In some embodiments, the controller 840 controls the half output routing circuit 870 corresponding to the first transistor B[k] of the second transistor pair to connect the output of the first transistor B[k] of the second transistor pair to the negative input terminal Vot− of the calibration circuit 845.

The controller 840 connects 1080 the gate of a third spare transistor A[N+3] to the negative input terminal Vin− of the amplifier circuit 800. In some embodiments, the controller 840 controls the half input routing circuit 860 corresponding to the third spare transistor A[N+3] to connect the gate of the third spare transistor A[N+3] to the negative input terminal Vin− of the amplifier circuit 800.

The controller 840 connects 1045 the output of the third spare transistor A[N+3] to the negative output terminal V2− of the amplifier circuit 800. In some embodiments, the controller 840 controls the half output routing circuit 870 corresponding to the third spare transistor A[N+3] to connect the output of the third spare transistor A[N+3] to the negative output terminal V2− of the amplifier circuit 800.

The controller 840 then determines 1090 the polarity of the output of the comparator 847 of the calibration output circuit 846. Based on the polarity of the comparator 847 of the calibration output circuit 846, the controller 840 determines which transistor pair has a larger threshold voltage offset. For example, if the output of the calibration output circuit 846 has a first value (e.g., HI), the controller 840 determines that the threshold voltage offset of the first transistor pair is larger than threshold voltage offset of the second transistor pair. Conversely, if the output of the calibration output circuit 846 has a second value (e.g., LO), the controller 840 determines that the threshold voltage offset of the second transistor pair is larger than the threshold voltage offset of the first transistor pair.

By using four spare transistors A[2N+1] through A[2N+4], the threshold voltage of each transistor A[1] through A[2N], as well as the threshold voltage offsets of each transistor pair of the amplifier circuit 800 can be tested without disrupting the operation of the amplifier circuit 800.

In some embodiments, the controller 840 adjusts the current source $I_0$ when comparing transistors of the amplifier circuit. For example, when the calibration input circuit 848 is activated, the controller 840 increases the current source $I_0$ by a multiple of the test current Itest to account for an amount of current being consumed by additional transistors being used during the testing. That is, when comparing the threshold voltage of two transistors, the current source $I_0$ is increased by twice the test voltage Itest. When comparing pairs of transistors, the current source $I_0$ is increased by four times the test voltage Itest.

Amplifier Dynamic Offset Calibration in Time Domain

Figure 11A:
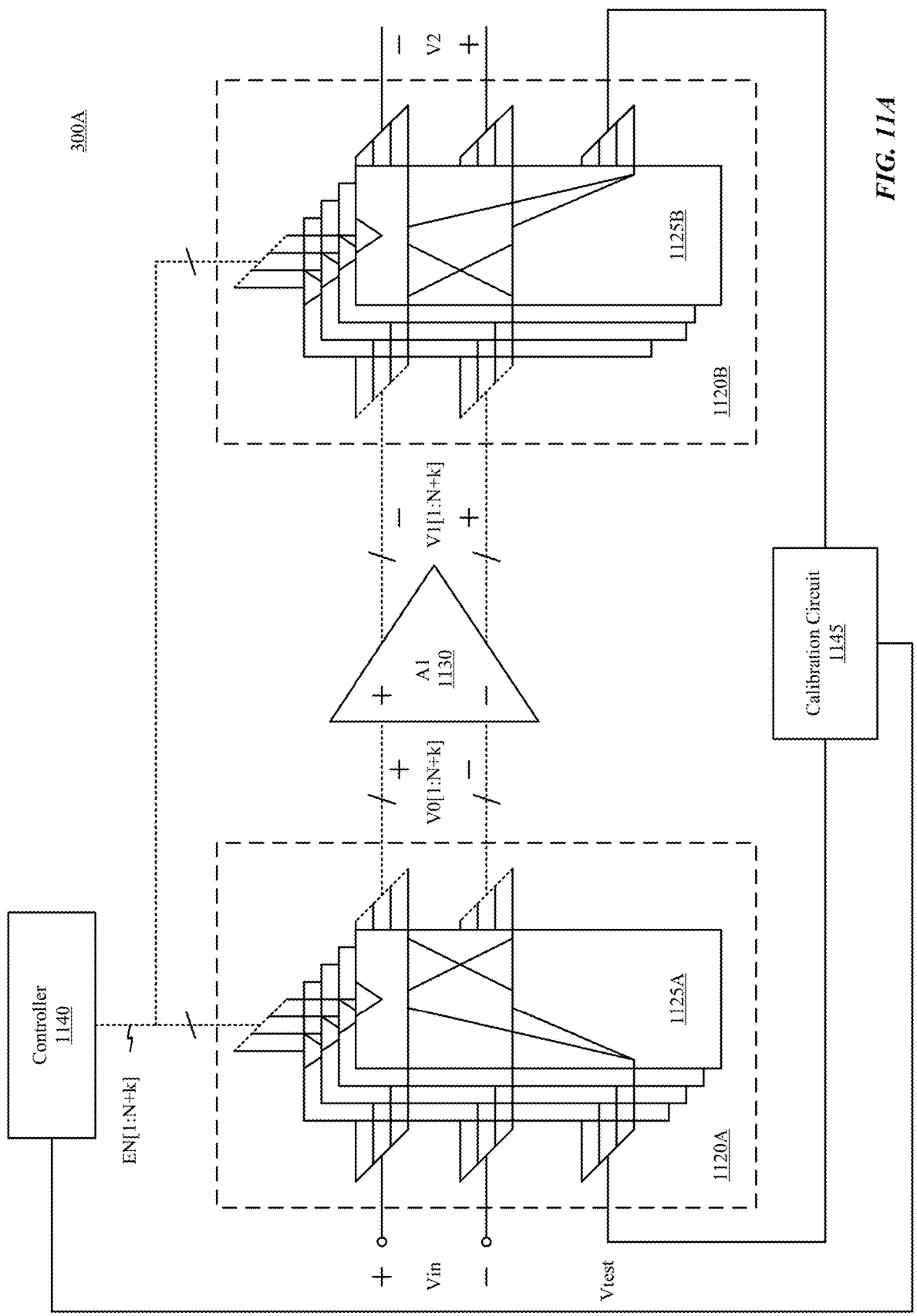
FIG. 11A is a block diagram of an amplifier circuit having a calibration circuit for dynamically calibrating the amplifier offset using time domain comparisons, according to one or more embodiments.

FIG. 11A is a block diagram of an amplifier circuit 1100A having a calibration circuit for dynamically calibrating the amplifier offset using time domain comparisons, according to one or more embodiments. The amplifier circuit 1100A includes a differential amplifier 1130 having a gain A1, a set of input routing circuits 1120A having multiple input routing circuits 1125A, a set of output routing circuits 1120B having multiple output routing circuits 1125B. In the diagram of FIG. 11A, the dotted connections denote a parallel connection including multiple signals being routed in parallel.

In contrast to the amplifier circuit 800A of FIG. 8A, the calibration circuit 1145 receives a single input from the set of output routing circuits 820B. Moreover, the output routing circuits 825B of the amplifier circuit 1100A of FIG. 11A have three outputs.

Figure 11B:
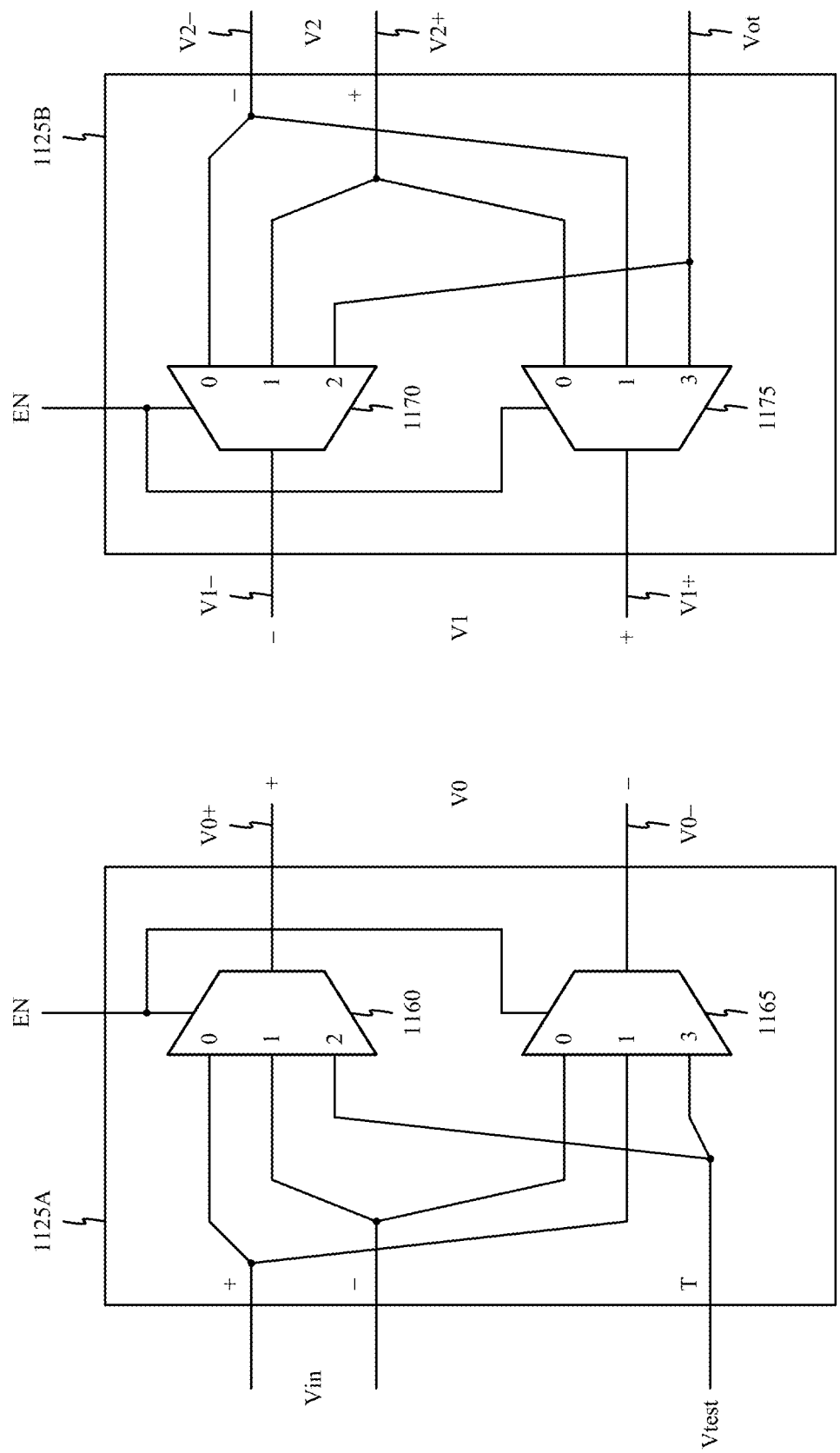
FIG. 11B illustrates a block diagram of an input routing circuit and an output routing circuit, according to one or more embodiments.

FIG. 11B illustrates a block diagram of an input routing circuit 1125A and an output routing circuit 1125B, according to one or more embodiments. The input routing circuit 1125A includes a first half input routing circuit 1160 and a second half input routing circuit 1165. In the embodiment of FIG. 11B, the first half input routing circuit 1160 and the second half input routing circuit 1165 are multiplexers (e.g., a 3-to-1 multiplexer or a 4-to-1 multiplexer).

The first half input routing circuit 1160 has a first input terminal coupled to positive end (Vin+) of the input voltage Vin, a second input terminal coupled to the negative end (Vin−) of the input voltage Vin, and a third input terminal coupled to the test voltage Vtest. The second half input routing circuit 1165 has a first input terminal coupled to negative end (Vin−) of the input voltage Vin, a second input terminal coupled to the positive end (Vin+) of the input voltage Vin, and a third input terminal coupled to the test voltage Vtest.

In some embodiments, the input routing circuit 1125A receives a control signal EN having at least two bits (including bits EN0 and EN1). When the control signal EN has a first value (e.g., 00), the input routing circuit 1125A connects the first input terminal Vin+ to the first output terminal V0+ and connects the second input terminal Vin− to the second output terminal V0−. When the control signal EN has a second value (e.g., 01), the input routing circuit 1125A connects the first input terminal Vin+ to the second output terminal V0− and connects the second input terminal Vin− to the first output terminal V0+. Moreover, when the control signal EN has a third value (e.g., 10), the input routing circuit 1125A connects the third input terminal Vtest to the first output terminal V0+. When the control signal EN has a fourth value (e.g., 11), the input routing circuit 1125A connects the third input terminal Vtest to the second output terminal V0−.

In some embodiments, the input routing circuit 1125A receives a control signal EN having at least three bits (including bits EN0, EN1, and EN2, or including bits EN0, TST_P, and TST_N). In some embodiments, the control signal EN additionally includes the inverse of the EN0 signal ($\overline{EN0}$). When the control signal EN has a first value (e.g., 000), the input routing circuit 1125A connects the first input terminal Vin+ to the first output terminal V0+ and connects the second input terminal Vin− to the second output terminal V0−. When the control signal EN has a second value (e.g., 001), the input routing circuit 1125A connects the first input terminal Vin+ to the second output terminal V0− and connects the second input terminal Vin− to the first output terminal V0+. Moreover, when the control signal EN has a third value or a fourth value (e.g., 010 or 011), the input routing circuit 1125A connects the third input terminal Vtest to the first output terminal V0+. Additionally, when the control signal EN has the third value (e.g., 010), the input routing circuit 1125A connects the second input terminal Vin− to the second output terminal V0−, and when the control signal EN has the fourth value (e.g., 011), the input routing circuit 1125A connects the first input terminal Vin+ to the second output terminal V0−. Alternatively, When the control signal EN has a fifth value or a sixth value (e.g., 100 or 101), the input routing circuit 1125A connects the third input terminal Vtest to the second output terminal V0−. Additionally, when the control signal EN has the fifth value (e.g., 100), the input routing circuit 1125A connects the first input terminal Vin+ to the first output terminal V0+, and when the control signal EN has the sixth value (e.g., 101), the input routing circuit 1125A connects the second input terminal Vin− to the first output terminal V0+.

The output routing circuit 1125B includes a first half output routing circuit 1170 and a second half output routing circuit 1175. In the embodiment of FIG. 11B, the first output routing circuit 1170 and the second output routing circuit 1175 are demultiplexers (e.g., a 1-to-3 demultiplexer).

The first half output routing circuit 1170 has an input terminal coupled to the negative end (V1−) of the output of the differential amplifier 1130. Moreover, the first half output routing circuit 1170 has a first output terminal coupled to negative end (V2−) of the output voltage V2, a second output terminal coupled to the positive end (V2+) of the output voltage V2, and a third output terminal coupled to the input terminal of the calibration circuit 1145. The second half output routing circuit 1175 has an input terminal coupled to the positive end (V1+) of the output of the differential amplifier 1130. Moreover, the second half output routing circuit 1175 has a first output terminal coupled to positive end (V2+) of the output voltage V2, a second output terminal coupled to the negative end (V2−) of the output voltage V2, and a third output terminal coupled to the input terminal of the calibration circuit 1145.

In some embodiments, the output routing circuit 1125B receives a control signal EN having at least two bits (including bits EN0 and EN1). When the control signal EN has a first value (e.g., 00), the output routing circuit 1125B connects the first input terminal V1− to the first output terminal V2− and connects the second input terminal V1+ to the second output terminal V2+. When the control signal EN has a second value (e.g., 01), the output routing circuit 1125B connects the first input terminal V1− to the second output terminal V2+ and connects the second input terminal V1+ to the first output terminal V2−. Moreover, when the control signal EN has a third value (e.g., 10), the output routing circuit 1125B connects the first output terminal V1− to the third output terminal Vot. When the control signal EN has a fourth value (e.g., 11), the output routing circuit 1125B connects the second output terminal V1+ to the third output terminal Vot.

In some embodiments, the output routing circuit 1125B receives a control signal EN having at least three bits (including bits EN0, EN1, and EN2, or including bits EN0, TST_P, and TST_N). In some embodiments, the control signal EN additionally includes the inverse of the EN0 signal ($\overline{EN0}$). When the control signal EN has a first value (e.g., 000), the output routing circuit 1125B connects the first input terminal V1− to the first output terminal V2− and connects the second input terminal V1+ to the second output terminal $V_2$+. When the control signal EN has a second value (e.g., 001), the output routing circuit 1125B connects the first input terminal V1− to the second output terminal V2+ and connects the second input terminal V1+ to the first output terminal V2−. Moreover, when the control signal EN has a third value or a fourth value (e.g., 010 or 011), the output routing circuit 1125B connects the first input terminal V1− to the third output terminal Vot. Additionally, when the control signal EN has the third value (e.g., 010), the output routing circuit 1125B connects the second input terminal V1+ to the second output terminal V2+, and when the control signal EN has the fourth value (e.g., 011), the output routing circuit 1125B connects the first input terminal V1− to the second output terminal V2+. Alternatively, When the control signal EN has a fifth value or a sixth value (e.g., 100 or 101), the output routing circuit 1125B connects the second input terminal V1+ to the third output terminal Vot. Additionally, when the control signal EN has the fifth value (e.g., 100), the output routing circuit 1125B connects the first input terminal V1− to the first output terminal V2−, and when the control signal EN has the sixth value (e.g., 101), the output routing circuit 1125B connects the second input terminal V1+ to the first output terminal V2−.

Figure 11C:
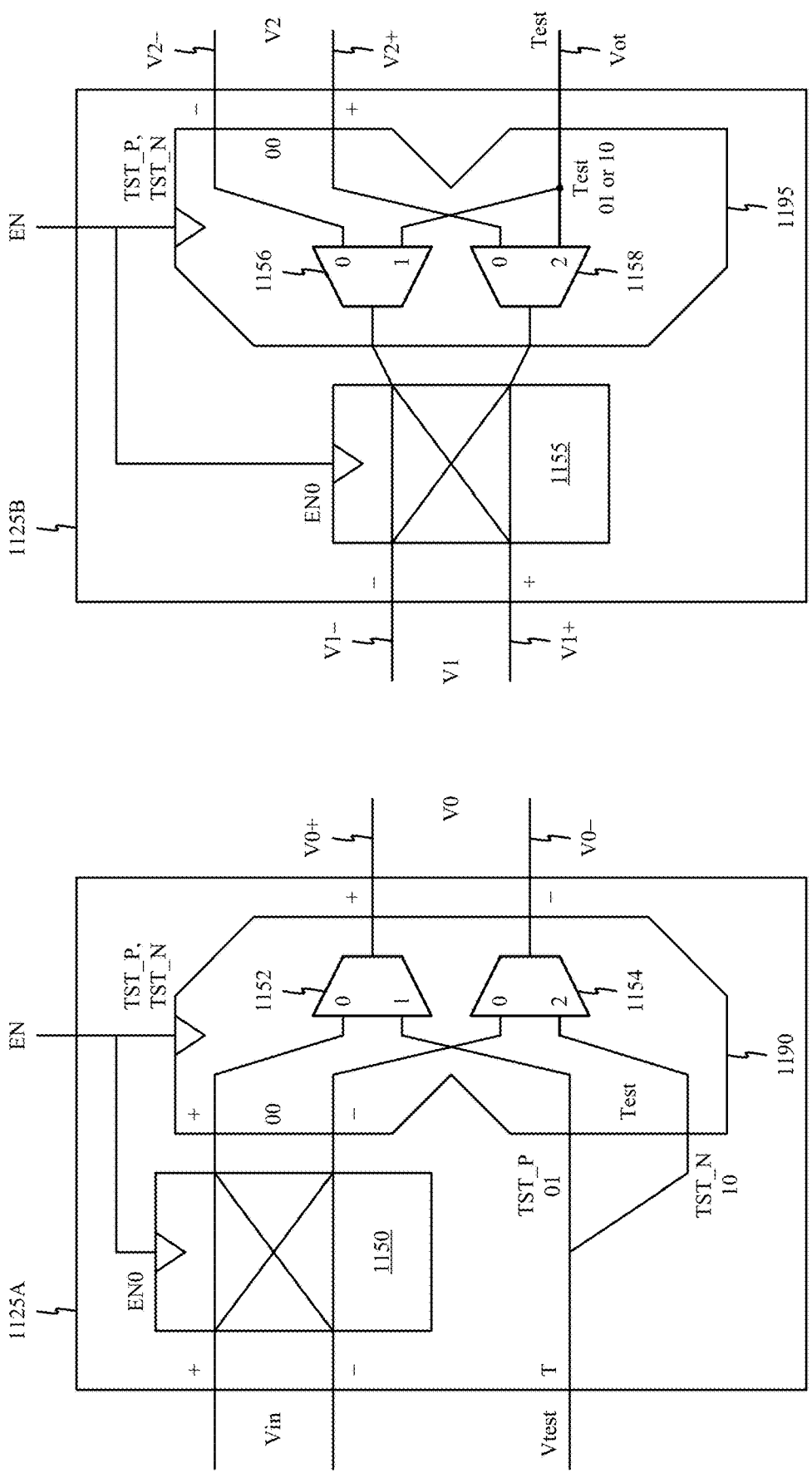
FIG. 11C illustrates a block diagram of an input routing circuit and an output routing circuit using chopper circuits, according to one or more embodiments.

FIG. 11C illustrates a block diagram of an input routing circuit 1125A and an output routing circuit 1125B using chopper circuits, according to one or more embodiments.

The input routing circuit 1125A includes an input chopper circuit 1150 (e.g., the chopper circuit shown in FIG. 2C) and a two-bit 2-to-1 multiplexer 1190. In some embodiments, the input routing circuit 1125A may be split into two half input routing circuits. A first half input routing circuit includes a first half input chopper circuit (e.g., including first switch S1 and fourth switch S4 as shown in FIG. 2C) and a first one-bit 2-to-1 multiplexer 1152. A second half input routing circuit includes a second half input chopper circuit (e.g., including second switch S2 and third switch S3 as shown in FIG. 2C) and a second one-bit 2-to-1 multiplexer 1154. The inputs of the input chopper circuit 1150 are connected to the differential input voltage Vin. The outputs of the input chopper circuit 1150 are connected to one set of inputs of the two-bit 2-to-1 multiplexer 1190 (e.g., inputs corresponding to a select signal having a value of 00 indicating neither end is in calibration mode). Additionally, a second set of inputs of the two-bit 2-to-1 multiplexer 1190 (e.g., inputs corresponding to a select signal having a value of 01 or 10 indicating that at least one end is in calibration mode) are connected to the test voltage Vtest.

In some embodiments, the input chopper circuit 1150 is controlled by a first bit EN0 of a corresponding control signal EN and the two-bit 2-to-1 multiplexer 1190 is controlled by a second bit EN1 or TST_P and a third bit EN2 or TST_N of the corresponding control signal EN. In this embodiment, when the first bit EN0 of the enable signal EN has a first value, the input chopper circuit 1150 propagates the differential input voltage Vin to the first set of inputs of the two-bit 2-to-1 multiplexer 1190 without inverting the differential input voltage Vin. Alternatively, when the first bit EN0 of the control signal EN has a second value, the input chopper circuit 1150 inverts the differential input voltage Vin and propagates the inverted differential input voltage Vin to the first set of inputs of the two-bit 2-to-1 multiplexer 1190.

Additionally, in this embodiment, when the second bit EN1 or TST_P of the control signal EN has a first value, the first one-bit 2-to-1 multiplexer 1152 propagates the corresponding signal received through the first set of inputs of the two-bit 2-to-1 multiplexer 1190 (e.g., inputs corresponding to a select signal having a value of 00 indicating neither end is in calibration mode). Alternatively, in this embodiment, when the second bit EN1 or TST_P of the control signal EN has a second value, the first one-bit 2-to-1 multiplexer 1152 propagates the test voltage Vtest received through the third input terminal of the input routing circuit 825A.

Moreover, in this embodiment, when the third bit EN2 or TST_N of the control signal EN has the first value, the second one-bit 2-to-1 multiplexer 1154 propagates the corresponding signal received through the first set of inputs of the two-bit 2-to-1 multiplexer 1190 (e.g., inputs corresponding to a select signal having a value of 00 indicating neither end is in calibration mode). Alternatively, in this embodiment, when the third bit EN2 or TST_N of the control signal EN has the second value, the second one-bit 2-to-1 multiplexer 1154 propagates the test voltage Vtest received through the third input terminal of the input routing circuit 825A.

The output routing circuit 825B includes an output chopper circuit 1155 (e.g., the chopper circuit shown in FIG. 2C) and a two-bit 1-to-2 demultiplexer 1195. In some embodiments, the output routing circuit 1125B may be slip into two half output routing circuits. A first half output routing circuit includes a first half output chopper circuit (e.g., including first switch S1 and third switch S3 as shown in FIG. 2C) and a first one-bit 1-to-2 demultiplexer 1156. A second half output routing circuit includes a second half output chopper circuit (e.g., including second switch S2 and fourth switch S4 as shown in FIG. 2C) and a second one-bit 1-to-2 demultiplexer 1158. The inputs of the output chopper circuit 1155 are connected to the differential input voltage V1. The outputs of the output chopper circuit 1155 are connected to the inputs of the two-bit 1-to-2 demultiplexer 1195. A first set of outputs of the two-bit 1-to-2 demultiplexer 1195 (e.g., outputs corresponding to a select signal having a value of 00 indicating neither end is in calibration mode) are connected to a first output V2 of the output routing circuit 1125B and are configured to be connected to the output terminals of the amplifier circuit 1100. A second set of outputs of the two-bit 1-to-2 demultiplexer 1195 (e.g., outputs corresponding to a select signal having a value of 01 or 10 indicating that at least one end is in calibration mode) are configured to be connected to the calibration circuit 1145.

In some embodiments, the output chopper circuit 1155 is controlled by a first bit EN0 of a corresponding control signal EN and the two-bit 1-to-2 demultiplexer 1195 is controlled by a second bit EN1 or TST_P and a third bit EN2 or TST_N of the corresponding control signal EN. In this embodiment, when the first bit EN0 of the enable signal EN has a first value, the output chopper circuit 1150 propagates the differential input voltage V1 to the inputs of the two-bit 1-to-2 demultiplexer 1195 without inverting the differential input voltage V1. Alternatively, when the first bit EN0 of the control signal EN has a second value, the output chopper circuit 1155 inverts the differential input voltage V1 and propagates the inverted differential input voltage V1 to the inputs of the two-bit 1-to-2 demultiplexer 1195.

Additionally, in this embodiment, when the second bit EN1 or TST_P of the control signal EN has a first value, the first one-bit 1-to-2 demultiplexer 1156 propagates the signal received through the first input of the two-bit 1-to-2 demultiplexer 1195 to the first output terminal V2− of the output routing circuit 1125B. Alternatively, in this embodiment, when the second bit EN1 or TST_P of the control signal EN has a second value, the first one-bit 1-to-2 demultiplexer 1156 propagates the signal received through the first input of the two-bit 1-to-2 demultiplexer 1195 to the third output terminal Vot of the output routing circuit 1125B.

Moreover, in this embodiment, when the third bit EN2 or TST_N of the control signal EN has the first value, the second one-bit 1-to-2 demultiplexer 1158 propagates the signal received through the second input of the two-bit 1-to-2 demultiplexer 1195 to the second output terminal V2+ of the output routing circuit 1125B. Alternatively, in this embodiment, when the third bit EN2 or TST_N of the control signal EN has the second value, the second one-bit 1-to-2 demultiplexer 1158 propagates the signal received through the second input of the two-bit 1-to-2 demultiplexer 1195 to the third output terminal Vot of the output routing circuit 1125B.

Figure 11D:
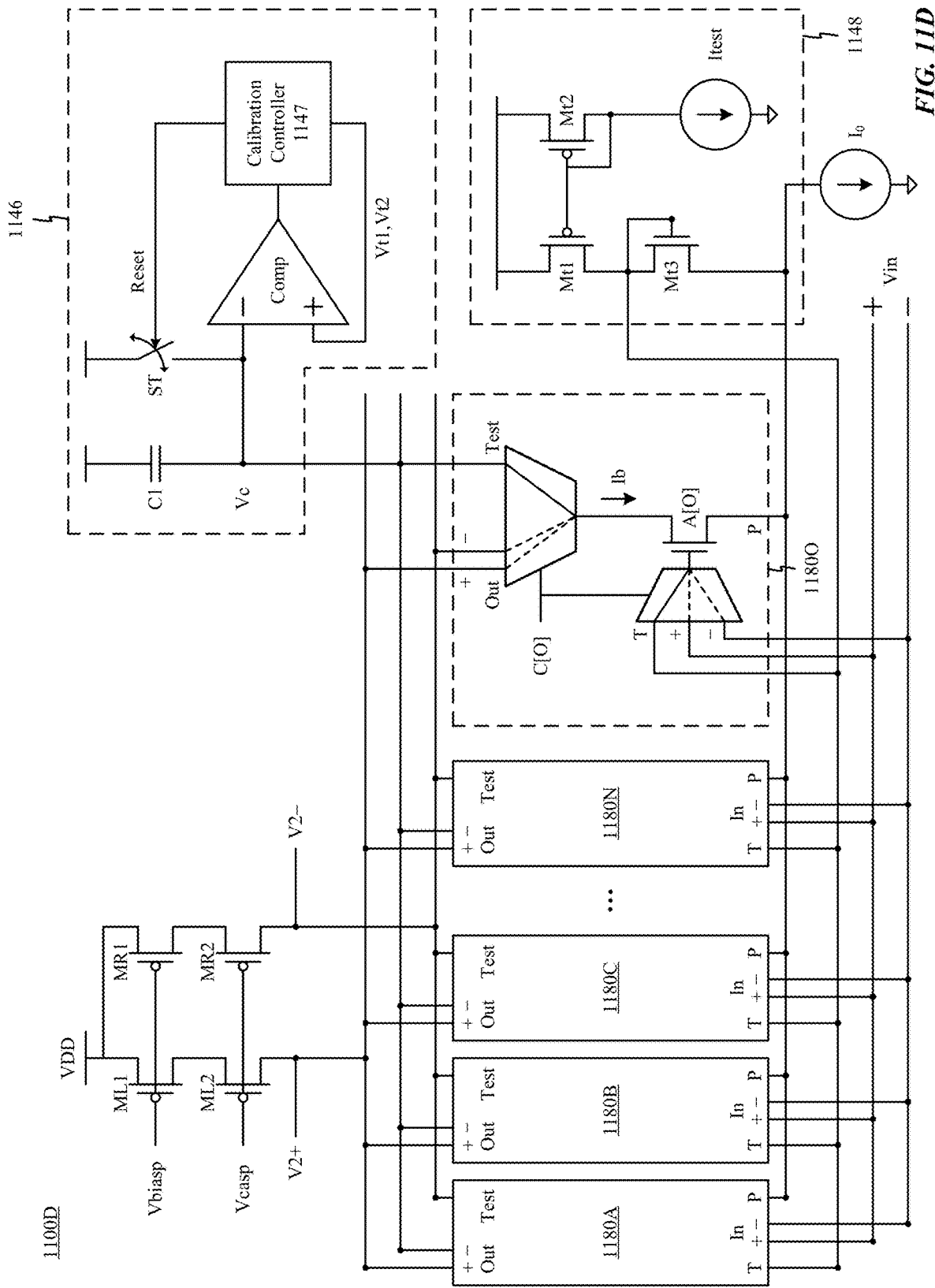
FIG. 11D is a circuit diagram of the amplifier circuit of FIG. 11A implemented using fingers, according to one or more embodiments.

FIG. 11D is a circuit diagram of the amplifier circuit 1100 of FIG. 11A implemented using fingers, according to one or more embodiments. Although the circuit diagram is described with regards to a configuration using fingers, other configuration may also be possible. For example, a configuration similar to the amplifier circuit 300B of FIG. 3B or amplifier 300C of FIG. 3C with half input chopper circuits 360 and 365 replaced by half input routing circuits 1160 and 1165, and half output chopper circuits 370 and 375 replaced by half output routing circuits 1170 and 1175 is possible. In another example, a configuration similar to the amplifier circuit 500B of FIGS. 5B and 5C with half input chopper circuits 560 and 565 replaced by half input routing circuits 1160 and 1165, and half output chopper circuits 570 and 575 replaced by half output routing circuits 1170 and 1175 is also possible.

The amplifier circuit 1100D includes a set of fingers 1180. In some embodiments, the amplifier circuit 800D includes 2N+1 fingers 1180. In other embodiments, the amplifier circuit 800D includes 2N main fingers 880 and one spare fingers 880. In some embodiments, the spare finger(s) is/are identical (or substantially similar) to the main fingers. In other embodiments, the spare finger(s) is/are different from the main fingers, or is/are connected in a different configuration than the main fingers. The fingers 1180 are described in more detail below in conjunction with FIG. 11E.

Figure 11E:
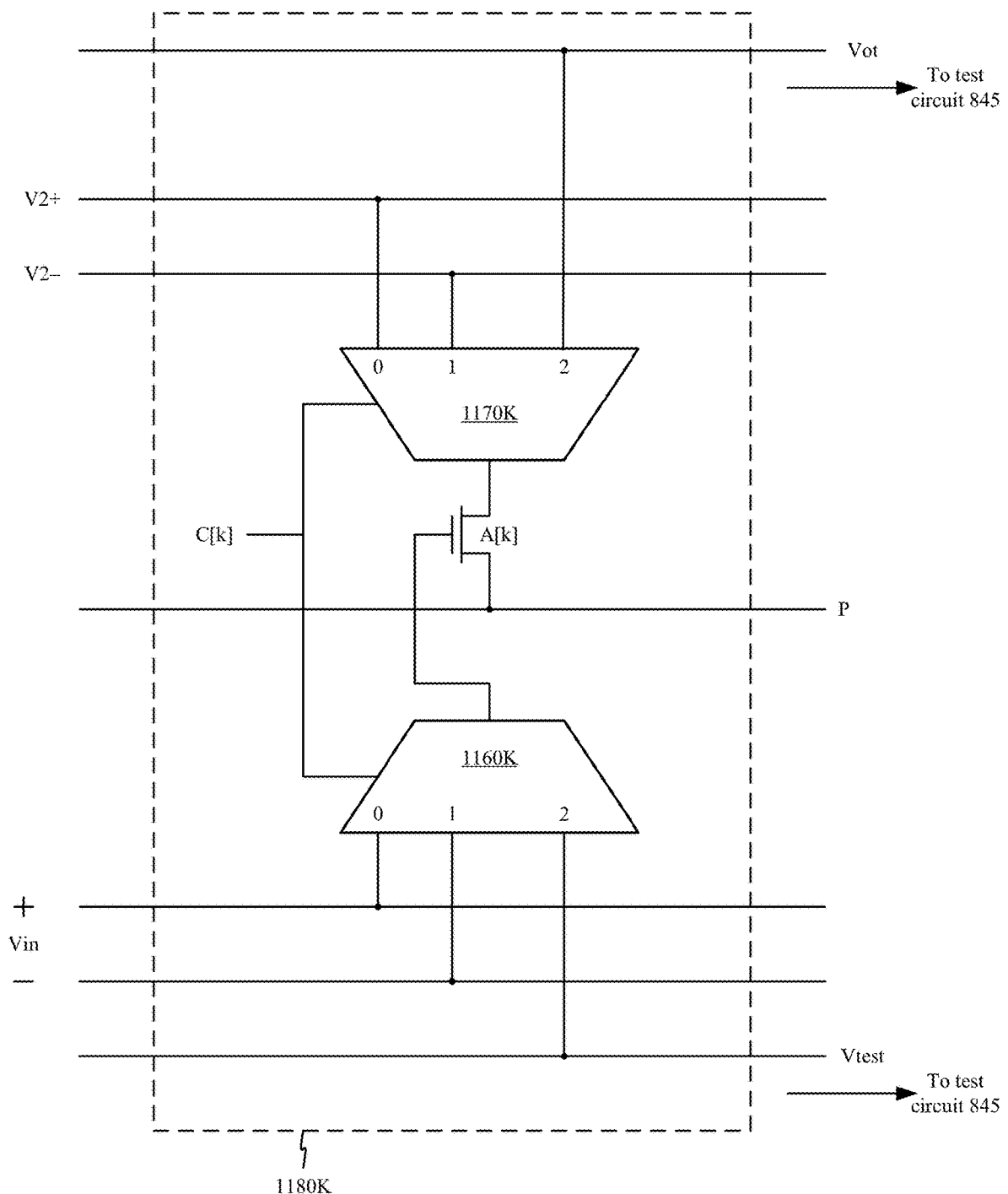
FIG. 11E is a circuit diagram of a finger of the amplifier circuit of FIG. 11D, according to one or more embodiments.

Each finger 1180 includes a transistor A a half input routing circuit 1160, and a half output routing circuit 1170. For example, FIG. 11E illustrates a finger 1180K having a transistor A[k], a half input routing circuit 1160K, and a half output routing circuit 1170K. Moreover, each finger receives a control signal C for controlling the half input routing circuit 1160 and the half output routing circuit 1170.

The transistor A has an input terminal (e.g., a gate terminal) coupled to an output of the half input routing circuit 1160. Moreover, the transistor A has an output terminal (e.g., a drain terminal) coupled to an input of the half output routing circuit 1170. Additionally, the transistor has a third terminal (e.g., a source terminal) coupled to a common node P.

The half input routing circuit 1160 includes a first input (e.g., input 0) coupled to the positive input terminal (Vin+) of the amplifier circuit 1100D, a second input (e.g., input 1) coupled to the negative input terminal (Vin−) of the amplifier circuit 1100D, and a third input terminal (e.g., input 2) coupled to an output of the test circuit 1145 providing the test voltage Vtest.

The half output routing circuit 1170 includes a first output (e.g., output 0) coupled to a positive output terminal (V2+) of the amplifier circuit 1100D, a second output terminal (e.g., output 1) coupled to a negative output terminal (V2−) of the amplifier circuit 1100D, and a third output terminal (e.g., output 2) coupled to the input terminal of the test circuit 845.

In some embodiments, the main fingers of the amplifier circuit 1100D and the spare fingers of the amplifier circuit 1100D are identical (or substantially similar). In this embodiment, the controller 1140 is able to select which fingers will be controlled as main fingers, and which fingers will be controlled as spare fingers. During an offset calibration process, the spare fingers are used to temporarily replace one or more main fingers while the replaced main fingers are being tested.

The calibration circuit 1145 includes a calibration output circuit 1146 and a calibration input circuit 1148. The calibration output circuit 1146 receives the output the transistor of one finger 1180 and determines a time value that is correlated to the threshold voltage of the transistor. The calibration input circuit 1148 generates the test voltage Vtest for testing the transistors of the differential amplifier 1130.

The calibration output circuit 1146 includes a capacitor C1, a reset switch ST, a comparator, and a calibration controller 1147. The calibration controller 1147 controls the reset switch ST and the comparator. The reset switch is configured to charge the capacitor C1 to a supply voltage (e.g., VDD). The comparator senses the voltage drop Vc at the capacitor C1 and compares the voltage Vc to a reference voltage. For example, the comparator compares the voltage Vc to a first reference voltage Vt1 and a second reference voltage Vt2.

The calibration controller 1147 receives the output of the comparator and determines a time that the capacitor C1 took to drop from the first reference voltage Vt1 to the second reference voltage Vt2. That is, when testing the transistor of a finger under test, the output node of the finger is coupled to the capacitor C1. The transistor of the finger under test drives a current that is correlated to the threshold voltage of the transistor and discharges the capacitor C1. The calibration controller 1147 then determines the time that the transistor used for discharging the capacitor C1 from the first reference voltage Vt1 to the second reference voltage Vt2.

The calibration controller 1147 determines the time for each finger 1180 and stores the determined time in a memory. The controller 1140 then sorts the fingers based on the stored times. In some embodiments, the calibration controller 1147 includes a counter (e.g., linear counters or logarithmic counters). For example, the calibration controller 1147 includes a logarithmic counter that starts with a slow counting rate and increases the counting rate as the count of the counter increases. The counter starts counting when the output of the comparator indicates that the voltage Vc dropped below the first reference voltage Vt1, and stops counting when the output of the comparator indicates that the voltage Vc dropped below the second reference voltage Vt2.

In another example, the calibration controller 1147 includes two back-to-back logarithmic counters. A first logarithmic counter starts at a slowest rate and ends at a fastest rate. A second logarithmic counter starts at a fastest rate and ends at a slowest rate. The logarithmic counters may be centered at an expected time. As such, using two logarithmic counters, the resolution of the count may be increased away as the time moves away from the expected time. In some embodiments, the center of the two logarithmic counters are adjusted by changing the first reference voltage Vt1 or the second reference voltage Vt2. For example, after the transistors of the amplifier circuit are tested, an average capacitor discharge time is determined and the parameters that may affect the capacitor discharge time (e.g., Vt1, Vt2, Itest, or C1) can be adjusted to allow the new expected average capacitor discharge time based on the adjusted parameters to match the center of the two back-to-back logarithmic counters.

Figure 11F:
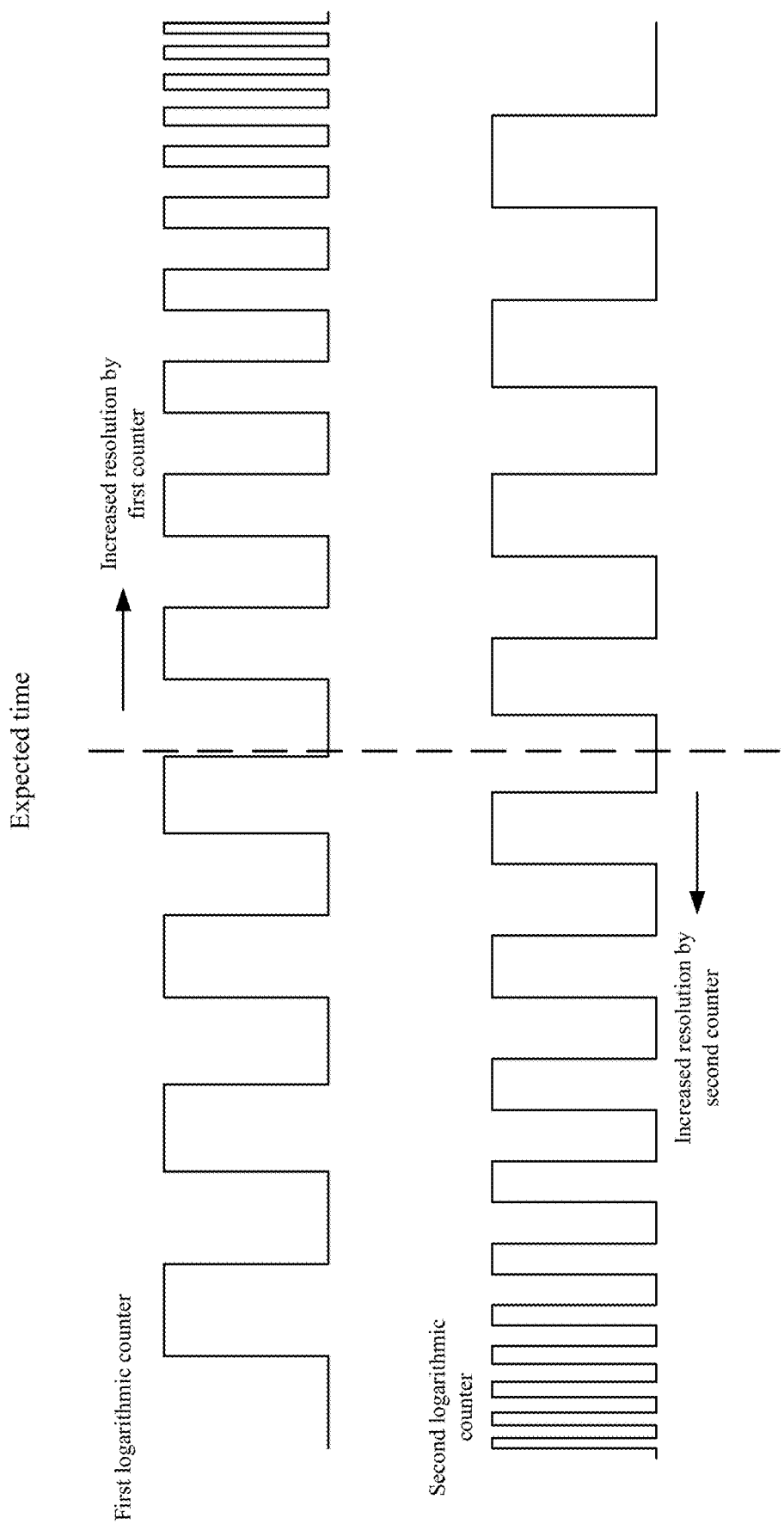
FIG. 11F illustrates a timing diagram of two logarithmic counters, according to one or more embodiments.

FIG. 11F illustrates a timing diagram of two logarithmic counters, according to one or more embodiments. The first logarithmic counter starts with a slow rate and speeds up as the count increases. The second logarithmic counter starts with a fast rate and slows down as the count increases. As shown in the timing diagram, the resolution of the count is increased by the first logarithmic counter if the sensed time is greater than the expected time. Additionally, the resolution of the count is increased by the second logarithmic counter if the sense time is smaller than the expected time.

In another embodiments, the first logarithmic counter and the second logarithmic counter are configured to start at different time. In particular, the start of the first logarithmic counter and the second logarithmic counter is offset based on the expected time. The first logarithmic counter starts when the capacitor C1 starts discharging and reaches a maximum frequency after the expected time has elapsed. The second logarithmic counter starts after the expected time has elapsed. As such, both logarithmic counters are configured to operate using the maximum frequency centered around the expected time.

Figure 12:
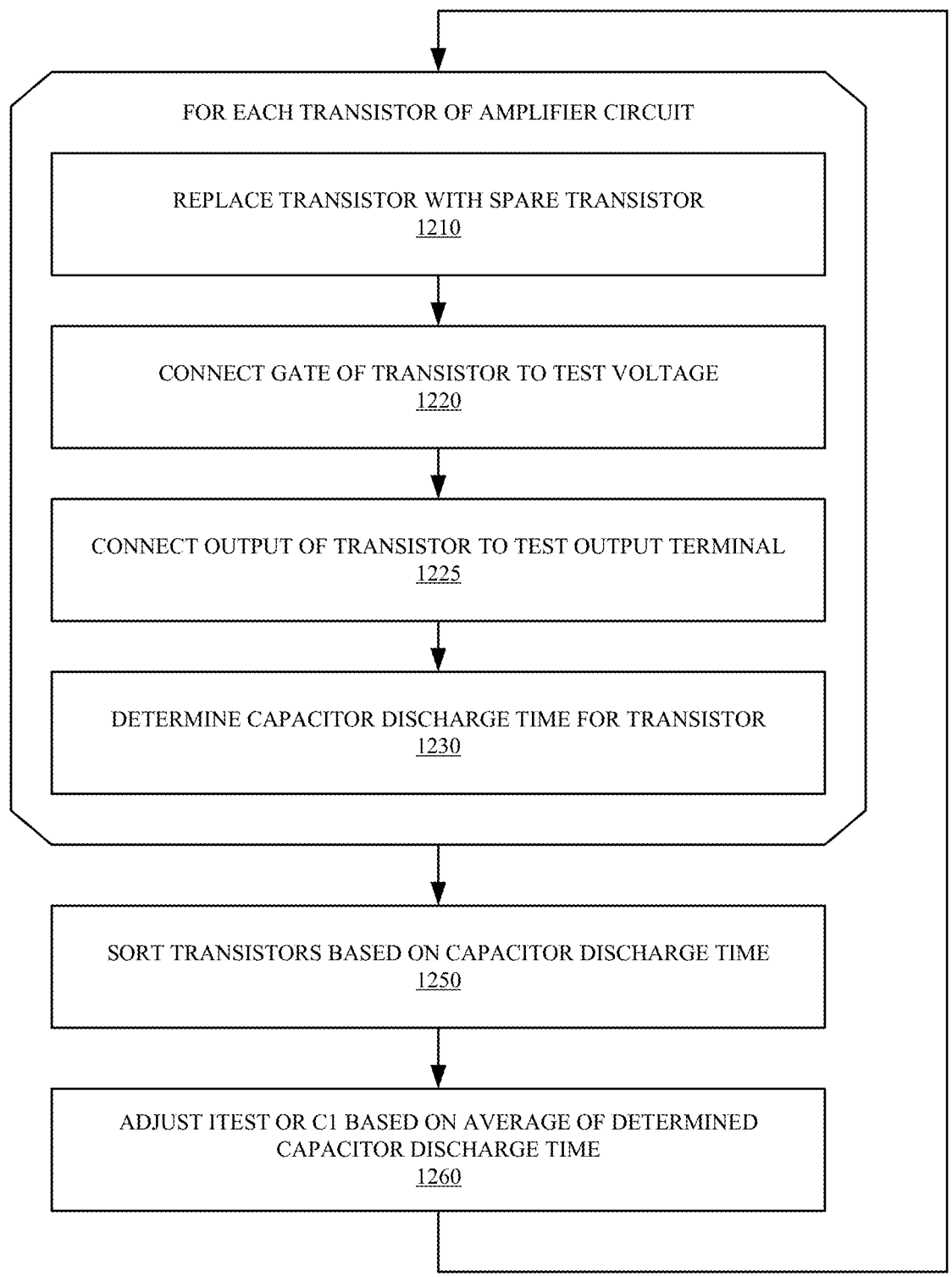
FIG. 12 is a flowchart illustrating a process for sorting transistors of an amplifier circuit, according to one or more embodiments.

FIG. 12 is a flowchart illustrating a process for sorting transistors of an amplifier circuit, according to one or more embodiments. For example, the process of FIG. 10 may be used for sorting transistors A[1] through A[2N] of amplifier circuit 800 using a spare transistor A[2N+1].

First, the controller 1140 determines a capacitor discharge time for each transistor A[1] through A[2N] of the amplifier circuit 1100. In some embodiments, the controller 1140 also tests the spare transistor A[2N+1] and includes the spare transistor A[2N+1] when sorting the transistors of the amplifier circuit 1100. That is, the controller 1140 sorts transistors A[1] through A[2N+1]. As such, the controller 1140 determines a capacitor discharge time for each transistor A[1] through A[2N+1] of the amplifier circuit 1100.

To determine the capacitor discharge time of a transistor A[k], the transistor A[k] is replaced 1210 using the spare transistor A[2N+1]. That is, if the transistor A[k] is scheduled to be connected to the positive input terminal Vin+ and positive output terminal V2+ of the amplifier circuit, the spare transistor A[2N+1] is connected to the positive input terminal Vin+ and positive output terminal V2+ of the amplifier circuit instead of the transistor A[k]. Alternatively, if the transistor A[k] is scheduled to be connected to the negative input terminal Vin− and negative output terminal V2− of the amplifier circuit, the spare transistor A[2N+1] is connected to the negative input terminal Vin− and negative output terminal V2− of the amplifier circuit instead of the transistor A[k]. As such, the amplifier circuit 1100 can continue to operate while the transistor A[k] is being tested.

Then the controller 1140 connects 1220 the gate of a transistor A[k] to the test voltage Vtest. In some embodiments, the controller 1140 controls the half input routing circuit 1160 corresponding to the transistor A[k] to connect the gate of the transistor A[k] to the output of the calibration input circuit 1148.

The controller 1140 connects 1225 the output of the transistor A[k] to the test output terminal Vot. That is, the controller 1140 connects the output of the transistor A[k] to the input of the calibration output circuit 1146. In some embodiments, the controller 1140 controls the half output routing circuit 1170 corresponding to the transistor A[k] to connect the output of the transistor A[k] to the test output terminal Vot.

The controller 1140 determines 1230 the capacitor discharge time for the transistor A[k]. First, the calibration controller 1147 provides the first reference voltage Vt1 to an input terminal of the comparator of the calibration output circuit 1146. When the capacitor Voltage Vc of capacitor C1 drops to the first reference voltage Vt1, the calibration controller 1147 starts one or more counters (e.g., logarithmic counters as shown in FIG. 11F). Moreover, when the capacitor Voltage Vc of capacitor C1 drops to the first reference voltage Vt1, the calibration controller 1147 provides the second reference voltage Vt2 to the input terminal of the comparator of the calibration output circuit 1146.

The calibration controller 1147 operates the counters until the capacitor Voltage Vc of capacitor C1 drops to (or below) the second reference voltage Vt2. When the capacitor Voltage Vc of capacitor C1 drops to (or below) the second reference voltage Vt2, the calibration controller 1147 retrieves a count of the one or more counters and determines the capacitor discharge time for the transistor A[k] based on the count of the one or more counters.

In some embodiments, the capacitor discharge time AT is equal to:

$$\Delta T = \frac{(Vt1 - Vt2) \times C1}{I_b} \quad (1)$$

where $I_b$ is the current of transistor A[k]. As shown in FIG. 11D, the current $I_b$ is generated from test current Itest. In some embodiments, test current Itest is generated using a switched capacitor current source. As such, the test current may be equal to:

$$I\text{test} = 2 \times V_{BG} \times f_{clk} \times C_0 \quad (2)$$

where $V_{BG}$ is a reference voltage (e.g., a bandgap voltage), $f_{clk}$ is a clock frequency of the switched capacitor current source, and $C_0$ is the capacitance of the switched capacitor current source. Thus, if every transistor of the amplifier circuit 800 is matched, the expected capacitor discharge time would be equal to:

$$\Delta T = \frac{(Vt1 - Vt2) \times C1}{I\text{test}} = \frac{Vt1 - Vt2}{2V_{BG}} \times \frac{C_1}{C_0} T_{clk} \quad (3)$$

where $T_{clk}$ is the inverse of the clock frequency of the switched capacitor current source.

However, due to mismatches due to transistor A[k] and the current mirror transistor Mt3 of the calibration input circuit 1148, the transistor current $I_b$ may deviate from the test current Itest. In particular, the transistor current $I_b$ deviates due to mismatches in threshold voltage between the transistor A[k] and the current mirror transistor Mt3 of the calibration input circuit 1148. As such, the capacitor discharge time for each of the transistor can be used as a proxy for sorting the transistors A[1] through A[2N].

In some embodiments, transistor Mt3 is configured to operate in sub-threshold mode. Biasing transistor Mt3 and transistors in the amplifier circuit 1100 in sub-threshold mode can help amplify the threshold voltage mismatch of transistors exponentially.

Once the capacitor discharge time for the transistor of the amplifier circuit 1100 have been determined, the transistors are sorted 1250 based on the determined capacitor discharge time. In addition, the test circuit can be optionally adjusted 1260 based on the average of the capacitor discharge time of transistors of the amplifier circuit. For example, the first reference voltage Vt1, the second reference voltage Vt2, the test current Itest, or the capacitor C1 can be modified to adjust the expected capacitor discharge time for the transistors. In other words, the first reference voltage Vt1, the second reference voltage Vt2, the test current Itest, or the capacitor C1 can be adjusted to increase the capacitor discharge time for each of the transistors if the average capacitor discharge time is lower than the expected capacitor discharge time, or decrease the capacitor discharge time for each of the transistors if the average capacitor discharge time is larger than the expected capacitor discharge time. The controller 1140 may then repeat the calibration process using the adjusted configuration for the calibration circuit. In some embodiments, the controller 1140 periodically performs the calibration process to correct the offset of the amplifier circuit that may occur due to threshold voltage drift of the transistors that occur over time.

In some embodiments, the controller 1140 adjusts the current source $I_0$ when determining the capacitor discharge time for a transistor of the amplifier circuit 1100. In particular, the controller 1140 increases the current provided by the current source $I_0$ by the test current Itest to account of the current consumed during the testing of the transistor.

Additional Considerations

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. An amplifier circuit comprising:
   a plurality of transistors, each transistor of the plurality of transistors configured to receive an input signal and output an amplified signal, the plurality of transistors including a first subset of transistors and a second subset of transistors;
   a calibration circuit comprising:
      a plurality of biasing transistors including a first subset of biasing transistors coupled to a first input terminal of a calibration output circuit of the calibration circuit, and a second subset of biasing transistors coupled to a second input terminal of the calibration output circuit, and
      a comparator having a first comparator input terminal coupled to the first input terminal and a second comparator input terminal coupled to the second input terminal; and
   a plurality of output routing circuits, each output routing circuit of the plurality of output routing circuits controlled by one or more control signals from a plurality of control signals, each output routing circuit of the plurality of output routing circuits coupled to a transistor pair including a first transistor from the first subset of transistors and a second transistor from the second subset of transistors, each output routing circuit of the plurality of output routing circuits configured to selectively connect each transistor of the transistor pair to a first output terminal of the amplifier circuit, a second output terminal of the amplifier circuit, or the calibration circuit, based on a value of the one or more control signals.

2. The amplifier circuit of claim 1, further comprising:
   a plurality of input routing circuits, each input routing circuit of the plurality of input routing circuits corresponding to an output routing circuit of the plurality of output routing circuits, each input routing circuit of the plurality of input routing circuits controlled by the one or more control signals of the output routing circuit, each input routing circuit of the plurality of input routing circuits coupled to the transistor pair coupled to the output routing circuit, each input routing circuit of the plurality of input routing circuits configured to selectively connect each transistor of the transistor pair to a first input terminal of the amplifier circuit for receiving a positive input voltage, a second input terminal of the amplifier circuit for receiving a negative input voltage, or a third input terminal of the amplifier circuit for receiving a test voltage, based on the value of the one or more control signals.

3. The amplifier circuit of claim 2, wherein each input routing circuit of the plurality of input routing circuits comprises:
   a first half input routing circuit coupled to an input of the first transistor of the transistor pair, the first half input routing circuit configured to selectively connect the input of the first transistor of the transistor pair to the first input terminal of the amplifier circuit, the second input terminal of the amplifier circuit, or the third input terminal of the amplifier circuit based on the value of the one or more control signals; and
   a second half input routing circuit coupled to the second transistor of the transistor pair, the second half input routing circuit configured to selectively connect the input of the second transistor of the transistor pair to the first input terminal of the amplifier circuit, the second input terminal of the amplifier circuit, or the third input terminal of the amplifier circuit based on the value of the one or more control signals.

4. The amplifier circuit of claim 2, further comprising:
   one or more spare transistors;
   one or more spare input routing circuits, each spare input routing circuit of the one or more spare input routing circuits configured to selectively connect a corresponding spare transistor of the one or more spare transistors to the first input terminal of the amplifier circuit or the second input terminal of the amplifier circuit in response to one or more transistors from the plurality of transistors being operated in a calibration mode; and
   one or more spare output routing circuits, each spare output routing circuit of the one or more spare output routing circuits coupled to the corresponding spare transistor coupled to a corresponding spare input routing circuit of the one or more spare input routing circuits, each spare output routing circuit of the one or more spare output routing circuits configured to selectively connect the corresponding spare transistor to the first output terminal of the amplifier circuit or the second output terminal of the amplifier circuit in response to the one or more transistors being operated in the calibration mode.

5. The amplifier circuit of claim 1, wherein each output routing circuit of the plurality of output routing circuits is configured to selectively connect each transistor of the transistor pair to the first output terminal of the amplifier circuit or the second output terminal of the amplifier circuit when the transistor pair is operated in a non-calibration mode, and to selectively connect each transistor of the transistor pair to the first input terminal of the calibration output circuit or the second input terminal of the calibration output circuit when the transistor pair is operated in a calibration mode.

6. The amplifier circuit of claim 1, wherein the calibration output circuit comprises:
    a capacitor coupled to an input terminal of the calibration output circuit;
    a reset switch coupled to the input terminal of the calibration output circuit; the reset switch for charging the capacitor; and
    a comparator having a first input coupled to the input terminal of the calibration output circuit, and a second input for receiving one or more reference voltages, the comparator for comparing a capacitor voltage of the capacitor to the one or more reference voltages.

7. The amplifier circuit of claim 6, wherein each output routing circuit of the plurality of output routing circuits is configured to selectively connect each transistor of the transistor pair to the first output terminal of the amplifier circuit or the second output terminal of the amplifier circuit when the transistor pair is operated in a non-calibration mode, and to connect at least one transistor of the transistor pair to the input terminal of the calibration output circuit when the transistor pair is operated in a calibration mode.

8. The amplifier circuit of claim 6, further comprising a calibration controller coupled to an output of the comparator, the calibration controller configured to open the reset switch and to provide a first reference voltage to the second input of the comparator in response to receiving a signal indicative of a start of a test of a transistor, and to provide a second reference voltage to the second input of the comparator in response to determining that the capacitor voltage dropped below the first reference voltage.

9. The amplifier circuit of claim 8, wherein the calibration controller is further configured to start one or more counters in response to determining that the capacitor voltage dropped below the first reference voltage, and to stop the one or more counters in response to determining that the capacitor voltage dropped below the second reference voltage.

10. The amplifier circuit of claim 6, wherein the calibration circuit further comprises:
    a calibration input circuit coupled to an input terminal of the amplifier circuit, the calibration input circuit including:
        a current source for generating a reference test current, and
        a current mirror circuit for generating a test voltage based on the reference test current.

11. The amplifier circuit of claim 1, wherein each output routing circuit of the plurality of output routing circuits comprises:
    a first half output routing circuit coupled to an output of the first transistor of the transistor pair, the first half output routing circuit configured to selectively couple the output of the first transistor to the first output terminal of the amplifier circuit, the second output terminal of the amplifier circuit, or the calibration circuit, based on the value of the one or more control signals; and
    a second half output chopper circuit coupled to an output of the second transistor of the transistor pair, the second half output chopper circuit configured to selectively couple the output of the second transistor to the first output terminal of the amplifier circuit, the second output terminal of the amplifier circuit, or the calibration circuit, based on the value of the one or more control signals.

12. An amplifier circuit comprising:
    a calibration output circuit including:
        a capacitor coupled to an input terminal of the calibration circuit,
        a reset switch coupled to the input terminal of the calibration circuit, the reset switch for charging the capacitor, and
        a comparator having a first input coupled to the input terminal of the calibration circuit, and a second input for receiving one or more reference voltages, the comparator for comparing a capacitor voltage of the capacitor to the one or more reference voltages; and
    a plurality of fingers, each finger of the plurality of fingers controlled by one or more control signals, each finger of the plurality of fingers comprising:
        a transistor,
        an input routing circuit for selectively connecting the transistor to a first input terminal of the amplifier circuit for receiving a positive input voltage, a second input terminal of the amplifier circuit for receiving a negative input voltage, or a third input terminal of the amplifier circuit for receiving a test voltage, based on a value of the one or more control signals, and
        an output routing circuit for selectively connecting the transistor to a first output terminal of the amplifier circuit, a second output terminal of the amplifier circuit, or the input terminal of the calibration circuit, based on the value of the one or more control signals.

13. The amplifier circuit of claim 12, wherein the output routing circuit is configured to selectively connect the transistor to the first output terminal of the amplifier circuit or the second output terminal of the amplifier circuit when the transistor is operated in a non-calibration mode, and to connect the transistor to the input terminal of the calibration circuit when the transistor is operated in a calibration mode.

14. The amplifier circuit of claim 12, wherein the calibration output circuit further comprises a calibration controller coupled to an output of the comparator, the calibration controller configured to open the reset switch and to provide a first reference voltage to the second input of the comparator in response to receiving a signal indicative of a start of a test of the transistor, and to provide a second reference voltage to the second input of the comparator in response to determining that the capacitor voltage dropped below the first reference voltage.

15. The amplifier circuit of claim 14, wherein the calibration controller is further configured to start one or more counters in response to determining that the capacitor voltage dropped below the first reference voltage, and to stop the one or more counters in response to determining that the capacitor voltage dropped below the second reference voltage.

16. The amplifier circuit of claim 12, wherein the calibration circuit further comprises:
- a calibration input circuit coupled to the third input terminal of the amplifier circuit, the calibration input circuit including:
  - a current source for generating a reference test current, and
  - a current mirror circuit for generating a test voltage based on the reference test current.

17. A method for calibrating an amplifier circuit, comprising:
- for each transistor of a plurality of transistors, determining a discharge time by:
  - providing a test voltage through an input terminal of the transistor,
  - comparing a voltage at an output terminal of the transistor to a first reference voltage,
  - responsive to determining that the voltage at the output terminal of the transistor dropped below the first reference voltage, starting one or more counters,
  - comparing the voltage at the output terminal of the transistor to a second reference voltage,
  - responsive to determining that the voltage at the output terminal of the transistor dropped below the second reference voltage, stopping the one or more counters, and
  - determining the discharge time based on a count of the one or more counters; and
- sorting the plurality of transistors based on the determined discharge time for each transistor of the plurality of transistors.

18. The method of claim 17, wherein determining the discharge time further comprises:
- charging a capacitor to a third voltage, the third voltage larger than the first reference voltage and the second reference voltage;
- coupling the transistor to the capacitor; and
- discharging the capacitor in response to providing the test voltage through an input terminal of the transistor.

19. The method of claim 17, wherein determining the discharge time further comprises:
- replacing the transistor with a spare transistor.

20. An amplifier circuit comprising:
- a plurality of transistors, each transistor of the plurality of transistors configured to receive an input signal and output an amplified signal, the plurality of transistors including a first subset of transistors and a second subset of transistors;
- a plurality of output routing circuits, each output routing circuit of the plurality of output routing circuits controlled by one or more control signals from a plurality of control signals, each output routing circuit of the plurality of output routing circuits coupled to a transistor pair including a first transistor from the first subset of transistors and a second transistor from the second subset of transistors, each output routing circuit of the plurality of output routing circuits configured to selectively connect each transistor of the transistor pair to a first output terminal of the amplifier circuit, a second output terminal of the amplifier circuit, or a calibration circuit, based on a value of the one or more control signals;
- a plurality of input routing circuits, each input routing circuit of the plurality of input routing circuits configured to selectively connect each transistor of the transistor pair to a first input terminal of the amplifier circuit for receiving a positive input voltage, a second input terminal of the amplifier circuit for receiving a negative input voltage, or a third input terminal of the amplifier circuit for receiving a test voltage, based on the value of the one or more control signals;
- one or more spare transistors;
- one or more spare input routing circuits, each spare input routing circuit of the one or more spare input routing circuits configured to selectively connect a corresponding spare transistor of the one or more spare transistors to the first input terminal or the second input terminal in response to one or more transistors from the plurality of transistors being operated in a calibration mode; and
- one or more spare output routing circuits, each spare output routing circuit of the one or more spare output routing circuits coupled to the corresponding spare transistor, each spare output routing circuit of the one or more spare output routing circuits configured to selectively connect the corresponding spare transistor to the first output terminal or the second output terminal in response to the one or more transistors being operated in the calibration mode.

21. The amplifier circuit of claim 20, wherein each input routing circuit of the plurality of input routing circuits comprises:
- a first half input routing circuit coupled to an input of the first transistor of the transistor pair, the first half input routing circuit configured to selectively connect the input of the first transistor of the transistor pair to the first input terminal, the second input terminal, or the third input terminal, based on the value of the one or more control signals; and
- a second half input routing circuit coupled to the second transistor of the transistor pair, the second half input routing circuit configured to selectively connect the input of the second transistor of the transistor pair to the first input terminal, the second input terminal, or the third input terminal, based on the value of the one or more control signals.

* * * * *